United States Patent [19]
Abele et al.

[11] Patent Number: 5,798,680
[45] Date of Patent: Aug. 25, 1998

[54] STRAPPED OPEN MAGNETIC STRUCTURE

[75] Inventors: Manlio G. Abele, New York; Henry Rusinek, Great Neck; Jens Jensen, Harrison, all of N.Y.

[73] Assignee: New York University, New York, N.Y.

[21] Appl. No.: 613,756

[22] Filed: Feb. 26, 1996

Related U.S. Application Data

[63] Continuation-in-part of Ser. No. 406,340, Mar. 13, 1995, Pat. No. 5,495,222, which is a continuation-in-part of Ser. No. 228,291, Apr. 15, 1994, Pat. No. 5,475,355.

[51] Int. Cl.$^6$ ............................................. H01F 7/02
[52] U.S. Cl. ..................... 335/301; 335/304; 335/306; 324/320
[58] Field of Search .................... 335/216, 296–306; 324/318–320

[56] References Cited

U.S. PATENT DOCUMENTS

| | | |
|---|---|---|
| 3,227,931 | 1/1966 | Adler . |
| 4,706,057 | 11/1987 | Schwab ................... 335/284 |
| 4,721,934 | 1/1988 | Stacy . |
| 4,771,256 | 9/1988 | Laskaris et al. . |
| 4,985,678 | 1/1991 | Gangarosa et al. ............ 324/318 |
| 4,998,083 | 3/1991 | Abele . |
| 5,001,447 | 3/1991 | Jayakumar . |
| 5,003,276 | 3/1991 | Sarwinski et al. ............ 335/304 |
| 5,049,848 | 9/1991 | Pulyer . |
| 5,107,239 | 4/1992 | Abele . |
| 5,119,057 | 6/1992 | Abele . |
| 5,162,770 | 11/1992 | Abele . |
| 5,162,771 | 11/1992 | Abele . |
| 5,278,534 | 1/1994 | Abele et al. . |
| 5,285,393 | 2/1994 | Abele et al. . |
| 5,412,365 | 5/1995 | Abele et al. . |
| 5,428,333 | 6/1995 | Abele et al. . |
| 5,446,434 | 8/1995 | Dorri et al. ............ 335/301 |
| 5,475,355 | 12/1995 | Abele et al. ............ 335/301 |
| 5,495,222 | 2/1996 | Abele et al. ............ 335/306 |

OTHER PUBLICATIONS

Effects of Field Orientation on Field Uniformity in Permanent Magnet Structures, J.H. Jensen and M.G. Abele, Department of Radiology, New York University School of Medicine, New York, New York 10016, J. Appl. Phys. 76 (10), 15 Nov. 1994, pp. 6853–6855.

(List continued on next page.)

*Primary Examiner*—Cassandra C. Spyrou
*Assistant Examiner*—Raymond Barreva
*Attorney, Agent, or Firm*—Darby & Darby

[57] ABSTRACT

Strapped open magnetic structure, particularly useful in nuclear magnetic resonance imaging applications, which provides a substantially uniform magnetic field within a region of interest while allowing access by a surgeon to a patient via an opening at the top of the magnetic structure. The magnetic structure comprises nested inner and outer magnetic structures separated by ferromagnetic material or pole pieces and surrounded by a ferromagnetic yoke. The structure contains one or more thin layers or straps of high magnetic permeability material aligned substantially along equipotential surface(s) of an associated closed magnetic structure of ideal properties. Structures and techniques are also provided for replacing thick, heavy blocks of ferromagnetic material with thin straps and for extending the magnetostatic potential of a component in a magnetic structure by connecting a thin strap thereto and embedding the strap in the magnetic structure along an equipotential surface of the magnetic field generated by the magnetic structure.

15 Claims, 35 Drawing Sheets

OTHER PUBLICATIONS

Generation of Highly Uniform Fields with Permanent Magnets (invited), M.G. Abele, New York University School of Medicine, New York, New York 10016, J. Appl. Phys. 76 (10), 15 Nov. 1994, pp. 6247–6252.

Field Computation in Permanent Magnets, M.G. Abele and H. Rusinek, New York University Medical Center, New York, New York 10016, 1992 IEEE, pp. 931–934.

Compensation of Field Distortion with Ferromagnetic Materials and Permanent Magnets, Manlio G. Abele, Henry Rusinek, Franco Bertora and Alessandro Trequattrini, Department of Radiology, New York University School of Medicine, New York, New York 10016, J. Appl. Phys. 75 (8), 15 May 1994.

Field Distortion Caused by magnetization Tolerances of Permanent Magnets, Manlio G. Abele and Henry Rusinek, New York University, New York, NY 10016, USA, IEEE Transactions On Magnetics, vol. 29, No. 6, Nov. 1993.

Optimum Design of Yokeless Permanent Magnets, M.G. Abele and H. Rusinek, Department of Radiology, New York University School Medicine, New York, New York 10016, J. Appl. Phys., vol. 67, No. 9, 1 May 1990.

Linear Theory of Pole Piece Design in Permanent Magnets, Manlio G. Abele, Jens H. Jensen, Henry Rusinek, Department of Radiology, NYU School of Medicine, Thirteenth International Workshop on Rare–Earth Magnets and their Applications, Sep. 11–14, 1994, Birmingham, United Kingdom.

A Highly Efficiency Yoked Permanent Magnet by Manlio G. Abele, Department of Radiology, NYU School of Medicine, (TR–23), Oct. 1, 1990.

Field Computation in Permanent Magnets with Linear Characteristics of Magnetic Media and Ferromagnetic Materials, Manlio G. Abele and Henry Rusinek, Department of Radiology, NYU School of Medicine, (TR–24), Aug. 15, 1991.

Generation of Highly Uniform Fields with Permanent Magnets, M.G. Abele, Department of Radiology, NYU School of Medicine, (TR–26), Jun. 15, 1994.

Open Hybrid Permanent Magnet, M.G. Abele, J.H. Jensen and H. Rusinek, Department of Radiology, NYU School of Medicine, (TR–29), Apr. 15, 1995.

Structures of Permanent Magnets Generation of Uniform Fields, Manlio G. Abele, John Wiley & Sons, Inc., Chapter 6, Hybrid Magnets and Chapter 8, Open Magnetic Structures.

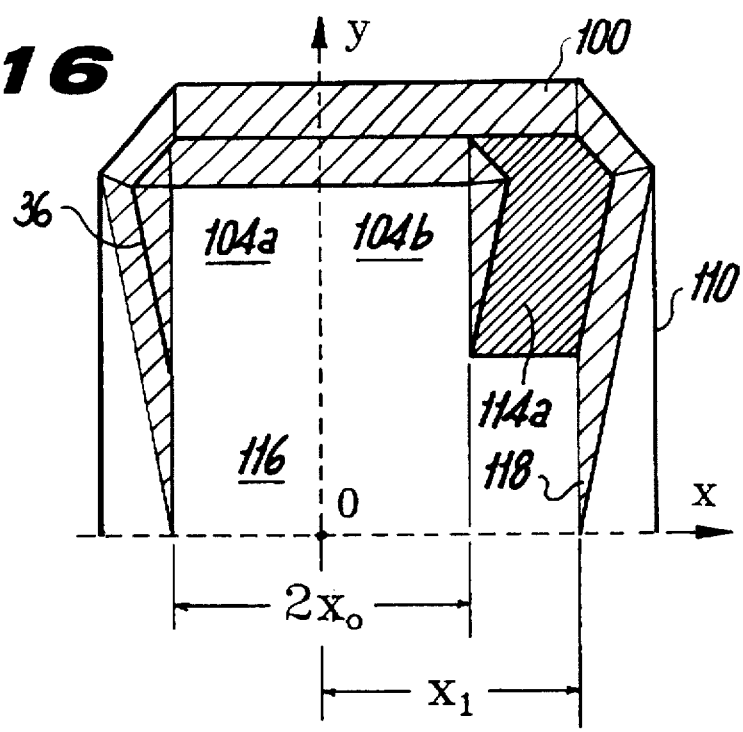
Fig. 16
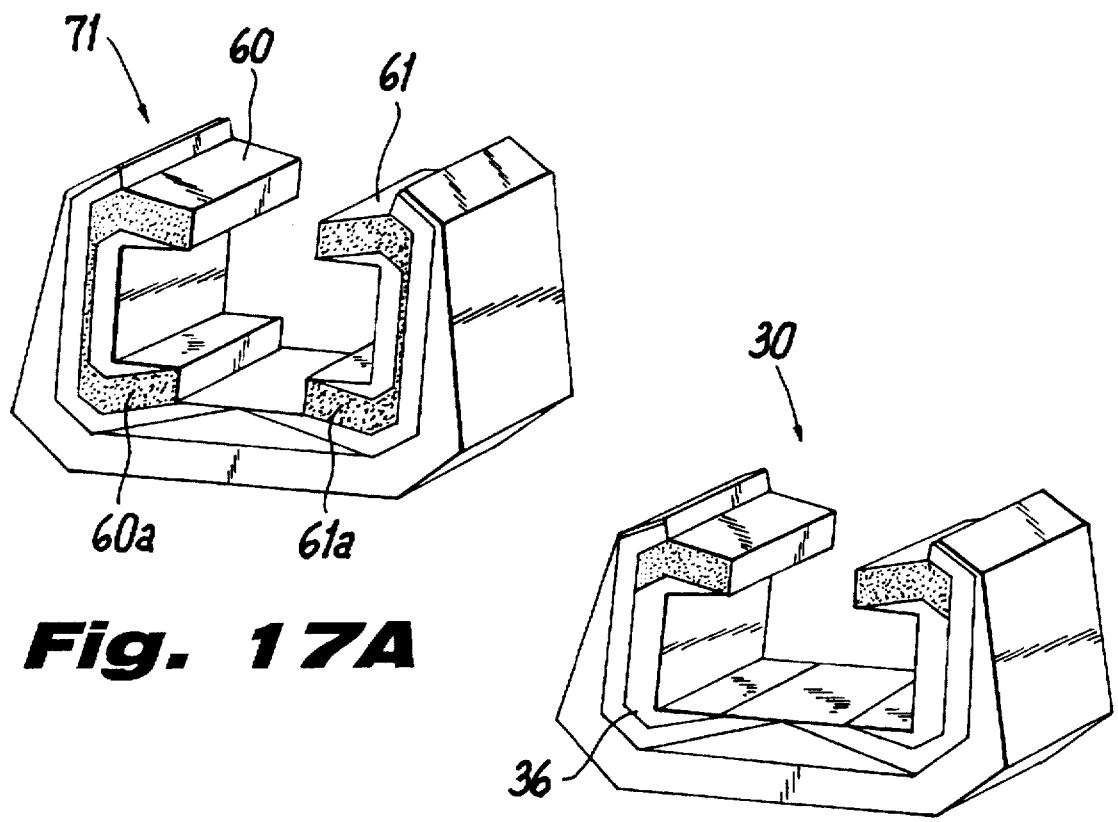
Fig. 17A
Fig. 17B

| n | $a_n$ (before) | $a_n$ (after) | $b_n$ (before) | $b_n$ (after) |
|---|---|---|---|---|
| 1 | $1.3 \times 10^{-4}$ | 0 | $1.8 \times 10^{-4}$ | 0 |
| 2 | $-5.8 \times 10^{-7}$ | 0 | $-5.1 \times 10^{-7}$ | 0 |
| 3 | $1.3 \times 10^{-8}$ | 0 | $2.7 \times 10^{-9}$ | 0 |
| 4 | $-6.3 \times 10^{-10}$ | $2.2 \times 10^{-9}$ | $-3.4 \times 10^{-11}$ | $3.3 \times 10^{-9}$ |
| 5 | $3.6 \times 10^{-11}$ | $-2.3 \times 10^{-10}$ | $1.3 \times 10^{-12}$ | $-3.5 \times 10^{-10}$ |

STRAPPED OPEN MAGNETIC STRUCTURE

RELATED APPLICATIONS AND PATENTS

This application is a continuation-in-part of U.S. application, Ser. No. 08/406,340 filed Mar. 13, 1995, issued Feb. 27, 1996 as U.S. Pat. No. 5,495,222, which is a continuation-in-part of U.S. application, Ser. No. 08/228,291, filed Apr. 15, 1994, now U.S. Pat. No. 5,475,355.

COPYRIGHT NOTICE

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

Other related patents include: U.S. Pat. No. 5,428,333, for "Method and Apparatus for Compensation of Field Distortion in a Magnetic Structure;" U.S. Pat. No. 5,278,534 for "Magnetic Structure Having a Mirror;" U.S. Pat. No. 5,285,393 for "Method for Determination of Optimum Fields of Permanent Magnet Structures with Linear Magnetic Characteristics;" U.S. Pat. No. 5,412,365 for "High Field Magnets for Medical Applications;" U.S. Pat. No. 5,162,771 for "Highly Efficient Yoked Permanent Magnet;" U.S. Pat. No. 5,107,239 for "Hybrid Permanent Magnets;" U.S. Pat. No. 5,119,057 for "Optimum Design of Two-Dimensional Permanent Magnets;" and U.S. Pat. No. 4,990,083 for "Yokeless Permanent Magnet Structure and Method of Construction". All of the above patents and patent applications are hereby incorporated by reference into this application.

FIELD OF THE INVENTION

The present invention relates to magnetic structures, such as structures used in medical applications of nuclear magnetic resonance. In particular, the invention relates to open magnetic structures for generating strong and highly uniform magnetic fields. In addition, the present invention relates to the use of thin straps of high magnetic permeability material in magnetic structures.

BACKGROUND OF THE INVENTION

Medical applications of nuclear magnetic resonance (NMR) are primarily based on the use of either superconductive magnets or permanent magnets to generate the highly uniform field required for imaging. The main advantage of superconductive magnets is their ability to generate high magnetic fields. The superconductive coils that carry the electric current are normally arranged in cylindrical structures open at both ends, and a patient is inserted axially to access the imaging region located at the center of the magnet. This arrangement dictated by the geometry of the coils often leads to a number of problems in clinical as well as surgical applications. For instance, real time imaging during a surgical procedure is hampered by the interference of the magnet structure with the surgical instrumentation and by the restricted access to the patient and to the surgical area in particular.

The use of permanent magnets that require no external power supply and no maintenance is gaining momentum in medical imaging, in spite of their limitations in the generation of high fields. Traditional permanent magnets can be designed with yoke geometries that leave a wide open area around the imaging region contained within the gap between the pole pieces. However, to keep the magnet size and its weight within practical limits, the pole pieces must be as close as possible to the patient's body. The large transverse dimensions of the pole pieces dictated by the required field uniformity within the region of interest further limits the access to the patient and interferes with the surgical instrumentation. Moreover, as the field within the region of interest increases the efficiency of a traditional permanent magnet decreases, with an increasing level of the stray field outside the gap.

Some of the problems with superconductive and permanent magnets are solved by an "open top" or "open" magnetic structure of the present invention as disclosed herein and as further described in the co-pending U.S. application issuing as U.S. Pat. No. 5,495,222. In the open magnetic structure of the present invention access to the patient is provided through a large opening along one side or top of the magnet, in addition to two open ends of the structure. A further advantage of the open top design of the present invention is that the magnet cavity may be the combination of two or more individual cavities of independent magnetic structures inserted within one or both of the pole pieces of an external structure. The independent internal structures are not open to the outside medium and are designed to generate a uniform field within their respective cavities. As a consequence, they contribute to the correction of the field distortion within the cavity of the external structure.

Additional background information on the use of permanent magnetic structures to generate highly uniform fields and on open magnetic structures is found in at least the following sources, which are hereby incorporated by reference:

[1] Abele, M., *Structures of permanent magnets*. John Wiley and Sons, Inc., New York, 1993.

[2] Jensen J. H., Abele M. G., *Effects of Field Orientation on Field Uniformity in Permanent Magnet Structures*. Journal of Applied Physics 76(10), 6853–6855, 1994.

[3] Abele M. G., Rusinek H., *Field Computation in Permanent Magnets with Linear Characteristics of Magnetic Media and Ferromagnetic Materials*. Technical Report No. 24, Department of Radiology, New York University Medical Center, Aug. 15, 1991.

[4] Abele M. G., Jensen J. H., Rusinek H., *Linear Theory of Pole Piece Design in Permanent Magnets*. Proceedings of XIII International Workshop on Rare-Earth Magnets and Applications. C. A. F. Manwaring, D. G. R. Jones, A. J. Williams and I. R. Harris, Eds., University of Birmingham, United Kingdom, pp.167–176, 1994.

[5] Abele M. G., *Generation of Highly Uniform Fields with Permanent Magnets*. Technical Report No. 26, Department of Radiology, New York University Medical Center, Jun. 15, 1994.

[6] Abele M. G., *Generation of Highly Uniform Fields with Permanent Magnets* (invited paper). Journal of Applied Physics 76(10), 6247–6252, 1994.

[7] Abele M. G., Jensen J. H., Rusinek H, *Open Hybrid Permanent Magnet*. Technical Report No. 29, Department of Radiology, New York University Medical Center, Mar. 15, 1995.

[8] Abele M. G., A *High Efficiency Yoked Permanent Magnet*. Technical Report No. 23, Department of Radiology, New York University Medical Center, Oct. 1, 1990.

[9] Abele, M. G., Rusinek H., *Optimum Design of Yokeless Permanent Magnet*. Journal of Applied Physics, 67 (9), pp. 4644–4646, 1990.

[10] Jensen J. H., Abele, M. G., *Optimization of Permanent Magnet Structures*. Technical Report No. 28, Department of Radiology, New York University Medical Center, Oct. 15, 1994.

[11] Abele M. G., Rusinek H., Field *Distortion Caused by Magnetization Tolerances of Permanent Magnets*. IEEE Trans Magnetics, 29(6), 2908–2910, 1993.

The inventors have identified several problems or areas for improvement in the open magnetic structure and in magnetic structures in general. For example, it would be advantageous to reduce the weight of the open magnetic structure and/or increase the size of the magnet cavity. Also, the top opening of the magnetic structure, while providing the advantage of access to the patient, causes distortions in the magnetic field generated within the cavity from an ideal magnetic field generated by a closed magnetic structure. It is desired to reduce these distortions in the magnetic field, as well as additional distortions caused by magnetization and fabrication tolerances. Another desired improvement involves extending a magnetostatic potential of a component of a magnetic structure, such as a ferromagnetic block in a pole piece, from one location to another location or locations within the structure. In accordance with the present invention, straps composed of thin layers of high magnetic permeability material may be used in the manner described herein to provide these and other advantages and improvements, with particular application to the open magnetic structure of the present invention.

Several references and prior patents are of interest to certain aspects of the present invention. Reference [1] (pages 189–216) discloses the use of thin layers of high magnetic permeability material in closed prismatic magnetic structures as spatial filters to reduce the field distortion caused by a nonuniform distribution of the magnetic properties due to fabrication and magnetization tolerances. Reference [1] (pages 336–359) and U.S. Pat. No. 5,428,333 disclose the insertion of two high magnetic permeability plates at the interfaces between magnetic material of a magnetic structure and an internal cavity to improve the uniformity of the field by filtering out the unwanted harmonics generated by the openings at the ends of the magnetic structure. The presence of the two plates results in a field configuration within a region of interest in the cavity that is very close to that generated by a two-dimensional structure of infinite length.

The references and prior patents, however, do not disclose the structures and techniques of the present invention. For example, the references and patents do not show the use of straps embedded in an open magnetic structure to increase cavity size, decrease weight, and reduce field distortions, as illustrated by the preferred embodiments.

SUMMARY OF THE INVENTION

It is an object of the present invention to provide is an open-ended magnetic structure generating a highly-uniform magnetic field in an imaging region in a main cavity within the structure and allowing access to the main cavity via a large opening along one side of the structure.

It is another object of the present invention to provide a permanent magnetic structure for accommodating in a main cavity a patient for NMR imaging while simultaneously allowing a surgeon to conduct a surgical procedure on the patient.

It is another object of the present invention to provide an improved magnetic structure for generating a substantially uniform, strong magnetic field within a region of interest.

It is another object of the present invention to reduce or compensate for distortions in a magnetic field generated within an open magnetic structure.

It is another object of the present invention to reduce or compensate for distortions in a magnetic field generated by a magnetic structure caused by magnetization and fabrication tolerances in the structure.

It is another object of the present invention to reduce the weight of an open magnetic structure without substantially decreasing the overall magnetic field generated within the structure.

It is another object of the present invention to increase the size of the cavity defined within an open magnetic structure without substantially decreasing the overall magnetic field generated within the structure.

It is another object of the present invention to provide an apparatus for extending the magnetostatic potential of a component of a magnetic structure from the component to another part of the structure.

It is another object of the present invention to provide an improved NMR machine for use in medical imaging applications.

The above and other objects of the invention are achieved by an open magnetic structure generating a magnetic field, the magnetic structure comprising an open magnetic system and at least one strap of high magnetic permeability material embedded within structural elements of the open magnetic system. The strap is positioned substantially on all or part of an equipotential surface of the magnetic field. The strap serves to reduce or eliminate distortions in the magnetic field from an ideal magnetic field due to the opening in the magnetic structure and/or distortions in the magnetic field arising from fabrication or magnetization tolerances in the magnetic structure.

In preferred embodiments, the open magnetic system is comprised of permanently magnetized material and ferromagnetic material. In a structure including some permanently magnetized material the strap is preferably embedded within the permanently magnetized material. The open magnetic structure may contain an external yoke to close the flux outside the structure, may be yokeless or may be a hybrid structure. In addition, in preferred embodiments the open magnetic system is configured to generate a substantially uniform magnetic field and may contain additional structures to help compensate for field distortions, such as wedges of permanently magnetized material or filter structures. The magnetic wedges may be located at the side walls of the open magnetic system and magnetized in the direction of the magnetic field. The filter structures may be applied to the side walls on surfaces facing an inside cavity of the open magnetic system.

In preferred embodiments the strap is configured to exactly coincide with all or part of an equipotential surface of an ideal magnetic field generated by an associated ideal closed magnetic structure, i.e. a closed structure identical to the open magnetic structure but having a closing and being comprised of perfect materials at perfect geometry.

To maximize the beneficial effects of using the strap the strap should be a thin layer having a thickness sufficient to prevent magnetic saturation of the strap. The strap could be used to replace a thick block of ferromagnetic material, such as the block used in the closed end of the open magnetic system disclosed herein and in U.S. Pat. No. 5,495,222, without substantially decreasing the magnetic field. In such a system the strap may be considered part of the pole piece, in that it performs substantially the same function as a thick ferromagnetic block.

Some or all of the objects of the invention are also achieved by a magnetic structure which generates a magnetic field and comprises a magnetic system having ferromagnetic pole pieces and a thin, light weight strap embedded within the magnetic system substantially at an equipotential surface of the magnetic field, such that the strap performs substantially the same function in the magnetic structure as could otherwise be performed by a thick block of ferromagnetic material contained in at least one of the pole pieces. In accordance with this aspect of the invention the strap allows for reduced weight of the structure and/or greater volume of the cavity inside the structure without affecting the overall magnetic field generated by the magnetic structure.

In accordance with further aspects of the invention a magnetic structure is provided which comprises a component which is at a magnetostatic potential in the presence of a magnetic field generated by the structure and a strap of high magnetic permeability material connected to the component and extending through all or part of the magnetic structure. The strap extends the magnetostatic potential from the component to another part of the magnetic structure. The component may be a ferromagnetic block, and the magnetic structure may have a side opening to allow access to a patient or other object placed within the structure. In such a case the ferromagnetic block is preferably positioned near the side opening and the strap extends away from the side opening. As with other embodiments of the invention as described so far the strap is preferably positioned substantially along an equipotential surface of the magnetic field.

The present invention also involves various methods for improving magnetic structures. One of these is a method for reducing field distortions in an open magnetic structure. This method comprises identifying one or more equipotential surfaces of an ideal magnetic field generated by an associated ideal closed magnetic structure which, except for being closed, is substantially identical to the open magnetic structure, and positioning one or more straps made of high permeability material within the open magnetic system aligned with the identified equipotential surfaces to reduce the field distortions. The flux of the magnetic structure may be channeled and closed using an external yoke of high permeability material.

Another method of the present invention is for decreasing the weight and volume of a magnetic structure. The magnetic structure could potentially comprise a thick block of ferromagnetic material such as in a pole piece of an open magnetic structure as described herein. The ferromagnetic block is replaced with a strap of high permeability material which is a thin layer and is light weight without decreasing the magnetic field generated by the magnetic structure, thus decreasing the overall volume of the magnetic structure by an amount corresponding to the volume of the thick block of ferromagnetic material which is replaced less the minimally required volume of the strap. Similarly, another method is for increasing a cavity size of a magnetic structure by replacing the thick block of ferromagnetic material adjacent a cavity of a particular size with a strap of high permeability material which is a thin layer.

In accordance with still further aspects of the present invention an open magnetic structure is provided comprising primary and secondary magnetic systems. The primary magnetic system comprises a first magnetic structure with spaced opposed first and second ferromagnetic pole pieces coupled to the first magnetic structure and defining a main cavity having at least a side access opening and generating a substantially uniform magnetic field within a first region of interest in the main cavity, the first region of interest being accessible via at least the side opening. In preferred embodiments the first magnetic structure comprises at least one permanent magnet.

The secondary magnetic system comprises at least a first permanent magnet inset into the first ferromagnetic pole piece. The first permanent magnet is configured to define a first lateral cavity adjoining the main cavity. The secondary magnetic system generates within a second region of interest within the first lateral cavity substantially the same uniform magnetic field as is generated within the first region of interest within the main cavity by the primary magnetic system, thereby to provide an enlarged region of interest combining at least the first and second regions of interest and having a substantially uniform magnetic field. An additional secondary magnetic system identical to the first may be inserted in the second pole piece, thus creating a symmetrical structure.

The combination of the main or central cavity with the adjoining lateral cavity or cavities provides an enlarged imaging region with a uniform magnetic field to support NMR imaging without increasing the overall size of the magnetic structure and with an actual reduction in the overall weight of the magnetic material needed. The magnetic structure is particularly suitable for medical applications since the imaging region extends over a large portion of the main cavity. As a consequence the magnetic structure can be used in a compact clinical scanner designed for whole body imaging. Moreover, the use of modern high energy product rare earth materials results in a magnetic structure capable of generating fields up to 0.5 T within practical weight and size limits. The remarkable proximity of the region of high field uniformity to the side opening of the magnet makes this structure of interest for surgical/interventional applications. The compact magnetic structure with a large opening makes it possible to integrate the gantry of a scanner in a surgical suite with minimum interference with surgical procedures.

In preferred embodiments, the magnetic structure comprises means for compensating for field distortions within the main cavity arising from the side access opening. The means for compensating may comprise a strap made of high magnetic permeability material which may be aligned substantially along an equipotential surface of the substantially uniform magnetic field. In some embodiments the first pole piece in the primary magnetic system comprises a ferromagnetic block positioned outside the first permanent magnet near the side access opening. The strap may then be connected to the ferromagnetic block and aligned along an equipotential surface of the substantially uniform magnetic field outside of the first permanent magnet. In further preferred embodiments additional field distortion compensation means may be provided by a unique arrangement of permanent magnetic and soft magnetic blocks and by a filter structure to compensate for a number of spatial harmonics of the field distortion.

The magnetic structure may comprise multiple straps of high magnetic permeability material spaced apart from each other, each of which is aligned along an equipotential surface of the substantially uniform magnetic field. The distance separating the straps may be determined, as explained below, in accordance with the desired effectiveness of the straps in reducing perturbations or distortions.

Further in accordance with the present invention the invention comprises a strapped open magnetic structure having a bottom wall and spaced side walls coupled to the bottom wall. The side and bottom walls contain a first magnetic structure with spaced opposed first and second pole pieces and define a main cavity having at least a top access opening. The magnetic structure generates a substantially uniform magnetic field within a first region of interest of the main cavity, the first region of interest being accessible via at least the top opening. At least one of the pole pieces comprises a ferromagnetic block positioned near the top opening. The open magnetic structure further comprises one or more thin straps coupled to the ferromagnetic block and the first magnetic structure. The straps are made of high magnetic permeability material, and at least one of them is positioned adjacent part of the surface of the first or second pole piece facing the main cavity.

Although the geometry of the open magnetic structure of the preferred embodiments is intended for clinical interventions and surgery, the structure can be beneficial for other diagnostic imaging applications that require an easy access to the region of interest.

BRIEF DESCRIPTION OF THE DRAWINGS

The invention is illustrated in the figures of the accompanying drawings which are meant to be exemplary and not limiting, in which like references refer to like or corresponding arts, and in which:

FIG. 16 shows the closed hybrid magnetic structure of FIG. 12 with one of the ferromagnetic pieces replaced by a strap;

FIG. 17 shows a side-by-side perspective view of unstrapped and strapped open magnetic structures in accordance with preferred embodiments of the present invention;

DETAILED DESCRIPTION OF THE PREFERRED EMBODIMENTS

The present invention presents structures and techniques for at least (1) correcting field distortion within an open magnetic structure by the insertion of ferromagnetic straps composed of thin layers of high magnetic permeability material, (2) reducing the weight of an open magnetic structure and/or increasing the cavity size of the structure by replacing thick, heavy blocks of ferromagnetic material in the structure with thin straps, or (3) extending the magnetostatic potential of a component in a magnetic structure by connecting a thin strap thereto and embedding the strap in the magnetic structure along an equipotential surface of the magnetic field generated by the magnetic structure. Each of these aspects of the present invention will be described below with reference to the drawings in the figures showing preferred embodiments.

For an open magnetic structure such as the one described herein and further in U.S. Pat. No. 5,495,222, of which the present application is a continuation-in-part, the major causes of distortion in the magnetic field are the open geometry and the magnetization tolerances of the magnetic materials. The distortion is particularly severe for magnets designed to generate relatively strong fields where the dimensions of the structure are large compared to the gap between the pole pieces. In accordance with one aspect of the present invention strapping can be used to compensate for field distortions due to the open geometry of the magnets as well as field distortions due to the magnetization tolerances of the magnetic materials, and is particularly useful in permanent magnets used for NMR imaging.

In the preferred embodiments straps are located on selected equipotential surfaces of a magnetic field which would be generated by an ideal closed magnet with perfect materials and geometry. By definition, in the limit of infinite permeability the straps are equipotential. As a result, the straps affect only the field distortions by eliminating the components of the field parallel to the strap surface.

Figure 1:
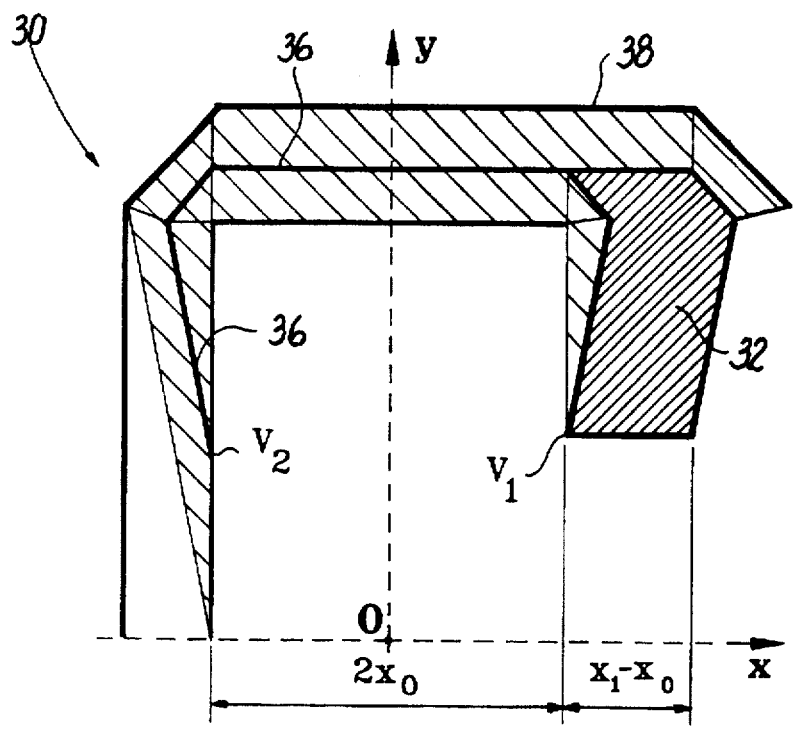
FIG. 1 is a schematic drawing of a preferred embodiment of the strapped open magnetic structure of the present invention, shown only in the y>0 region.

FIG. 1 shows an open version of the hybrid magnet which is similar to the open magnetic structure disclosed herein and in U.S. Pat. No. 5,495,222, which is described in detail below. For clarity, only the y>0 section of the magnet 30 is shown in the drawing. The densely shaded region indicates a pole piece 32 comprising a block of ferromagnetic material located near the open end of the cavity 34 that is designed to partially compensate for the field distortion due to the opening. A strap 36 (shown by heavy line) is embedded within the magnet 30 between permanent magnetic blocks 42, 43 and 45 on one side and permanent magnetic blocks 46, 47, and 48 on the other (see FIG. 2). The strap is aligned along an equipotential surface of the magnetic field generated by the magnet 30. An external yoke 38 used to channel and close the lines of magnetic flux outside the magnet 30 and the pole piece 32 are also shown with a heavy line in FIG. 1.

As further explained herein, the strap 36 helps reduce distortions arising from the presence of the opening of the magnet 30 as well as distortions caused by fabrication and magnetization tolerances. The magnetic structure 30 has end openings along the z axis to allow insertion of a patient or other body to be subject to the magnetic field in the cavity 34. In the preferred embodiments, however, these openings are sufficiently far from the region of interest in the cavity 34 of the magnetic structure 30 that distortions due to the end openings are negligible, and the magnetic structure 30 can thus be considered closed at the ends for purposes of analysis. However, the top opening 39 must be close to the patient in order to provide access to the patient while the patient is being subject to the magnetic field. Thus, distortions due to the top opening 39 are problematic and are reduced by the strap 36 in accordance with the present invention.

In accordance with further aspects of the present invention, the ferromagnetic pole piece 32 is connected to the strap 36, and the strap 36 extends through the magnet 30 towards the closed end of the magnet 30. The pole piece 32 is at a given magnetostatic potential in the presence of the magnetic field generated by the magnet 30, and the strap 36 functions to extend that potential through the magnet 30 through to the point $V_2$. A singularity is created at the point labeled $V_2$, which is where the strap terminates at the interface with the cavity. This singularity may be analyzed as described below in accordance with the present invention.

Figure 2:
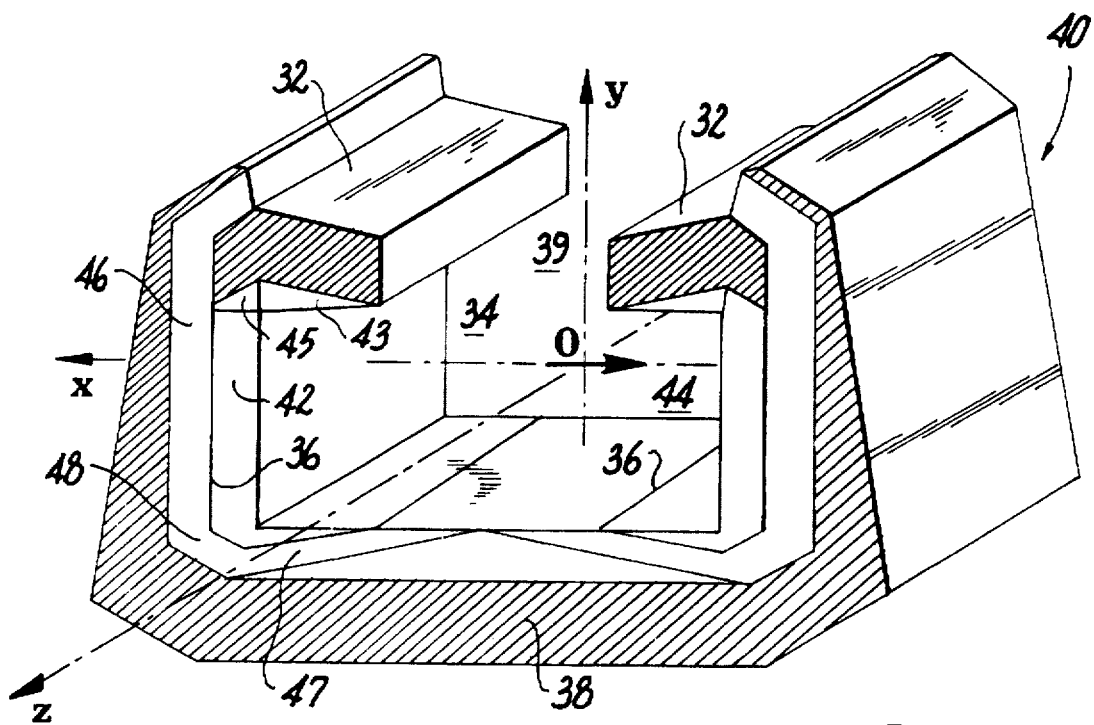
FIG. 2 a perspective, three-dimensional view of the strapped open magnetic structure shown in FIG. 1.
Figure 3:
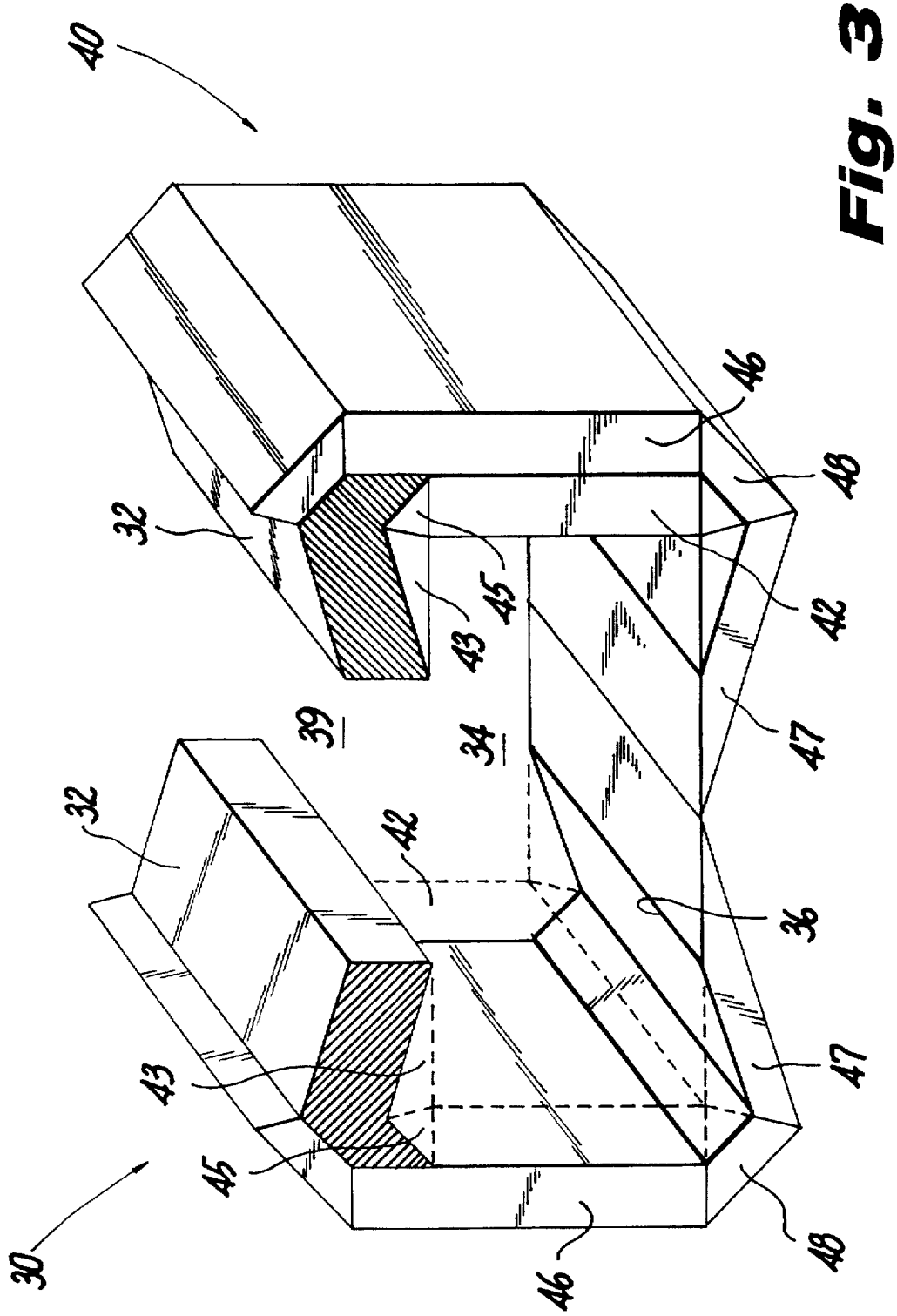
FIG. 3 is a perspective view of the strapped open magnetic structure of FIG. 2 shown without the external yoke and with the permanently magnetized material inset into the left pole piece shown in cut-away, and with the outline of the strap shown behind the permanently magnetized material.

Three-dimensional views of the magnet 30 of FIG. 1 are shown in FIGS. 2 and 3. The views show a structure which is symmetrical around the y axis, having identical pole pieces 32 and straps 36 in either side wall 40, and with permanent magnets 42, 43 and 45 inset into the pole pieces 32 in order to extend the main cavity 34 of the magnet 30 into two adjoining lateral cavities 44 on either side, as explained below and further in U.S. Pat. No. 5,495,222. Surrounding the magnet 30 in FIG. 2 is the external yoke 38 designed to close the flux of $\vec{B}$ generated by the magnet 30. FIG. 3 shows the permanent magnets 42, 43 and 45 inset into the pole piece 32 on the left side wall of the magnet 30 in cut-away view, so that the strap 36 is visible as depicted in a heavy line outline.

11

In theory, a strap having a magnetic permeability of $\mu=\infty$ could have infinitesimal thickness and still function to reduce distortions as described herein. In practice, a strap has finite permeability and must therefore have some minimal thickness. The minimally required thickness is determined with reference to the magnetic saturation of the material used in the strap. Magnetic saturation refers to the state of maximum magnetization of a ferromagnetic material within a magnetic field. As one skilled in the art will recognize, it is preferable in magnet design to keep ferromagnetic material from becoming saturated, because when saturated the surface of a ferromagnetic body no longer coincides with an equipotential surface. Conventional computerized modeling techniques are used to determine the necessary minimal thickness of a strap based on its permeability, the strength of the magnetic field in which it is used, and structural considerations.

Figure 4:
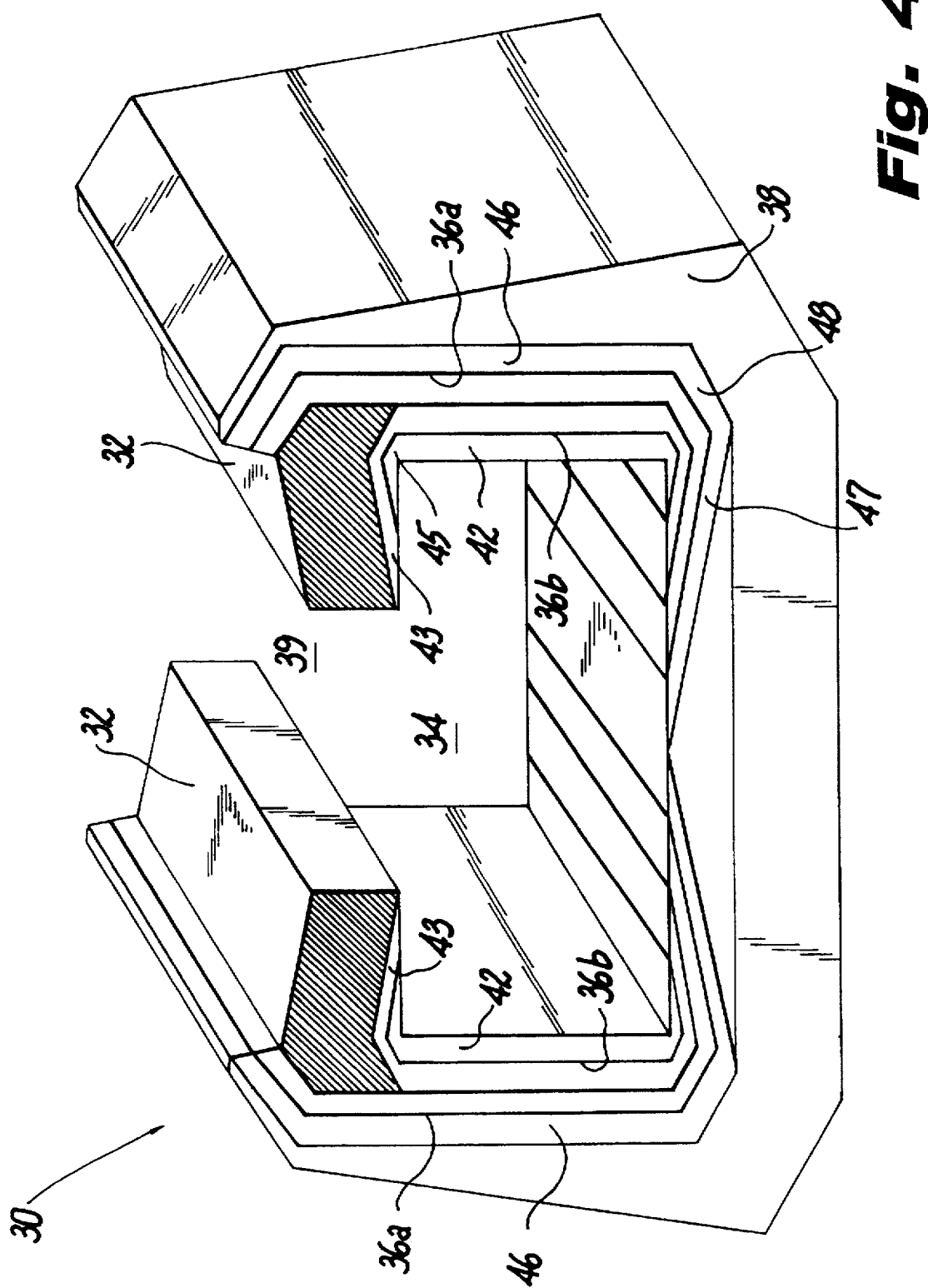
FIG. 4 is a perspective view of an open magnetic structure containing multiple straps in accordance with another preferred embodiment of the present invention.

As shown in FIG. 4 the open magnetic structure 30 may contain additional straps 36a and 36b embedded within the magnetic structure 30 to further reduce distortions as explained above. Two of the additional straps 36a in FIG. 4 are embedded in permanent magnets 46, 47, and 48 placed on the outside of the pole piece 32, and two straps 36b are embedded within the permanent magnets 42, 43, and 45 inset into the pole pieces 32.

When multiple straps are used, the effectiveness of the straps in reducing distortions depends in part upon the distance w that separates consecutive equipotential surfaces and on the location of these surfaces. Assume, for instance, a perturbation $\delta \vec{J}$ of the remanence of the material perpendicular to two straps located at a distance $w_0$ apart from each other, and assume that the perturbation is limited to a small volume V at a distance $\bar{w}$ from one of the straps.

In a cylindrical frame of reference r, $\psi$, w with the axis r=0 passing through the volume V and the origin on one of the two plates, the localized perturbation $\delta \vec{J}$ generates a perturbation $\delta\Phi$ of the potential $$\delta\Phi = \delta J \frac{\pi V}{2\mu_0 w_0^2} \sum_{n=1}^{\infty} n \cos\left(n\pi \frac{\bar{w}}{w_0}\right) K_0\left(n\pi \frac{r}{w_0}\right) \sin\left(n\pi \frac{w}{w_0}\right),$$

where $K_0$ is the modified Bessel function of the third kind. The effectiveness of the straps increases rapidly as the distance $w_0$ becomes small compared to the length of the straps. Thus, the distance between straps can be set in order to achieve a desired effectiveness level.

Figure 5:
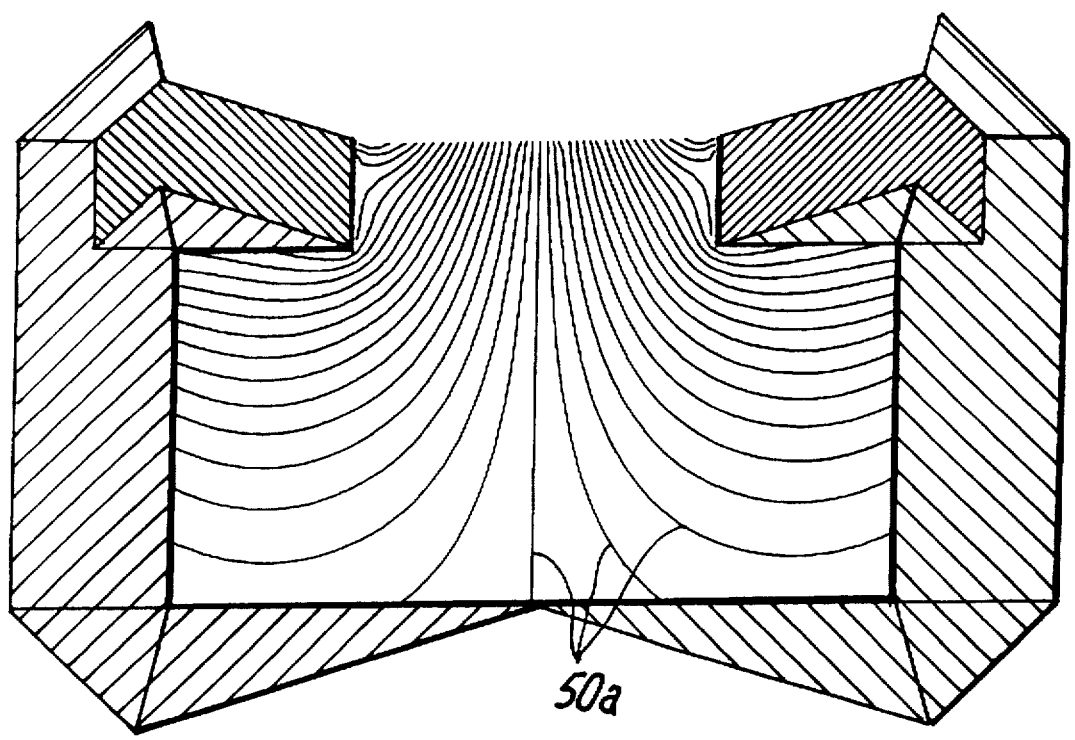
FIG. 5 is a schematic drawing of an open magnetic structure without straps, otherwise similar to the structure shown in FIGS. 1–3, showing equipotential lines of the field distortion representing the difference between the field generated by the open magnetic structure and the ideal uniform field generated by an associated closed magnetic structure.
Figure 6:
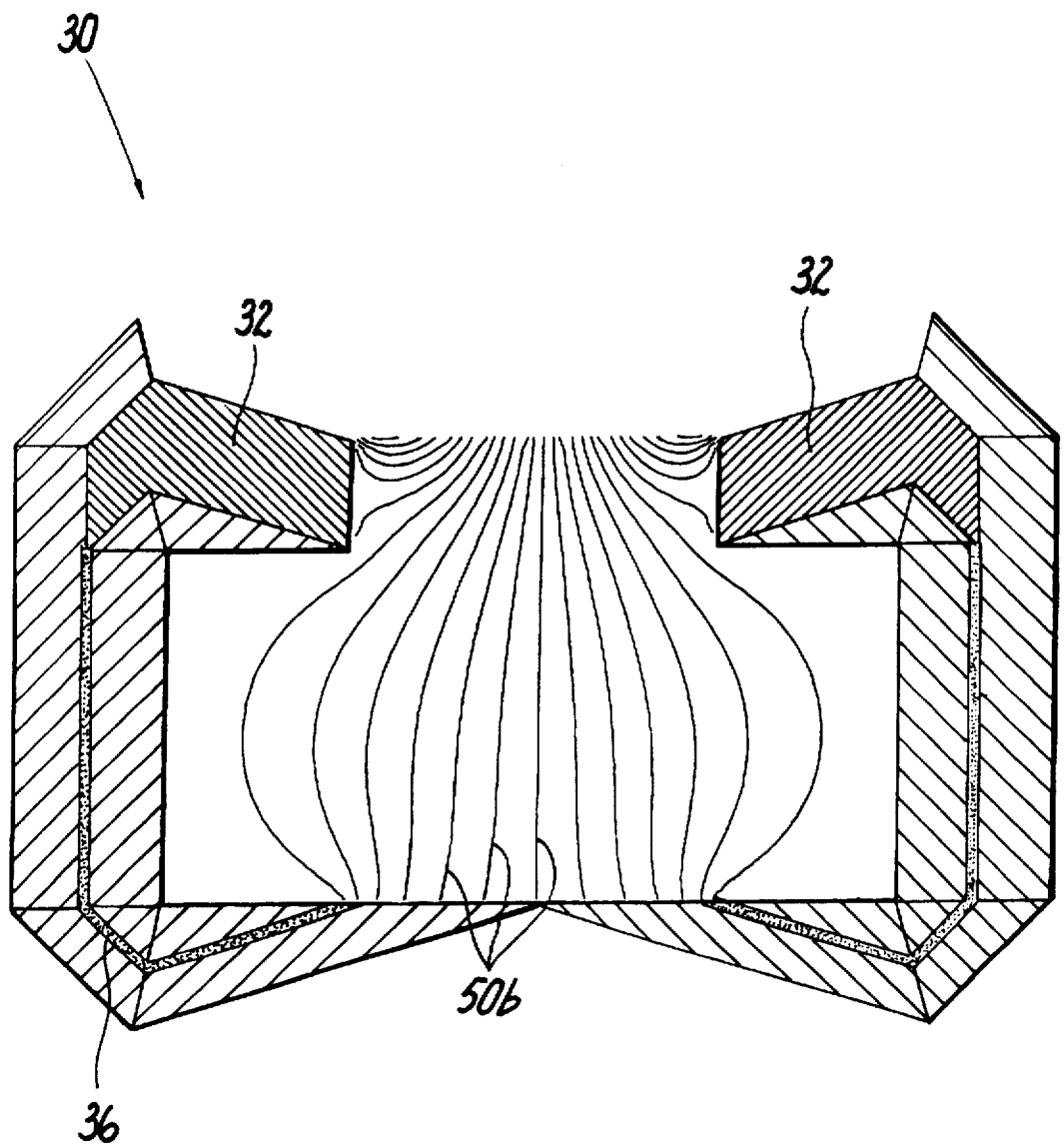
FIG. 6 is a schematic drawing of a strapped open magnetic structure as shown in FIGS. 1–3 showing equipotential lines of the field distortion.

The effect of inserting one strap to an open magnet is revealed by plotting the equipotential lines 50 of the field distortion, i.e., of the difference between the field generated by the open magnet and the ideal uniform field of an "associated" closed magnet, that is, a closed magnet which has substantially the same structure and dimensions as the open magnet but which contains additional magnetic structure to close the opening. FIG. 5 shows such equipotential lines 50a for an unstrapped open magnet 48, and FIG. 6 shows such equipotential lines 50b for an open magnet 30 having one strap 36 connected to the pole piece 32. The computation of the field within a central cylindrical region occupying 50% area of the cavity 34 indicates that the strapping in FIG. 6 improves the field uniformity by a factor 3.4 as compared with the unstrapped magnet 48 shown in FIG. 5.

Thus, when applied to the open-top magnet described herein and in U.S. Pat. No. 5,495,222, strapping can be used to reduce distortions caused by the opening and by fabrication and magnetization tolerances. In addition, as shown in FIG. 17, strapping can be used to decrease the weight of the magnet and increase the size of the cavity without affecting magnetic field uniformity as compared to an open magnet having thick internal blocks of ferromagnetic material.

The remainder of the description, describing the invention in more detail, is divided into several sections. Section 1 describes the geometry of the open magnets of the preferred embodiments, including the open magnet having thick internal ferromagnetic blocks as pole pieces as well as the modified geometry of the open magnetic structure with straps used in place of the ferromagnetic blocks. Section 2 analyzes the properties of the magnetic fields generated both within the cavity and in the fringe areas of an open magnetic structure with a strap. Section 3 analyzes the field singularities at particular points in the magnetic structure, including singularities caused by the opening and by the strap. Section 4 describes other structures or methods, such as filter structures, used in an open magnetic structure to further compensate for distortions due to the opening.

Section 1. Basic Geometry of the Open Magnets

The preferred embodiments of an open magnetic structure of the present invention can be better understood by first analyzing the principles underlying the present invention.

Figure 7:
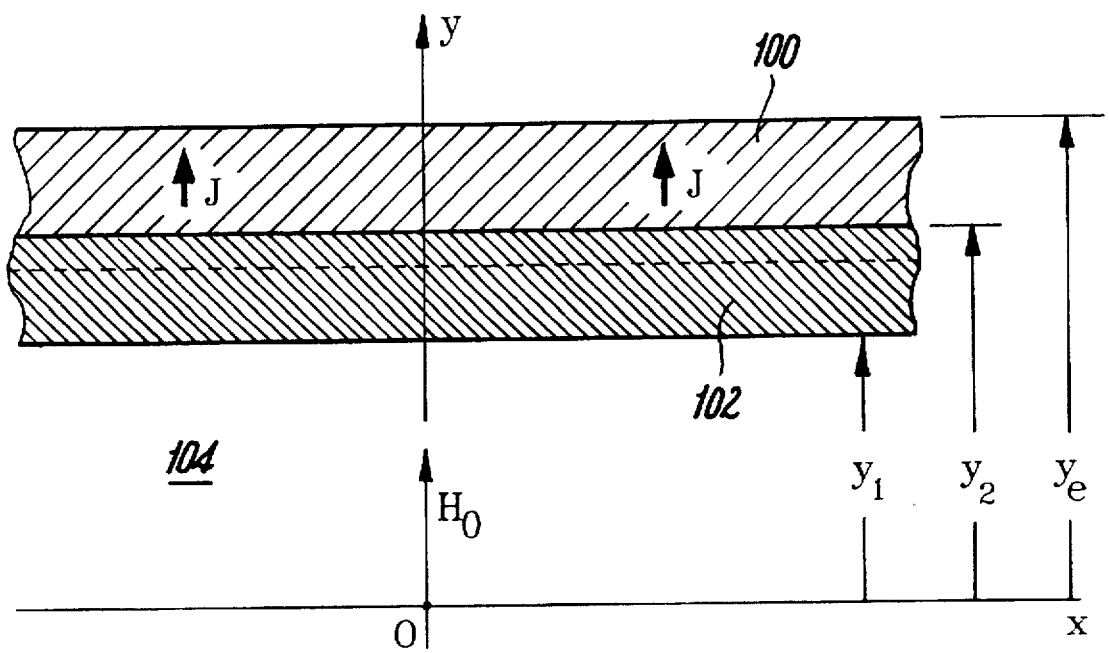
FIG. 7 is a schematic drawing of a configuration of a permanent magnetic (light shading) and soft ferromagnetic (denser shading) layer that generates a uniform field within an air gap; drawing

Consider the schematic shown in FIG. 7, which depicts a configuration of a magnetic layer 100 (light shading) and ferromagnetic layer 102 (denser shading) that generate a uniform magnetic field within an air gap 104. The dashed line indicates a limiting case where the ferromagnetic medium has a zero-thickness. In the schematic the two surfaces y=0 and y=$y_e$ are equipotential planes at zero potential. The medium in the two regions y<0 and y>$y_e$ is assumed to be an ideal ferromagnetic medium of infinite magnetic permeability. Assume that an infinite magnetic permeability plate of thickness $y_2-y_1$ is inserted in the region y<$y_e$. The medium in the region y<$y_1$, is assumed to be air, and the medium in the region $y_2$<y<$y_e$ is assumed to be an ideal magnetic medium whose magnetic characteristic is $$\vec{B} = \vec{J} + \mu_0 \vec{H}_0 \qquad (1.1)$$

where $\vec{B}$ is the magnetic induction, $\vec{J}$ is the remanence, $\vec{H}_0$ is the intensity of the magnetic field, and $\mu_0$ is the magnetic permeability of a vacuum. The remanence $\vec{J}$, oriented parallel to the y axis, generates an intensity $\vec{H}_0$ of the field within the region y<$y_1$ which is given by $$\mu_0 \vec{H}_0 = K \vec{J}, \qquad (1.2)$$

where $$K = \frac{y_e - y_2}{y_e - y_2 + y_1} \qquad (1.3)$$

Both the remanence $\vec{J}$ of the magnetic layer 100 and the magnetic field $\vec{H}_0$ are aligned with the y axis. As long as $y_1$, $y_2$, $y_e$ satisfy Eq. (1.3), the value of the field $\vec{H}_0$ is independent of the thickness of $y_2-y_1$ of $\mu=\infty$ plate. One limiting case occurs when $y_1 \to 0, y_2 \to y_e$, in which case the entire region becomes the ferromagnetic medium 102. A second limiting case occurs when the thickness $y_2-y_1$ is reduced to zero, forming a direct interface between the magnetic medium and air located on the plane $$y_0 = (1-K)y_e \qquad (1.4)$$

Figure 8:
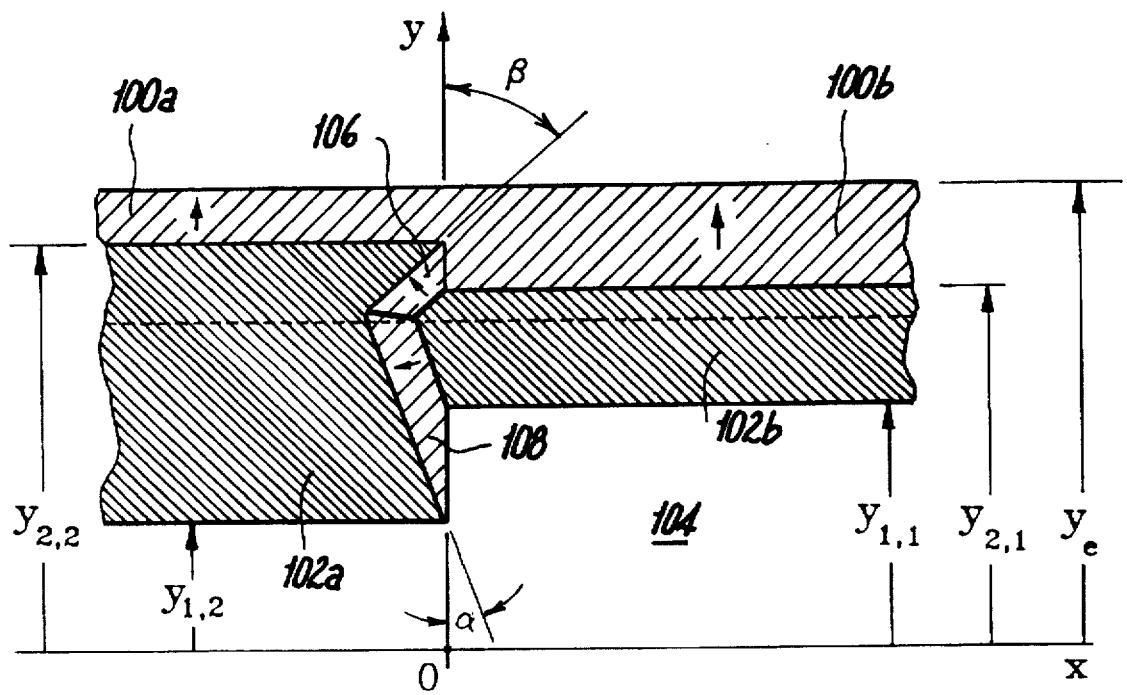
FIG. 8 is a schematic drawing showing in a structure as in FIG. 7 how in accordance with the invention a transition between two regions of different thickness, each generating the same field in the air gap region, can be accomplished using two trapezoidal permanent magnetic components.

Assume a transition between two regions of different heights $y_{1,1}$, $y_{1,2}$ of the air gap and different thicknesses $y_{2,1}-y_{1,1}$ and $y_{2,2}-y_{1,2}$ of the ferromagnetic plates, each generating the same field in the air region. As long as the two regions satisfy the condition $$\frac{y_e - y_{2,1}}{y_e - y_{2,1} + y_{1,1}} = \frac{y_e - y_{2,2}}{y_e - y_{2,2} + y_{1,2}} = K \qquad (1.5)$$

such a transition can be accomplished without affecting the uniformity of the field by means of the technique illustrated in FIG. 8. In FIG. 8, the two plates 102a and 102b are separated from each other by two trapezoidal components 106 and 108 of magnetic material. The angles $\alpha$, $\beta$ of the interfaces between the trapezoidal components 106 and 108 and the $\mu=\infty$ plates 102a and 102b are given by $$\sin \alpha = K, \sin \beta = 1-K \qquad (1.6)$$

The remanences of the trapezoidal components 106 and 108 have the same magnitude of remanence $\vec{J}$ as the remanence in the magnetic layers 100a and 100b shown in FIG. 8, and are oriented perpendicular to their interfaces with the $\mu=\infty$ plates. By virtue of Eq. (1.5), the intensities of the magnetic field in the two trapezoidal components 106 and 108 are equal and opposite to their remanences and, as a consequence, in both components one has $$\vec{B}=0, \qquad (1.7)$$

i.e., no flux of $\vec{B}$ is generated in the trapezoidal components 106 and 108, as shown in reference [8].

Figure 9:
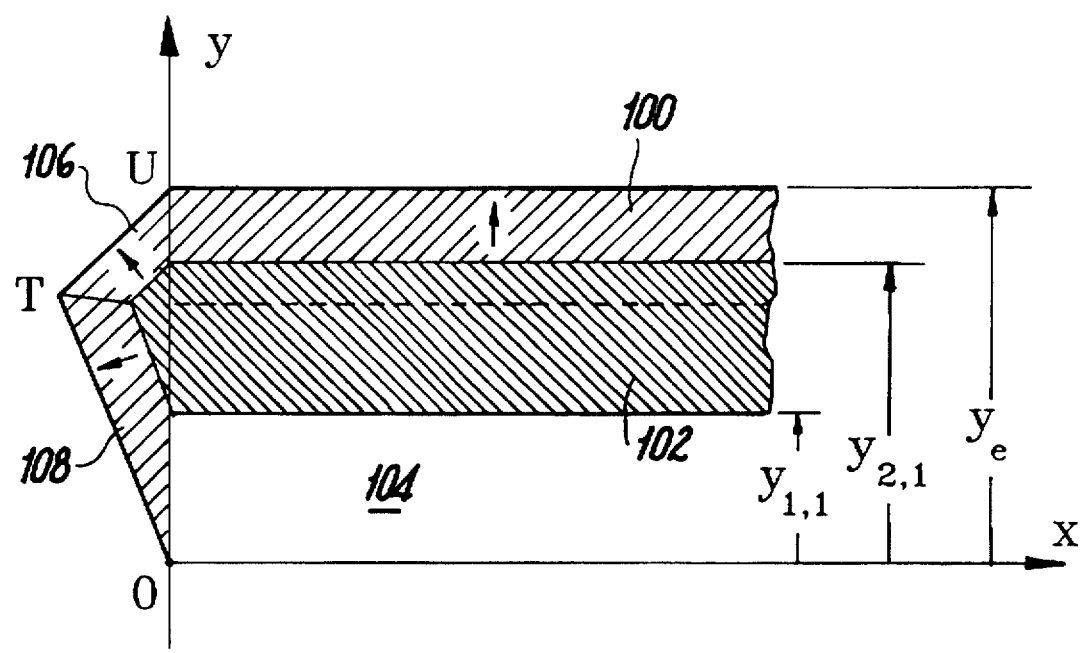
FIG. 9 is a schematic drawing of a magnetic structure obtained by closing the transition defined in FIG. 8 on the plane half x>0.

The transition defined in FIG. 8 can be used to close the magnetic structure on either side of the plane $\chi=0$. For instance if one assumes $$y_{1,2}=0, \qquad (1.8)$$

the structure of FIG. 8 yields the geometry of FIG. 9, which shows the magnetic structure obtained by closing the transition defined in FIG. 8 on the half plane $\chi<0$. The geometry shown in FIG. 9 reduces to FIG. 10 in the limit $$y_{1,1}=y_{2,1}. \qquad (1.9)$$

Figure 10:
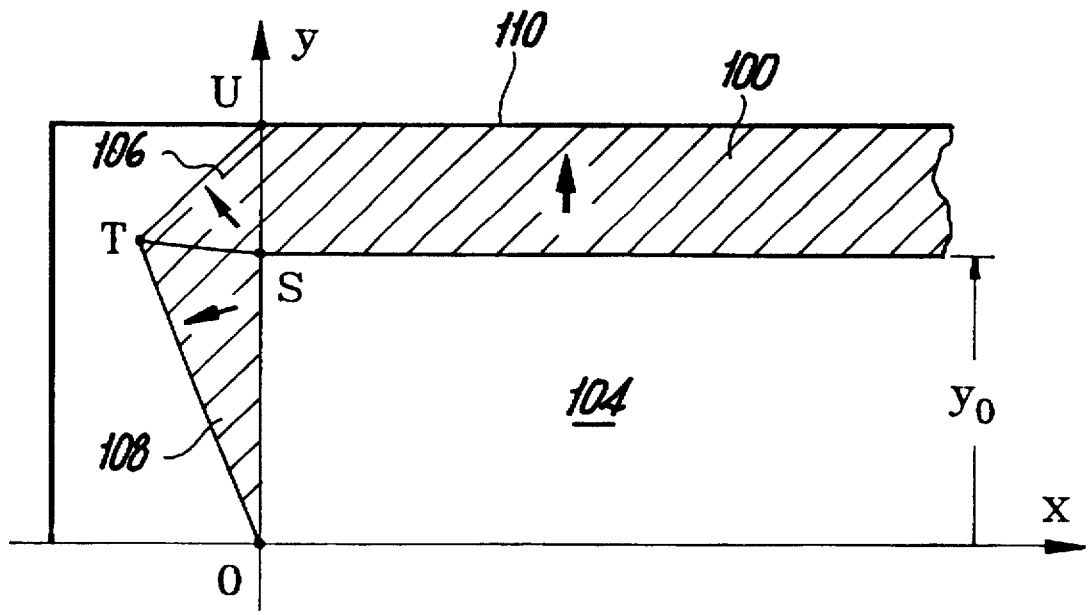
FIG. 10 shows the magnetic structure of FIG. 9 in the limit $y_{1,1}=y_{2,1}$ with the yoke following an arbitrary path outside the magnet.

The coordinates of point T in FIG. 10 are related to the coordinate $y_0$ of point S by the equations $$\begin{cases} x_T = -y_0 \dfrac{K}{\sqrt{K^3(2-K)} + \sqrt{(1-K)^3(1+K)}} \\ y_T = y_0 \dfrac{\sqrt{1-K^2}}{\sqrt{K^3(2-K)} + \sqrt{(1-K)^3(1+K)}} \end{cases} \qquad (1.10)$$

Because of Eq.(1.7) the flux of the magnetic induction in the structure of FIG. 10 is confined to the region $\chi>0$. An ideal yoke 110 that confines the structure in the $\chi<0$ region may be closed outside the boundary (OTU) following an arbitrary path, because the potential $\Phi$ is zero in the regions between the yoke 10 and the external surface of the triangular components 106 and 108 of magnetized material, as shown in reference [8]. An example of such a path is shown with heavy lines in FIG. 10.

Figure 11:
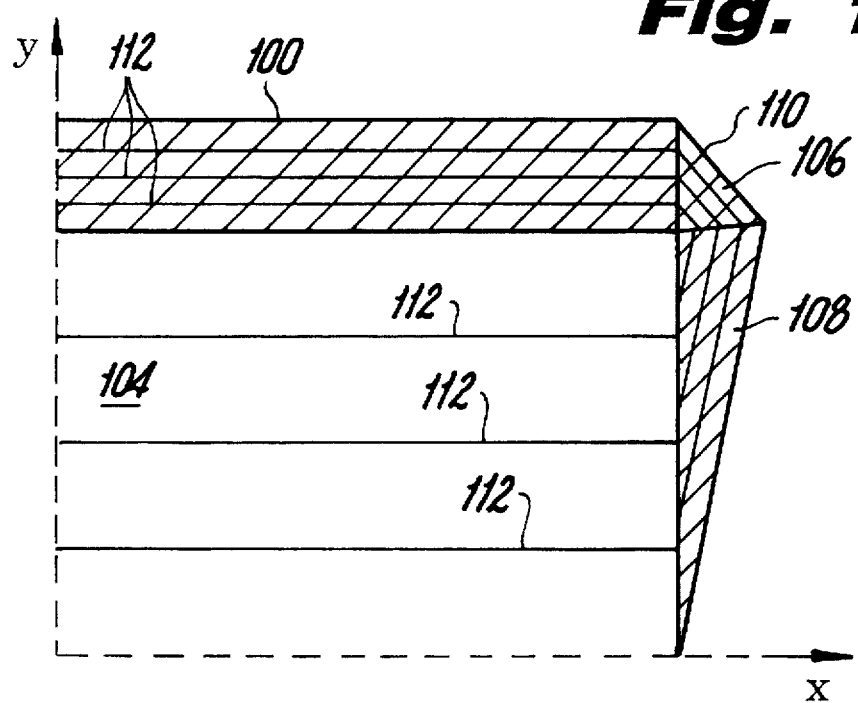
FIG. 11 shows a magnetic structure similar to the structure of FIG. 10 showing equipotential lines.

FIG. 11 shows a number of equipotential lines 112 for the magnetic structure with the geometry shown in FIG. 10, omitting, for simplicity, an external yoke for flux return path corresponding to yoke 110 shown as the heavy line in FIG. 10. If two equipotential surfaces $\Phi=\pm\Phi_1$ on the outer edges of magnetic triangular components 106 and 108 are transformed into $\mu=\infty$ surfaces, the field configuration is not affected.

Figure 12:
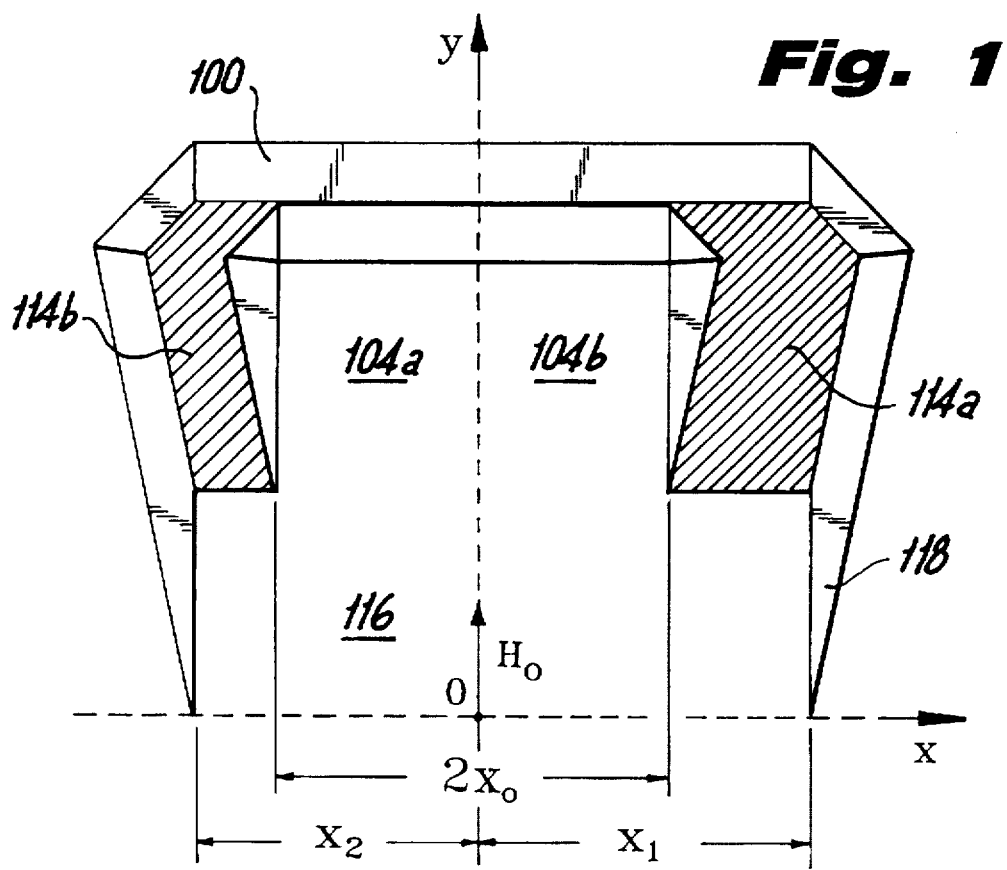
FIG. 12 is a schematic drawing of the y>0 region of a closed hybrid structure with ferromagnetic pieces, with the cavity extended in the x dimension.

A combination of the transitions defined by FIG. 7-11 results in the closed hybrid structure of FIG. 12, with the cavity 104 extended in the x direction, that generates the uniform field oriented along the y axis inside its cavity 104. The extension of the cavity dimension in the x direction requires an equal extension of the rectangular component 100 of magnetic material in the region between the equipotential lines $\Phi=\pm\Phi_1$ and the external yoke 110. The resulting structure shown in FIG. 12 is restricted to the y>0 region, and the shaded areas are the cross-section of $\mu=\infty$ ferromagnetic material pole pieces 114a and 114b. The field uniformity is maintained in a new main cavity 116 formed of central cavity 104 and adjoining lateral cavities 104a and 104b, in spite of the discontinuity of the boundary of the cavity at $x=\pm x_0$.

In FIG. 12, the remanence $\vec{J}$ of the magnetic material has the same magnitude $J_0$ throughout the entire magnetic structure. In general, any combination of materials with different remanences that satisfies Eq. (1.7) can be used to design the triangular trapezoidal components.

Figure 13:
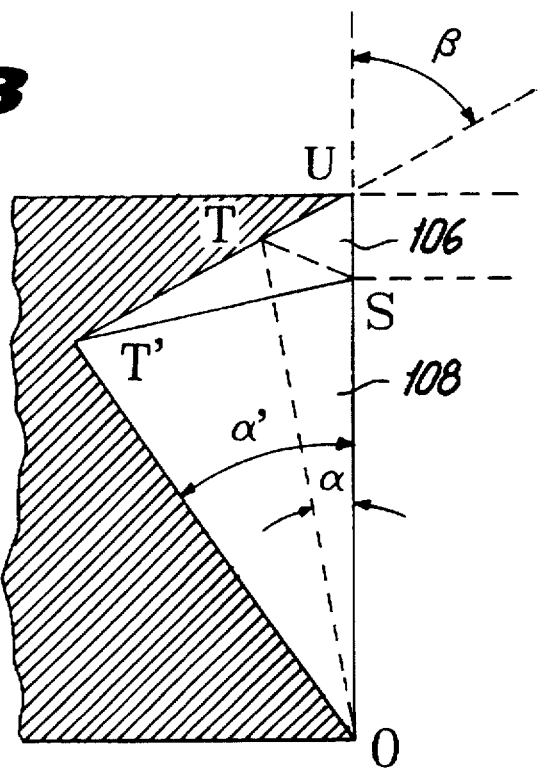
FIG. 13 is a schematic drawing showing the substitution of a triangular component of magnetic material in the magnetic structure shown in FIG. 10 with lower remanence material.

FIG. 13 shows a modified geometry for the two triangular areas (STO) 108 and (STU) 106 of FIG. 10 with the material in the area (STO) being replaced with a material having a magnetic remanence J' smaller that $J_0$. The new angle $\alpha'$ of the components (ST'O) becomes larger, and is given by $$\sin \alpha' = K \frac{J_0}{J'} > \sin \alpha. \qquad (1.11)$$

The larger angle $\alpha'$ obtained with the lower remanence material can be useful in a magnet designed for a small value of K, where a small angle $\alpha$ could generate fabrication and magnetization problems.

In accordance with an aspect of the present invention, the closed magnetic structure of FIG. 12 must be open to allow access to the imaging region. The opening of the magnet distorts the field and the distortion must be compensated to the point where the field maintains the assigned degree of uniformity within the imaging region. The effect of the opening depends on the field orientation relative to the opening. A field orientation perpendicular to the opening minimizes both the distortion of the field within the cavity and the leakage of the field outside the magnet, as shown in reference [2]. As a consequence, the magnet cavity 116 is open at both ends along the z dimension in order to insert a patient within the magnet, and in addition the side wall 118 of the cavity at $x=x_1$ is open to provide access to the region of interest of the patient's body from outside. The opening 120 requires the removal of some of the components of magnetic material, as well as part of the external yoke 110 (FIG. 10, not shown in FIG. 12), resulting in the basic structure of the schematic of FIG. 14.

Figure 14:
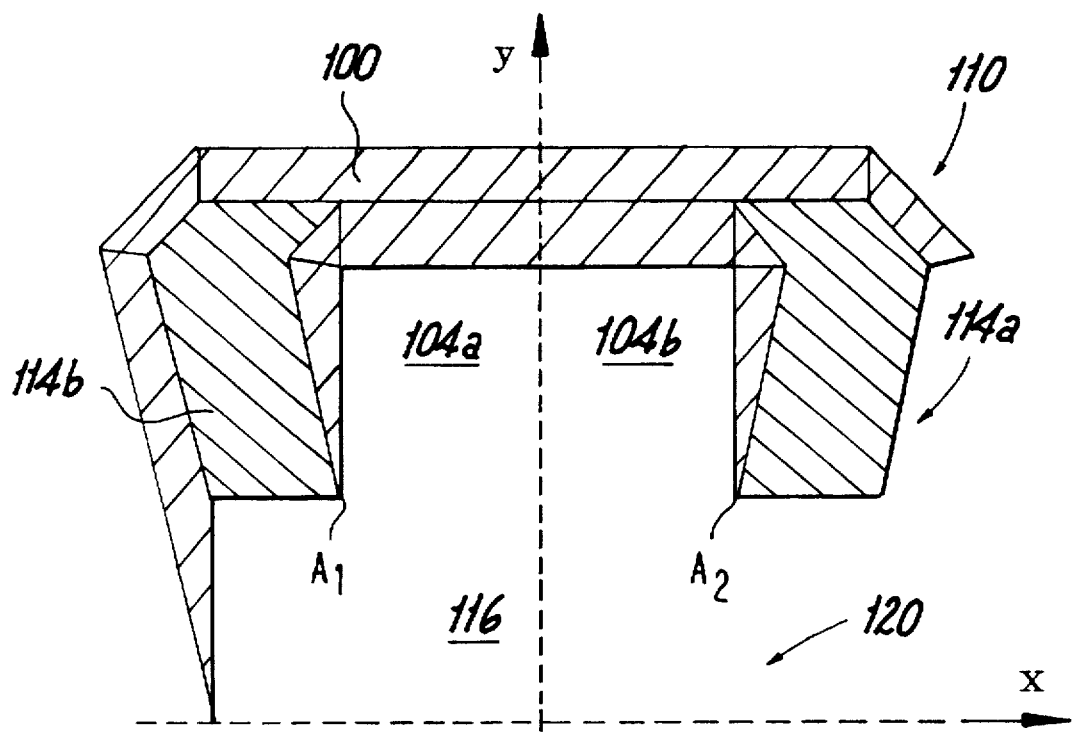
FIG. 14 illustrates an opening of the side wall and removal of a part of the yoke in the hybrid magnetic structure of FIG. 12.
Figure 15A:
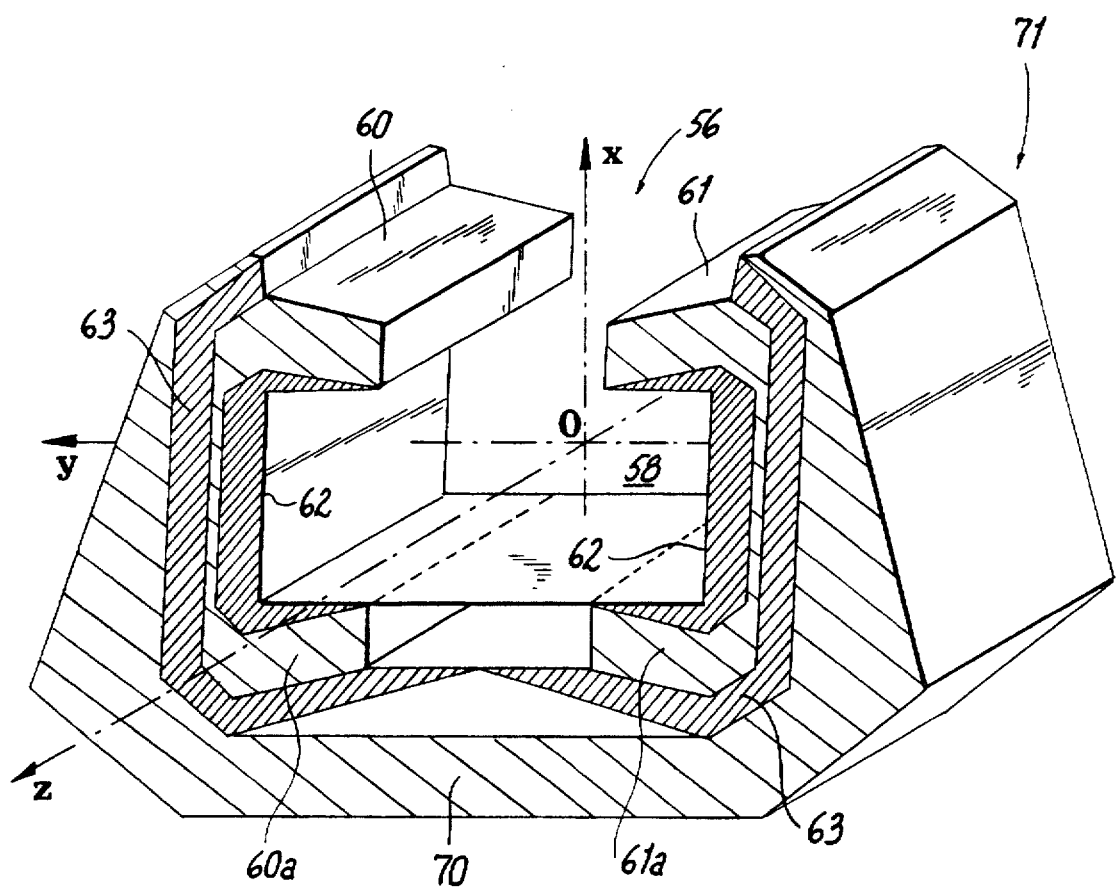
FIGS. 15A and 15B are three-dimensional perspective views of one embodiment of an unstrapped open magnet in accordance with the invention having dimensions of a main cavity large enough to accommodate a human body.
Figure 15B:
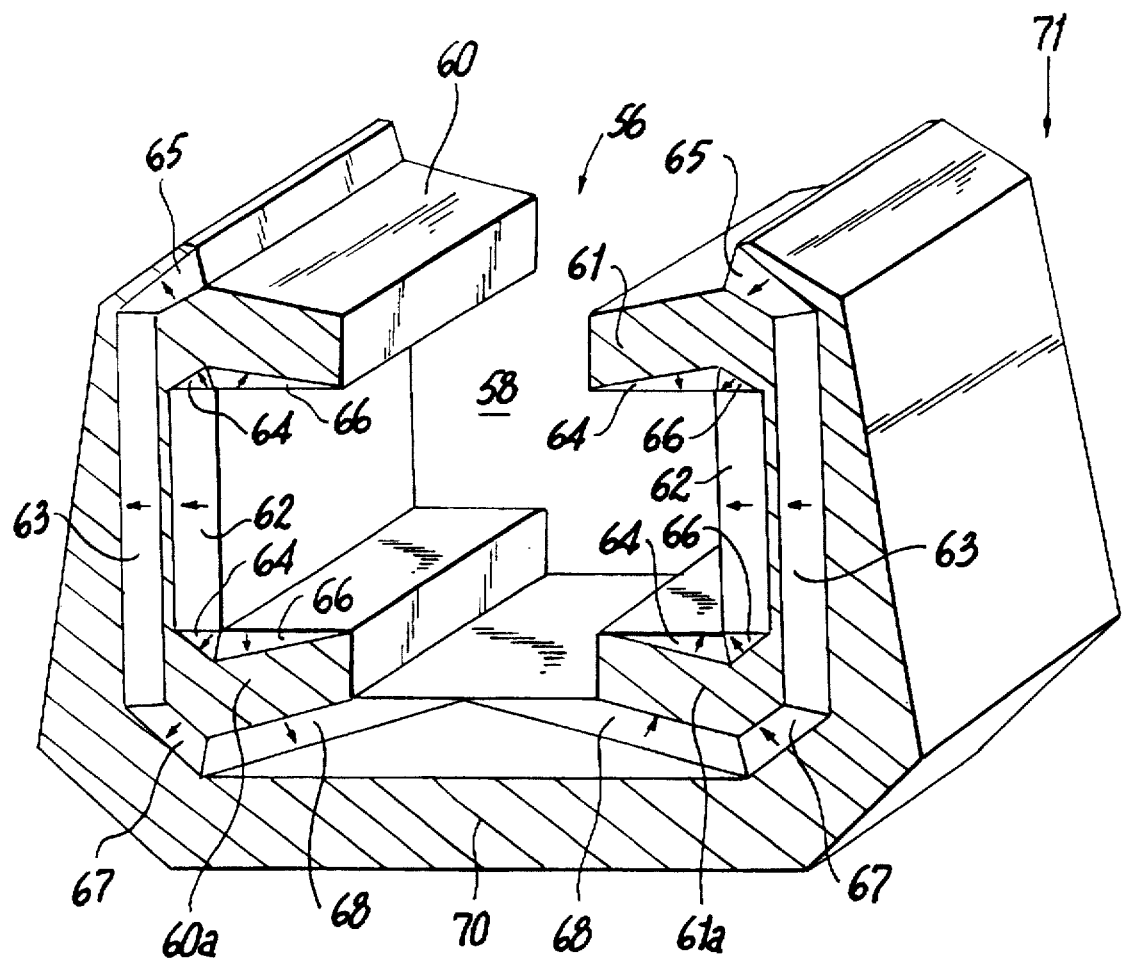

The selection of the geometrical parameters of the magnetic structure of FIG. 14 is the result of a tradeoff among conflicting constraints imposed by the desired dimensions of the imaging region, the minimal length of the magnet, access to the body to be imaged, e.g., patient, and the complexity of the compensation of the field distortion within the imaging region. FIGS. 15A and 15B show in perspective a full magnetic structure 71 of the schematic of FIG. 14, with an external yoke 70, rotated 90° to its normal orientation so the side wall opening 56 is at the top. Ferromagnetic portions are shown in heavy hatching in FIGS. 15A and 15B, and permanent magnetic portions are shown in light hatching in FIG. 15A and no hatching in FIG. 15B in order to show the individual blocks and their magnetization directions by the arrows. The structure 71 shown comprises a generally C-shaped structure with side walls and a bottom wall, open-ended at opposite ends along the z-axis to allow access by a patient to the internal cavity 58, and with a large opening 56 at the top wall to allow access by a surgeon to the patient while undergoing NMR scanning. A uniform field extends in the y-direction within the cavity 58, and the center of the imaging region or region of interest is close to the origin 0 of the x-y-z coordinate system shown. The structure comprises, in each side wall, inner rectangular permanent magnetic block 62, terminated by upper and lower triangular permanent magnetic blocks 64, 66, nested within outer rectangular permanent magnetic block 63, terminated by upper and lower trapezoidal permanent magnetic blocks 65, 67, 68. High permeability ferromagnetic pole pieces 60, 61 separate the nested magnetic blocks. The structure described is surrounded by the ferromagnetic yoke 70 to close the flux lines generated by the magnetic blocks.

In FIGS. 15A and 15B, the dimensions $2x_0$, $2y_0$, $2z_0$ of the cavity 58 are selected to accept the full cross-section of a human body positioned on his or her back. The cavity 58 is fully opened at both ends and the length $2z_0$ is selected to be large enough to minimize the field distortion caused by the openings at $z=\pm z_0$. The width $2y_1$ of the opening 56 on the top wall of the cavity 58 is selected to minimize the access to the region of interest of the patient body. The extension $x_1-x_0$ of the cavity dimension is selected to allow the insertion of a filter structure required to compensate for a number of spatial harmonics of the field distortion, as further discussed herein and in U.S. Pat. No. 5,495,222. The lengthening of the cavity 58 in the z-direction is unnecessary if no additional filter structure is added at both ends of the magnet, i.e., the magnet can be designed with $z_1=z_0$.

Similarly, the dimensions $x_1$, and $x_2$ in FIG. 12 can be arbitrarily chosen to generate a closed magnetic structure. As a result, the ferromagnetic block 114b of the structure shown in FIG. 12 can be replaced by a thin layer of high magnetic permeability material configured to lie along an equipotential surface of an ideal magnetic field generated by an ideal associated closed magnet. FIG. 16 shows the closed magnetic structure of FIG. 12 with one of the ferromagnetic blocks 114b reduced to a zero thickness strap or layer 36 of $\mu=\infty$ material. As shown in FIG. 16, the thin strap 36 is thus embedded within and extends through the magnetic structure. As a result, in the structure with the geometry shown in FIG. 16, $x_2$ is chosen to satisfy $x_2=x_0$.

As with the embodiments shown in FIGS. 14, 15A and 15B, the closed magnetic structure of FIG. 16 must be opened to allow access to the imaging region. The resulting structure 30 is as shown in FIGS. 1 and 2. As with the embodiments of FIGS. 14, 15A and 15B, the magnet 30 is limited in the direction of the z axis, to a section of length $2z_0$ open at both ends, and the wall of the cavity at $x=x_1$ is opened to provide further access to the region of interest of the patient's body. The opening of the cavity 34 at $x=x_1$ requires the removal of some of the components of magnetic material, as well as part of the external yoke 38, as shown in FIGS. 1 and 2.

The schematics of FIGS. 1 and 2 provide the basic design approach of the strapped open magnet 30 of the present invention. To optimize the access to the imaging region, particularly for interventional applications, the magnet 30 is designed with the opening 39 of the wall on top of the cavity 34, as shown in the three dimensional schematic of FIG. 2, where the dimensions $2x_0$, $2y_0$ are selected to accept the full cross section of the human body lying either supine or face down on the plane $x=-x_0$. The length $2z_0$ of the magnet 30 as well as dimensions $x_1$ and $y_1$, are the result of the tradeoff among the conflicting constraints discussed above. In particular, the extension $x_1-x_0$ of the cavity 34 is selected to allow the insertion of a main filter structure required to compensate for the field distortion caused by the open top.

Figure 21A:
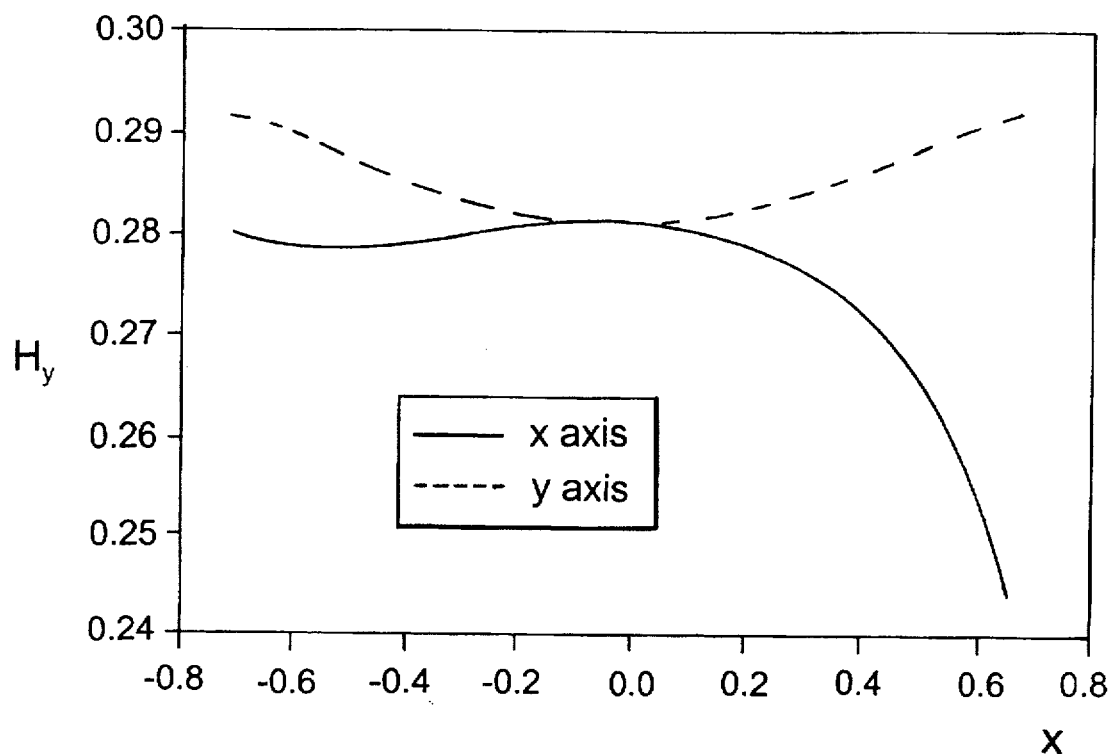
FIGS. 21A and 21B are graphs of the field intensity along the x and y axes for the unstrapped and strapped open magnetic structures, respectively, in accordance with preferred embodiments of the present invention.
Figure 21B:
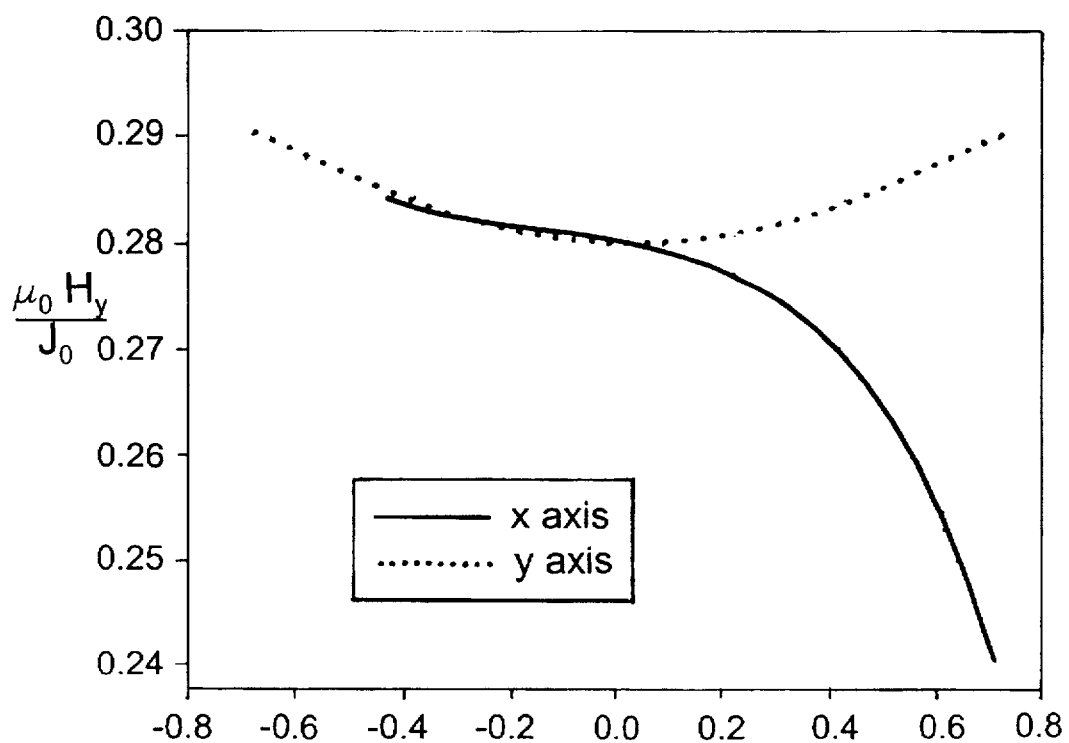

FIG. 17 shows a side-by-side comparison of the unstrapped open magnetic structure 71 of FIGS. 21A and 21B and the strapped open magnetic structure 30 of FIG. 2. As can be clearly seen from FIG. 17, the strap 36 of the strapped magnet 30 replaces part of the pole pieces 60 and 61 of the unstrapped magnet 71, including the thick ferromagnetic blocks 60a and 61a at the closed end of the magnet 71. When compared to the implementation of the open top magnetic structure of preferred embodiments of the present invention, the strapped version maintains the desirable properties of the design, including high degree of the field uniformity and the remarkable proximity of the imaging region to the opening of the magnet. As demonstrated in Table I below, the strapped version has the added advantage of reduced weight of magnetic material, in addition to the obvious reduction of the weight of ferromagnetic material by elimination of the internal blocks.

Figure 44:
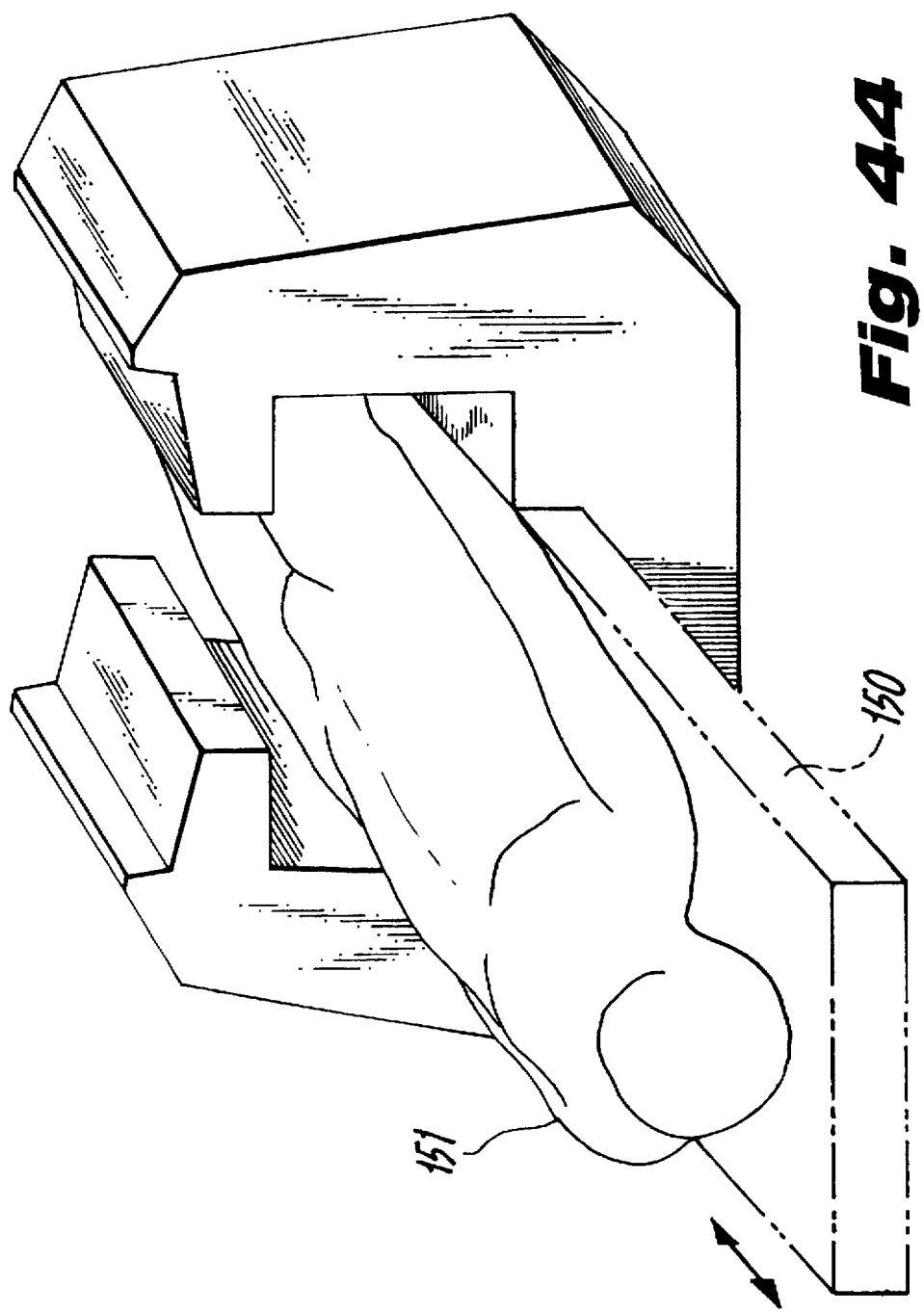
FIG. 44 show a body can fit within the cavity of the structure of FIG. 42.

Also, the strapped version has a larger region of interest within the central cavity, especially because removal of the blocks 60a and 61a removes the space between the two blocks 60a and 61a which otherwise has limited use, such as for a supporting platform, such as platform 150 shown in FIG. 44.

Section 2. Field Properties

This section analyzes the properties of the unstrapped and strapped open magnetic structures of the preferred embodiments. A more complete analysis of the properties of the unstrapped open magnetic structure is contained in U.S. Pat. No. 5,495,222.

The properties of these magnetic structures are primarily influenced by the design parameter K defined in Eqs. (1.2) and (1.3). The thickness of the magnetic material increases with K and as the induction $\mu_0 \vec{H}_0$ approaches the remanence $\vec{J}$, and the dimensions of each magnetic structure become large compared to the dimensions of the respective cavity and diverge for K=1, as shown in reference [9]. The quality of the magnet design is measured by its figure of merit M, defined as the ratio of the energy of the magnetic field generated inside the magnet cavity to the energy stored in the magnetic material. By virtue of Eqs. (1.1)–(1.3), the figure of merit of the basic schematic of FIG. 7 is $$M=K(1-K), \quad (2.1)$$

whose maximum value of $$M_{max}=\tfrac{1}{4} \quad (2.2)$$

occurs at K=0.50. Magnets with large openings exhibit a maximum value of M substantially lower than the limit in Eq. (2.2), and practical designs are achieved for values of K≦0.50.

Figure 18:
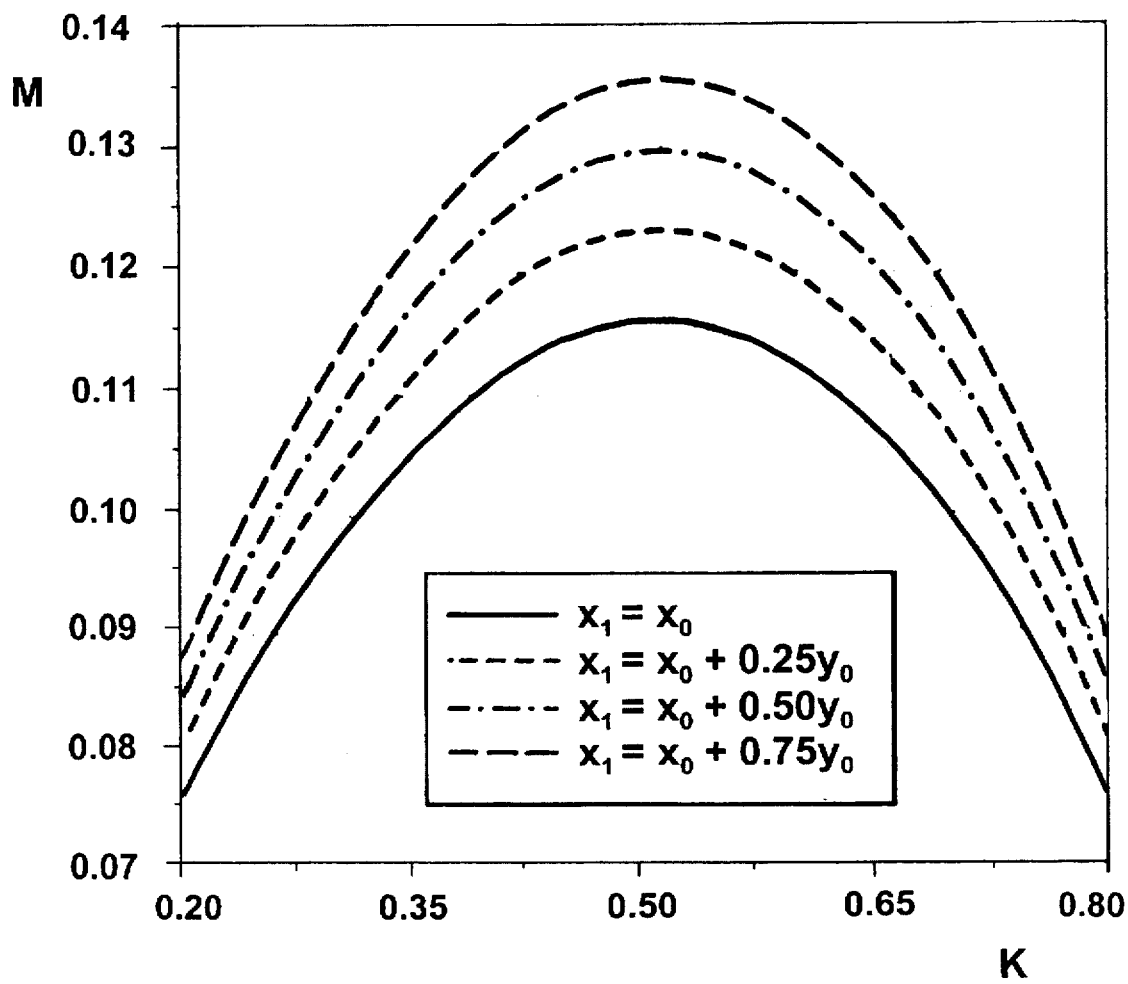
FIG. 18 is a graph of the figure of merit M versus the geometric parameter K for a closed two-dimensional hybrid structure for several different values of $x_1$.

FIG. 18 plots the figure of merit of the two dimensional strapped open structure of FIG. 1 versus the value of K for several values of the dimension $x_1$, and for cavity dimensions $$x_0=0.5y_0, \ x_2=-x_0, \ y_1=0.5y_0 \qquad (2.3)$$

It is seen that the figure of merit improves with increased dimension $x_1$. The maximum value of M for K=0.5 and for $x_1$ likely to be employed in a practical design varies in the range 0.12–0.13.

As described above, FIG. 14 shows the geometry of the unstrapped open hybrid magnet designed for K=0.3. By virtue of Eqs. (1.10), the coordinates of points $A_1$, $A_2$ in FIG. 14 are $$X_{A_2}-X_{A_1}=X_1+0.3401Y_0, \ Y_{A_2}=Y_{A_1}=1.0816Y_0, \qquad (2.4)$$

Other geometrical parameters of the unstrapped open structure are $$X_0=0.5Y_0, \ Y_1=0.5Y_0, \ (X_1-X_0)=0.3Y_0 \qquad (2.5)$$

Figure 19A:
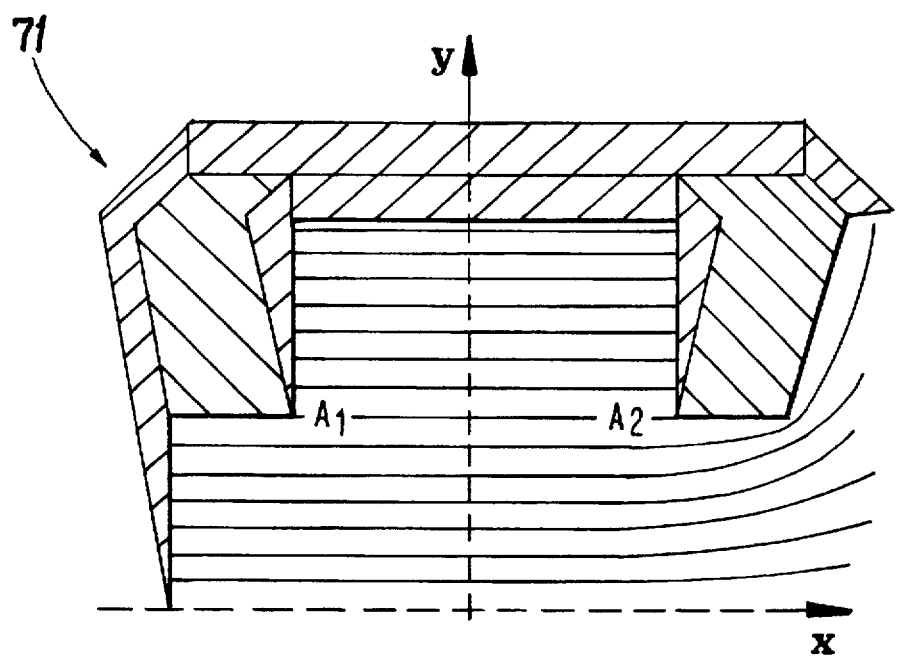
FIGS. 19A and 19B are schematic drawings of the y>0 regions of an unstrapped and a strapped open magnetic structure, respectively, of preferred embodiments of the present invention showing equipotential lines within the respective cavities.
Figure 20A:
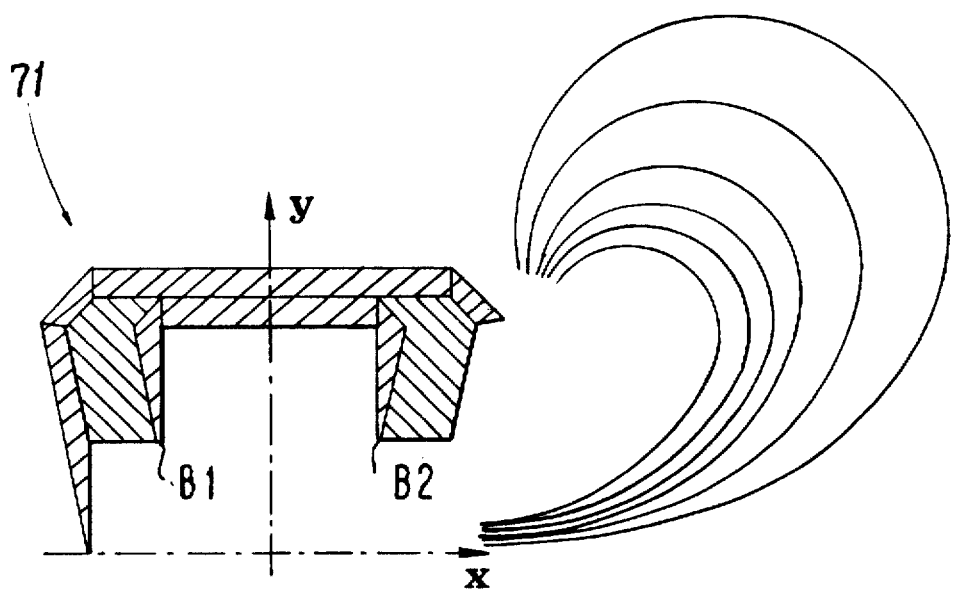
FIGS. 20A and 20B are the schematic drawings of FIGS. 19A and 19B, respectively, showing equipotential lines outside the respective cavities.

For this particular configuration of an unstrapped open magnetic structure 71, shown in FIG. 19A without the external yoke 70, FIG. 19A shows the equipotential lines within the central cavity 58 and FIG. 20A shows the distribution of equipotential lines outside the magnetic structure 71. For $J_0$ normalized to unity, the computed value of the potential of the two $\mu=\infty$ components is $$\Phi_1=-0.1371 \qquad (2.6)$$

Consider now the two dimensional view of the strapped open magnetic structure 30 of FIG. 1 and assume the particular value $$K=0.3. \qquad (2.7)$$

By virtue of Eq. (1.10), the coordinates of point $T_1$, $T_2$ in the schematic of FIG. 19B are $$\begin{cases} x_{T_1}-x_1 = -x_{T_2}-x_0 = 0.340y_0 \\ y_{T_1} = y_{T_2} = 1.082y_0. \end{cases} \qquad (2.8)$$

and the ordinates of points $U_1$, $U_2$ are $$y_{U_1} = y_{U_2} = \frac{y_0}{0.70} \qquad (2.9)$$

Figure 19B:
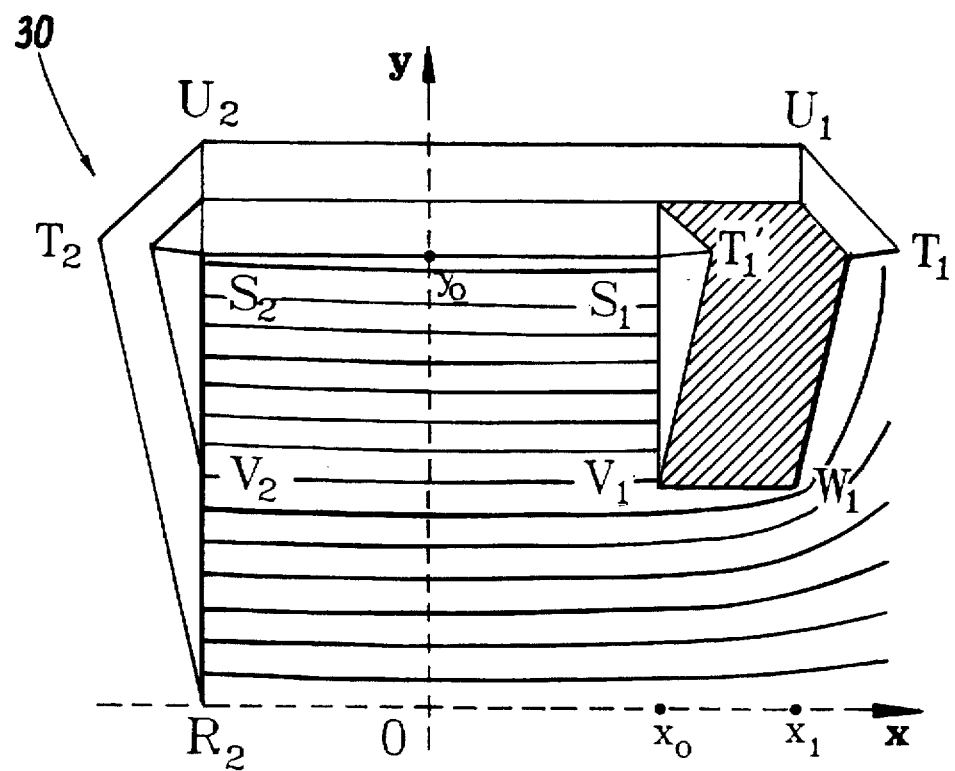
Figure 20B:
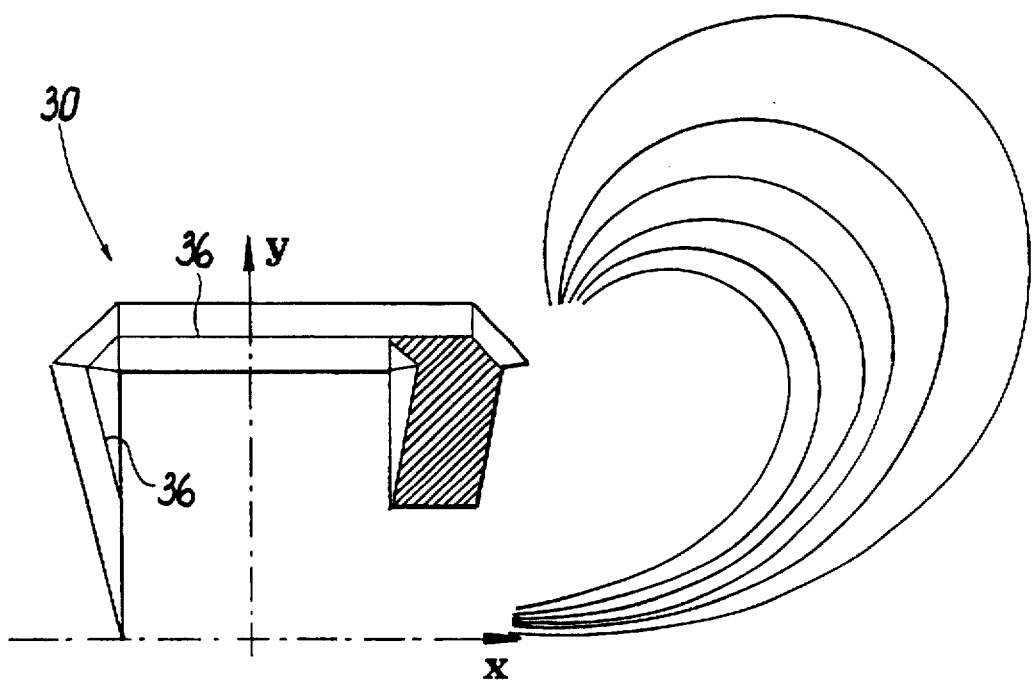

The geometry of FIG. 19B corresponds to the selection of the coordinates $x_0$, $x_2$, and $y_1$ given by Eq.(2.3) and to the length $x_1=0.8y_0$. FIG. 19B also shows the equipotential lines within the magnet cavity 34 of the strapped open magnet 30, and FIG. 20B shows the equipotential lines outside the magnet 30. The computation of the field in FIGS. 19B and 20B is based on a version of the Boundary Elements Method formulated in reference [3], which provides an efficient solution of the magnetostatic problems under the assumption of linear demagnetization characteristics with small values of susceptibility, as is the case for modern magnetic materials.

By comparing equipotential lines for the field generated by the strapped open magnetic structure 30 shown in FIGS. 19B and 20B with those generated by the unstrapped open structure 71 as shown in FIGS. 19A and 20A, respectively, it is apparent that replacing the ferromagnetic blocks 60a and 61a with straps 36 does not substantially effect the uniformity of the overall magnetic field generated by the structure. As a result, the open magnetic structure 30 can be made with less material, thus being lighter and less expensive and providing a larger cavity in which to place a patient or other specimen to be the subject of magnetic imaging.

The computed potential $\Phi_1$ of the ferromagnetic component in FIG. 1 is $$\frac{\mu_0 \Phi_1}{y_0 J_0} = -0.135, \qquad (2.10)$$

i.e., $\Phi_1$ is approximately 10% lower than the value of the potential that would be acquired by a ferromagnetic component in a closed magnet of the same dimensions.

FIG. 21A plots the y-component of the magnetic field along the axes x and y within the cavity for the unstrapped open magnetic structure 71. The field at the geometric center of the cavity is $0.283J_0$, which is approximately 6% less than the field for the ideal closed structure. The center of uniformity is displaced towards the negative direction of the x axis, i.e., away from the opening. The field uniformity within an imaging region of diameter $0.5y_0$ is 0.35%.

FIG. 21B plots the y components of the magnetic field $H_y$ along the axis x, y within the cavity 34 for the strapped open magnet configuration shown in FIG. 19B. The horizontal axis is normalized to $y_0$. The field at the geometric center of the cavity 34 is $$\frac{\mu_0}{J_0} H_y(0,0) = 0.2803, \qquad (2.11)$$

i.e., $H_y(0,0)$ is approximately 6.7% lower that the field in the ideal closed structure for K=0.3. The field along the x axis decreases as one approaches the opening. The field along the y axis exhibits a minimum at the origin.

Figure 22:
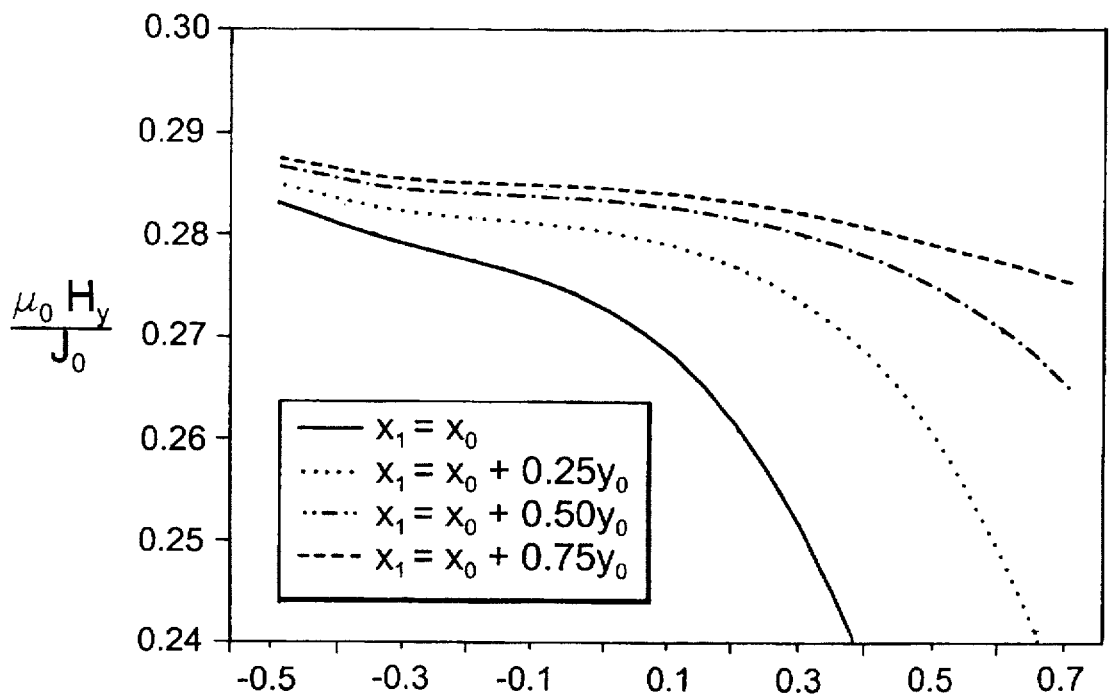
FIG. 22 is a graph of the field intensity along the x axis of the strapped open magnetic structure of FIG. 1 for several values of $x_1$ representing the widths of the ferromagnetic blocks.
Figure 23:
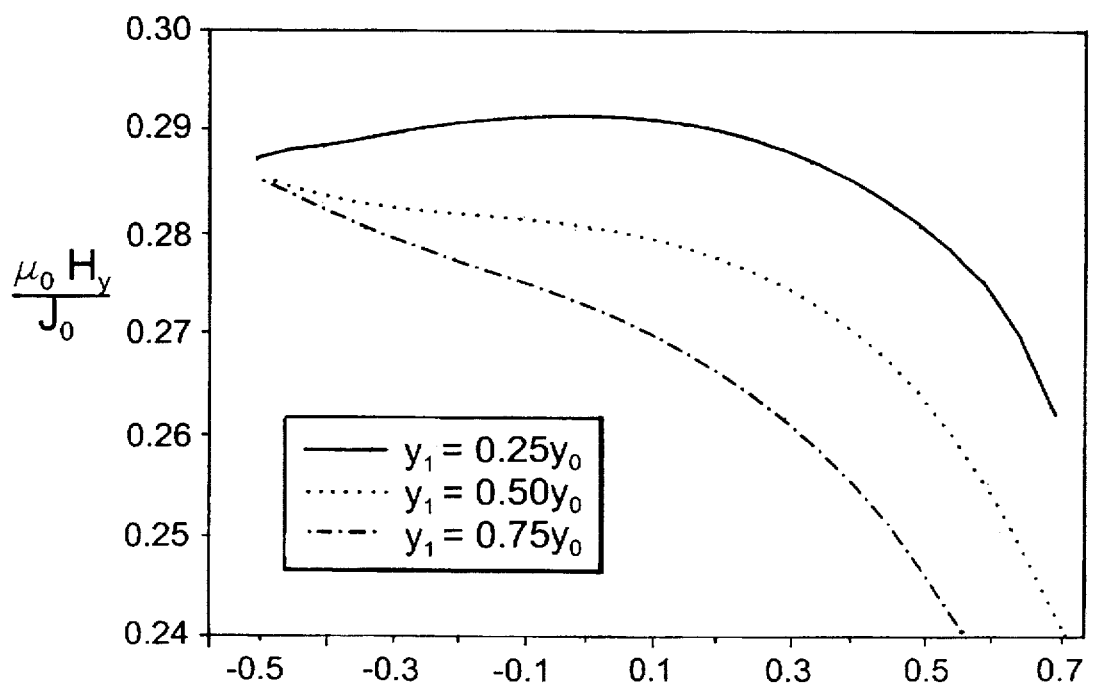
FIG. 23 is a graph of the field intensity along the x axis of the strapped open magnetic structure of FIG. 1 for several values of $y_1$ representing the height of the cavity opening, with the width $x_1$ maintained at $0.8y_0$.
Figure 24:
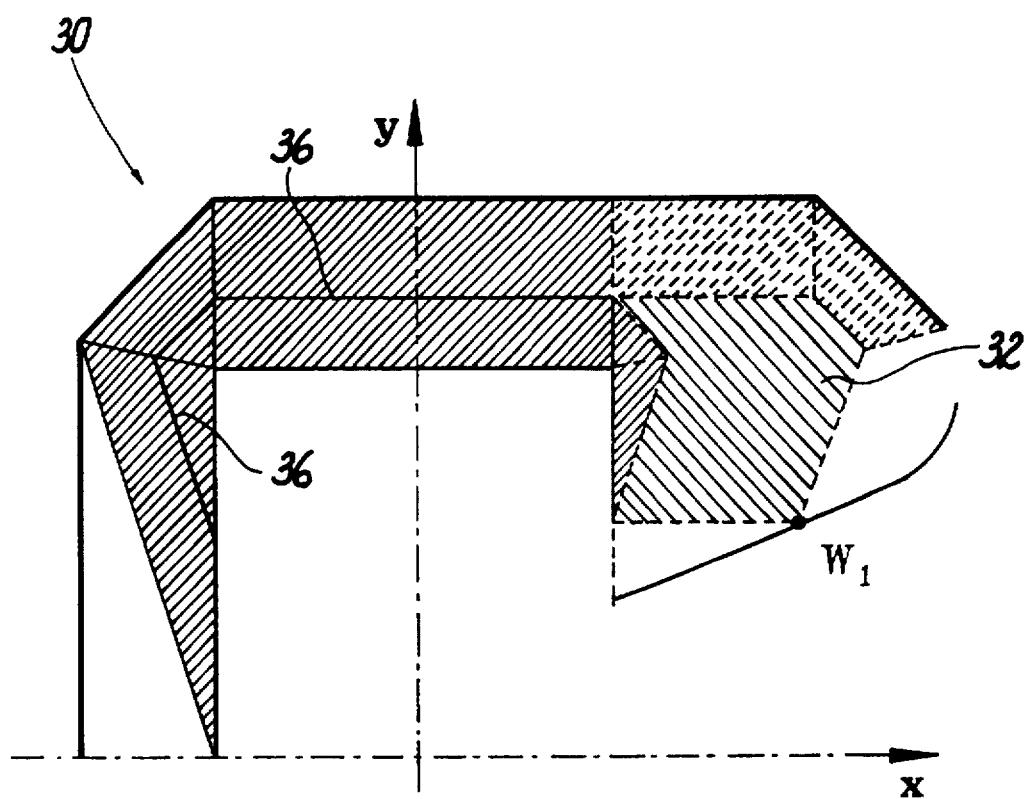
FIG. 24 is a schematic drawing of the strapped open magnetic structure of FIG. 1 showing the relationship between the geometric parameters $x_1$ and $y_1$ that maintain a constant value $H_y(0,0)$.

The effects of varying dimensions $x_1$ and $y_1$ in the strapped open magnet 30 are illustrated in FIGS. 22–24. In FIG. 22, the y component of the field on the x axis is plotted for several values of $x_1$, representing several widths of the ferromagnetic blocks 32, with the cavity opening dimension $y_1$ maintained at $0.5y_0$. FIG. 23 plots the field intensity along the x axis for several values of the height $y_1$ of the opening 39 of the cavity 34, maintaining the width $x_1$ of the ferromagnetic blocks 32 at $0.8y_0$. Larger values of the width $x_1$ of the ferromagnetic blocks 32 and smaller opening size $y_1$ result in improved filed uniformity and increased magnitude of the field within the central region of the cavity 34.

FIG. 24 shows the relationship between the geometric parameters $x_1$ and $y_1$ that maintain the constant value $H_y(0,0)=0.28$. The heavy curve shown in the figure is the locus of the position of vertex $W_1$ of the ferromagnetic block 32. The linearity of the curve for the opening $y_1 < y_0$ demonstrates that parameters $x_1$, $y_1$ maintain a relatively constant solid angle of view of magnet opening as seen from the imaging region.

By virtue of Eq. (1.2), the field intensity $H_0$ within the cavity of a closed magnet is proportional to the value of the parameter K. Table I lists the cross-sectional area of the magnetic material, and the value of the field intensity $H_y(0,0)$ at the geometrical center of the strapped open hybrid magnetic structure 30 normalized to the value of $H_0$ of the ideal closed magnet in the range of values of K0.1–0.5. The geometric parameter $x_1=0.8y_0$ and $y_1=0.5y_0$. The table shows that the loss of field intensity within the cavity increases with increasing K.

TABLE I

| K | Area/$y_0^2$ | $\mu_0 H_0/J_0$ | $H_0/H_0^c$ |
|---|---|---|---|
| 0.1 | 0.41 | 0.09658 | 96.6% |
| 0.2 | 0.96 | 0.18901 | 94.5% |
| 0.3 | 1.70 | 0.28025 | 93.4% |
| 0.4 | 2.72 | 0.37178 | 93.0% |
| 0.5 | 4.18 | 0.46453 | 92.9% |

Section 3. Field Singularities

This section analyzes field singularities created by the opening in the strapped open magnetic structure 30 and the presence of the strap 36 in accordance with preferred embodiments of the present invention.

Figure 25:
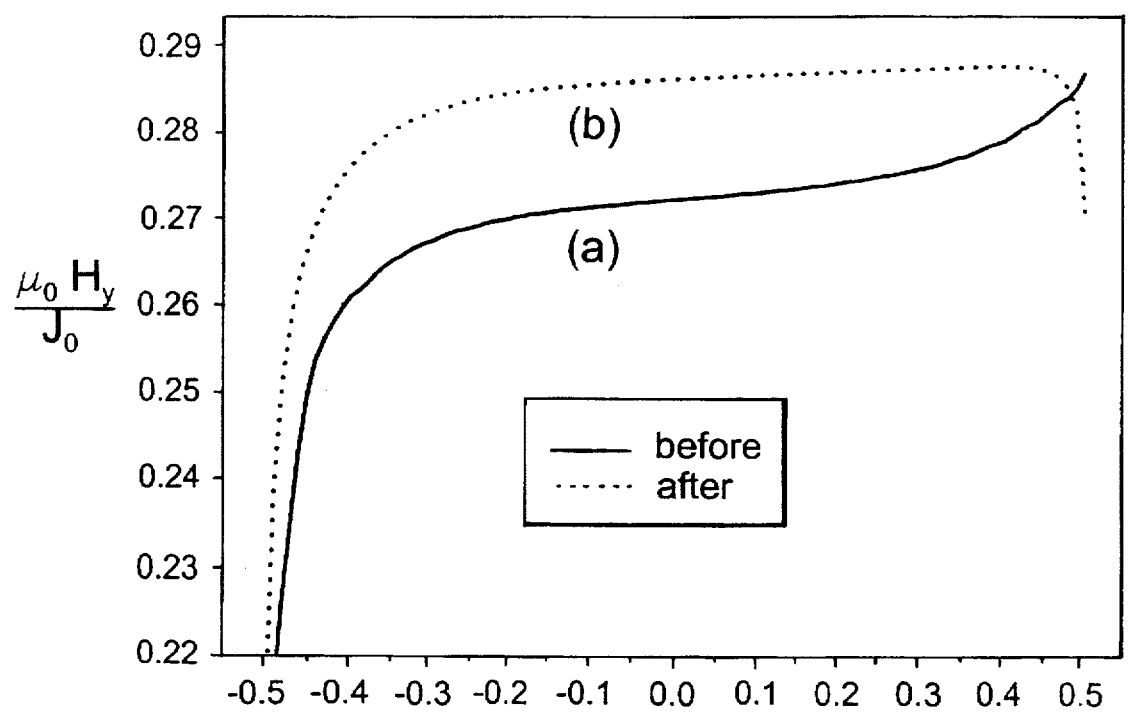
FIG. 25 is a graph of $H_y$ on the line $y=y_1$ before (plot a) and after (plot b) removal of a hypothetical interface between the central cavity and lateral cavity of the magnetic structure shown in FIG. 1.

The opening 39 of the cavity 34 not only results in a decrease of the field within the cavity 34, but also generates a field distortion and, in particular, a singularity of $\vec{H}$ at the corners $V_1$, $V_2$ in FIG. 19B. In the associated fully closed magnet, the segment $V_1$, $V_2$ can be transformed into a "membrane" of zero thickness and infinite magnetic permeability without affecting the field. This is not true in the open magnet because the field is not uniform. This effect is illustrated in FIG. 25, where the component $H_y$ of the field intensity within the region $y<y_1$, is plotted on the line $y<y_1$, with and without the $\mu=\infty$ membrane. In FIG. 25, curve (a) (solid line) shows the slow increase of $H_y$ with x with the membrane, and curve (b) (doted line) shows the field discontinuity at $x=\pm x_0$ without the membrane.

Figure 26:
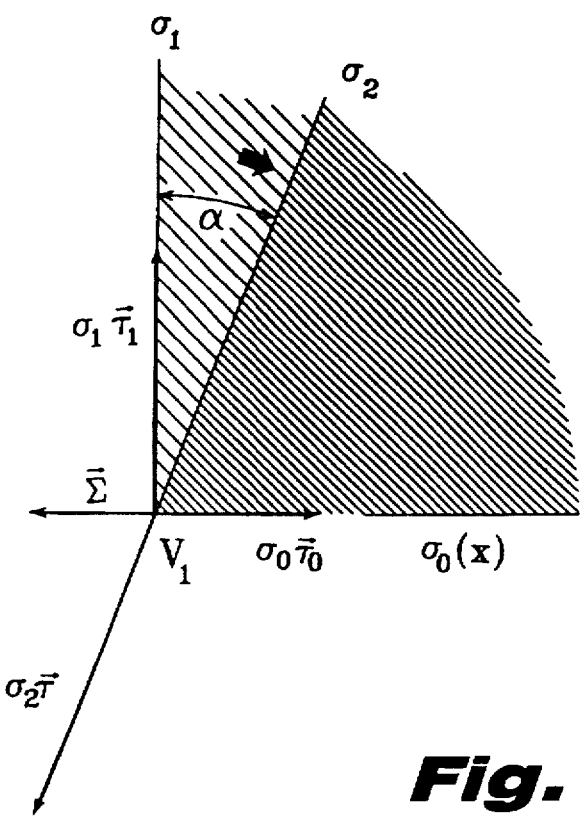
FIGS. 26 and 27 are schematic drawings for analyzing the singularity at the point $V_1$ shown in FIG. 1.

To analyze the field discontinuity at the corner $V_1$ in FIG. 19B, consider the two-dimensional schematic of FIG. 26, where $\sigma$ is the surface charge density induced by the field in the central cavity 34 on the interfaces on the wedge 43 (see FIG. 2) of magnetic material and a wedge of ferromagnetic material in the pole piece 32, at $y=y_1$, in the presence of the $\mu=\infty$ membrane. In the range $-x_1 < x < x_1$, the surface charge density $\sigma$ is given by $$\sigma = \mu_0 H_y(x,y_1) = -KJ_0 f(x), \quad (3.1)$$

where the nondimensional function f(x) is positive if $H_y$ is oriented in the positive direction of axis y. In the limit of the fully closed magnet, $$f(x)=1. \quad (3.2)$$

The wedge 43 of magnetic material shown in FIG. 26 is the triangular component $S_1 T_1 V_1$ of magnetic material whose edge is located at $$x=x_0, \ y=y_1. \quad (3.3)$$

The remanence $\vec{J}$ of the wedge 43 of magnetic material is perpendicular to the surface $$\frac{y-y_1}{(x-x_0)} = -c \tan \alpha, \quad (3.4)$$

where angle $\alpha$ given by Eq. (1.6). The surface charge densities $\sigma_1$, $\sigma_2$ induced by $\vec{J}$ on the surface of the wedge 43 are given by $$\begin{cases} \sigma_1 = -J\cos\alpha = -J\sqrt{1-K^2} \\ \sigma_2 = J. \end{cases} \quad (3.5)$$

In FIG. 26, vectors $\vec{\tau}_0$, $\vec{\tau}_1$, $\vec{\tau}_2$ are unit vectors parallel to the interfaces where charges $\sigma$, $\sigma_1$, $\sigma_2$ are located and pointing away from the interfaces. By virtue of Eq.(3.2) one has $$\vec{\Sigma} = \sigma_1 \vec{\tau}_1 + \sigma_2 \vec{\tau}_2 = J \sin\alpha \vec{\tau}_0 = KJ\vec{\tau}_0. \quad (3.6)$$

Thus, vector $\vec{\Sigma}$ is always oriented in the negative direction of axis x, as indicated in FIG. 26. By virtue of the theorem of existence of a uniform field in a prismatic structure of magnetic material, as discussed in reference [1], vector $\vec{\Sigma}$ must cancel vector $\vec{\tau}_0$, i.e., $$\vec{J} = +\vec{J}_0 f(x_0) \quad (3.7)$$

Thus if the magnitude of $\vec{H}_y$, is smaller than $\vec{H}_0$, the magnitude of $\vec{J}$ must satisfy the condition $$J<J_0 \quad (3.8)$$

in order to cancel the field singularity at $V_1$.

Figure 27:
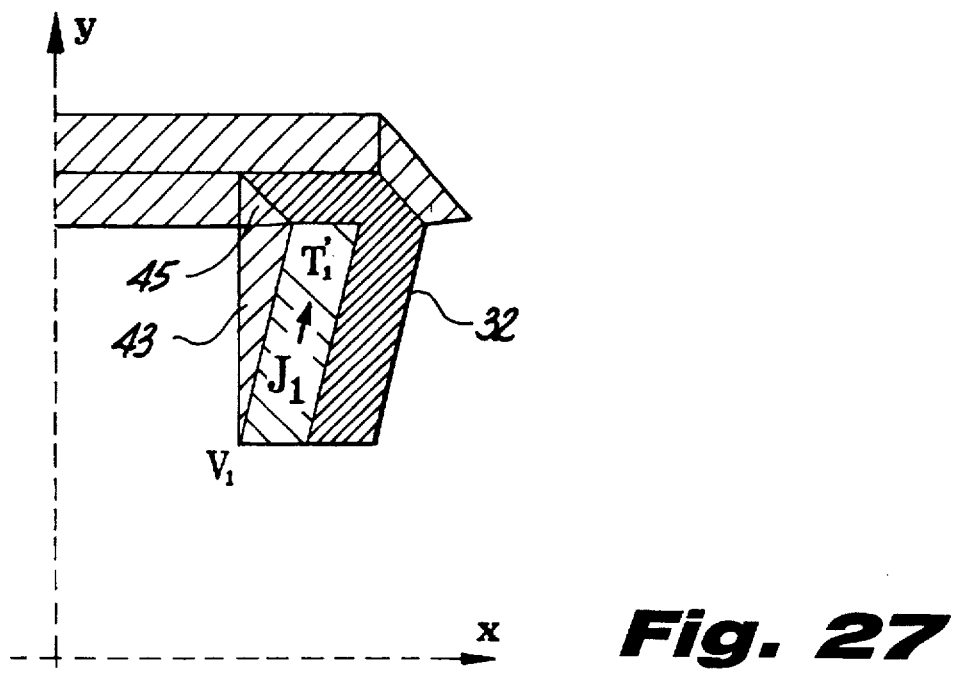

As shown in the schematic of FIG. 27, the singularity at point $V_1$ can also be canceled by replacing part of the equipotential region of the ferromagnetic component 32 with a magnetic material with a remanence $\vec{J}_1$ oriented parallel to the interface $V_1 T_1'$ in FIG. 19B, and whose magnitude satisfies the condition $\vec{H}=0$. This singularity of $V_1$ is canceled if the magnitude of $\vec{J}_1$ satisfies the equation $$\cos \alpha J_1 = KJ_0. \quad (3.9)$$

The remanence $\vec{J}_1$ restores the value $$\sigma_0 = -KJ_0 \quad (3.10)$$

of the surface charge density on the interface $(V_1 W_1)$ in the original closed magnet. The vector $\sigma_0 \vec{\tau}_0$ shown in FIG. 26 generates a field singularity of at the corner of $W_1$ of the block $V_1 W_1 W_1 T_1'$ of magnetic material, whose effect on the field in the central region of the cavity decreases as the length $x_1-x_0$ increases.

Figure 28:
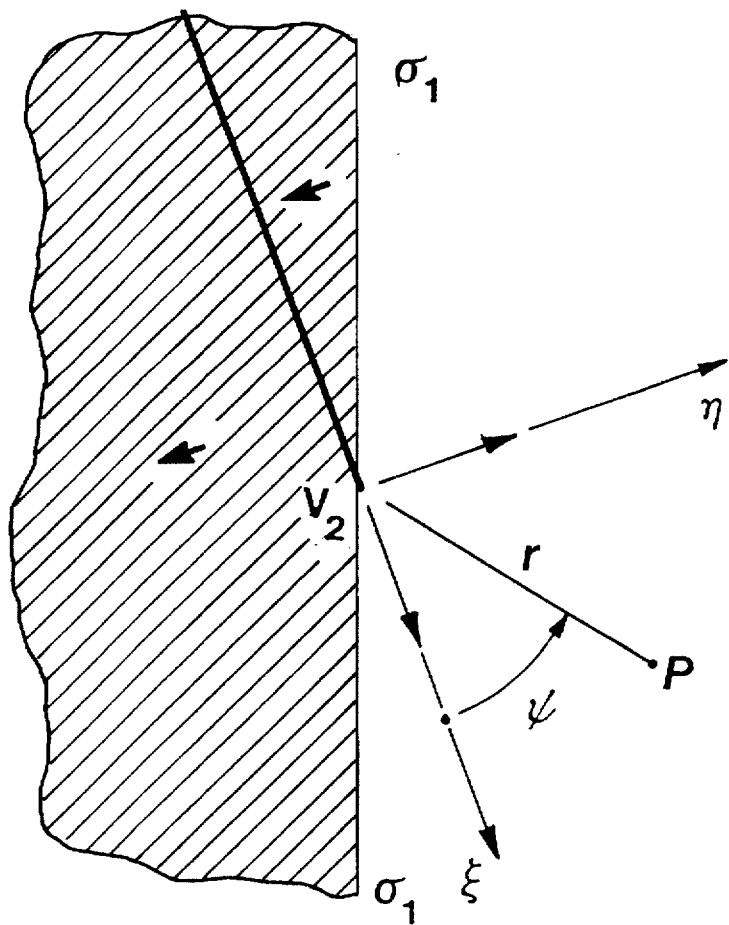
FIGS. 28 and 29 are schematic drawings for analyzing the singularity at the point $V_2$ shown in FIG. 1.

In the schematic of FIG. 19B, the ferromagnetic strap 36 inserted in the magnetic structure 30, which is a $\mu=\infty$ zero thickness layer, terminates at point $V_2$ as indicated by the thick line in FIG. 28, where $\xi,\eta$ is a coordinate system with the origin at point $V_2$ and the axis $\xi$ oriented parallel to the $\mu=\infty$ layer.

In the closed magnet, by virtue of Eq. (1.7), the field within the magnetic material reduces to the component $H_\xi$ oriented in the direction opposite to $\vec{J}$ with or without the $\mu=\infty$ layer. In the open magnet, in the absence of the $\mu=\infty$ layer, the field distortion generates an $H_{86}$ component of the field within the magnetic material. The presence of the $\mu=\infty$ layer eliminates the $H_\xi$ component on the surface $\eta=0, \xi<0$ by generating a potential distribution in the proximity of point $V_2$ $$\Phi - \bar{\Phi} = H_{\xi 0} \sqrt{r_0 r} \cos\frac{\psi}{2}, \quad (3.11)$$

where $\Phi$ is the potential of the $\mu=\infty$ strap 36, $H_{\xi 0}$ is the value of $H_\xi$ at point $V_2$ in the absence of the strap 36, and $r_0$ is a geometrical factor that depends on the geometry of the open structure. The coordinate r is the distance from $V_2$ and $\psi$ in the angle between r and the axis xi as indicated in FIG. 28.

Figure 29:
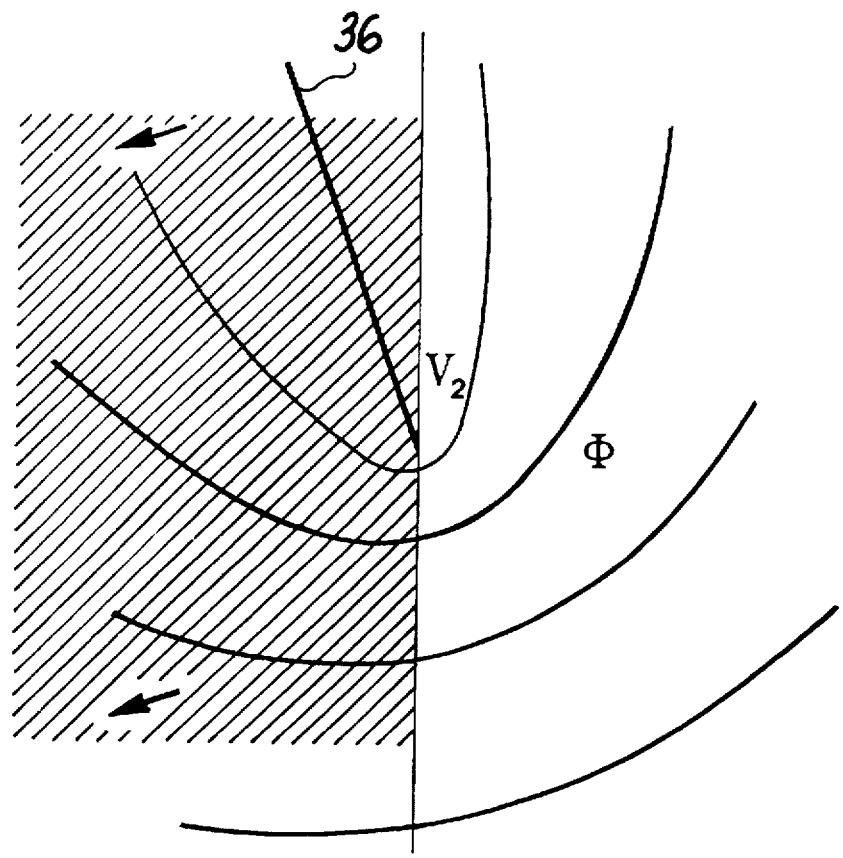

The equipotential lines of the field given in Eq. (3.8) are plotted in FIG. 29A. The magnitude of the intensity $\vec{H}$ is $$H = \frac{1}{2} H_{\xi 0} \sqrt{\frac{r_0}{r}} \quad (3.12)$$

independent of angle $\psi$.

The field perturbation caused by the opening of the magnet 30 is shown in FIGS. 5 and 6 by the equipotential lines of the field distortion $$\Phi - \Phi_{closed}(x,y) = \text{const.}, \quad (3.13)$$

i.e., the difference between the field generated by the open magnetic structure and the ideal uniform field of the associated closed magnet structure.

The mathematics set forth in this section for analyzing the singularity $V_2$ caused by the interface of the strap 36 with the cavity 34 permit the calculations necessary to position a strap of high permeability material embedded in structural elements of an open magnetic system in order to reduce or eliminate distortions.

Section 4. Filter Structures

This section analyzes how the use of filter structures can further compensate for the field distortion within the imaging region of the open magnets 30 and 71 of FIGS. 2 and 15A-15B. The one or more filter structures are designed to cancel the dominant spatial harmonics of the field within the imaging region. The cancellation extends to the number of harmonics necessary to achieve the required field uniformity.

Figure 30:
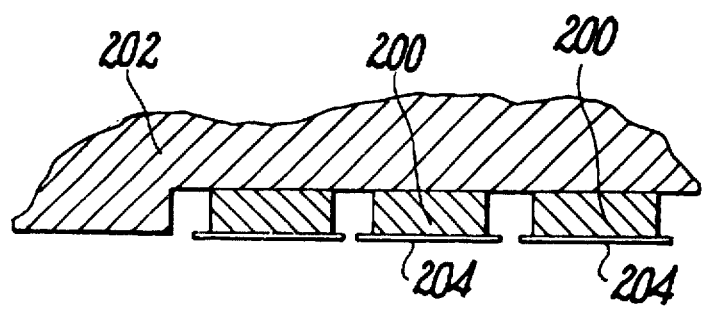
FIG. 30 Is an enlarged cross-sectional view of filter elements of preferred embodiments of the present invention.

The basic theory of the design of filter structures, as presented in some of the references, is based on the modulation of the magnetostatic potential at the interface between the magnetic structure and the central cavity, accomplished by sandwiching elements of permanent magnetic material 200 between the main body of the soft ferromagnetic components 202 and magnetically insulated plates of soft ferromagnetic material 204 as indicated in the schematic of FIG. 30.

The use and effect of filter structures will be analyzed herein mainly with respect to unstrapped magnetic structures. The analysis focuses on the underlying theory of filter structures and their use in unstrapped structures. An embodiment of a strapped open magnet 30 including filter structures is then disclosed. For simplicity, the descriptions in this section are limited to the two-dimensional problem of the compensation of the field distortion caused by the opening of the magnets in the limit $z_0=\epsilon$, and the necessary modifications will be described only for the halves of the magnets in the region $y>0$ with the corresponding symmetrical changes to the other halves of the magnets being implicit.

Figures 31, 32:
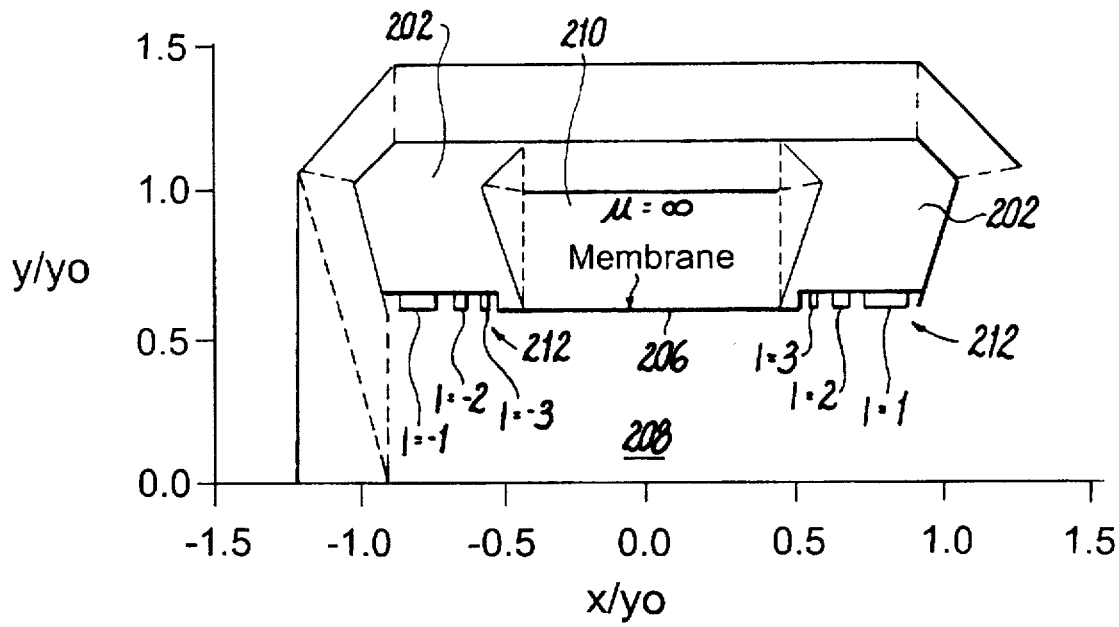
FIG. 31 is a view similar to FIG. 14 of the unstrapped open magnetic structure of a preferred embodiment of the present invention, useful in analyzing the development of a preferred field distortion compensation method.
FIG. 32 is a table of expansion coefficients before and after adjustment of the filter structure.
Figure 40A:
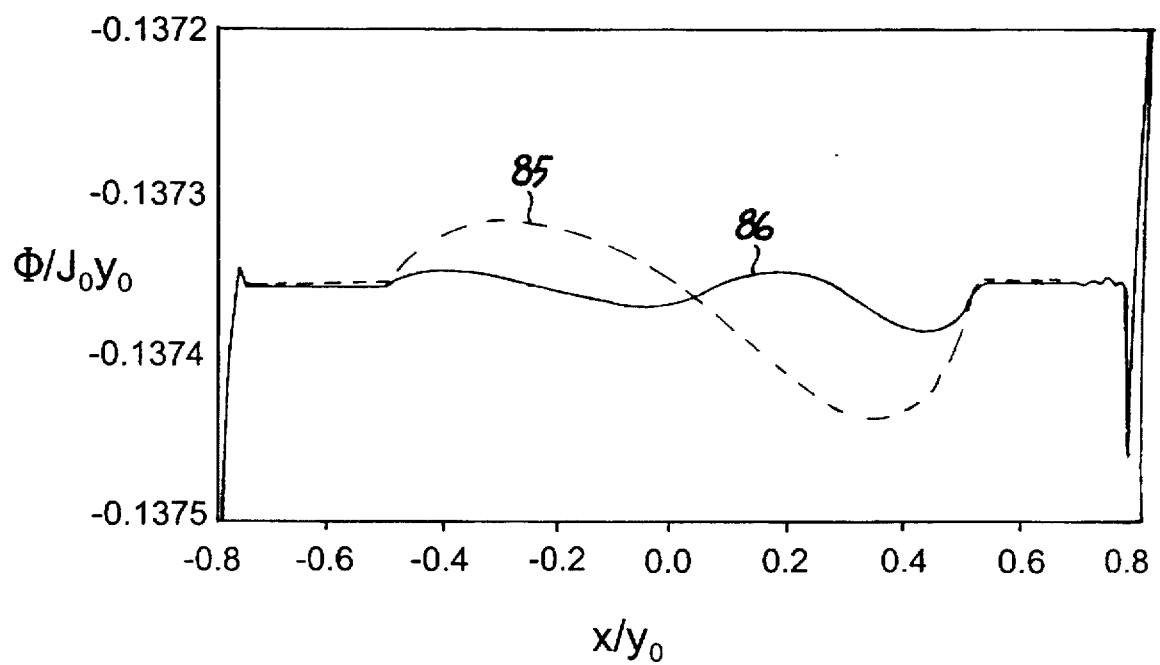
FIGS. 40A–40C are graphs showing the effect of singularities in the unstrapped open magnetic structure of preferred embodiments of the invention.
Figure 40B:
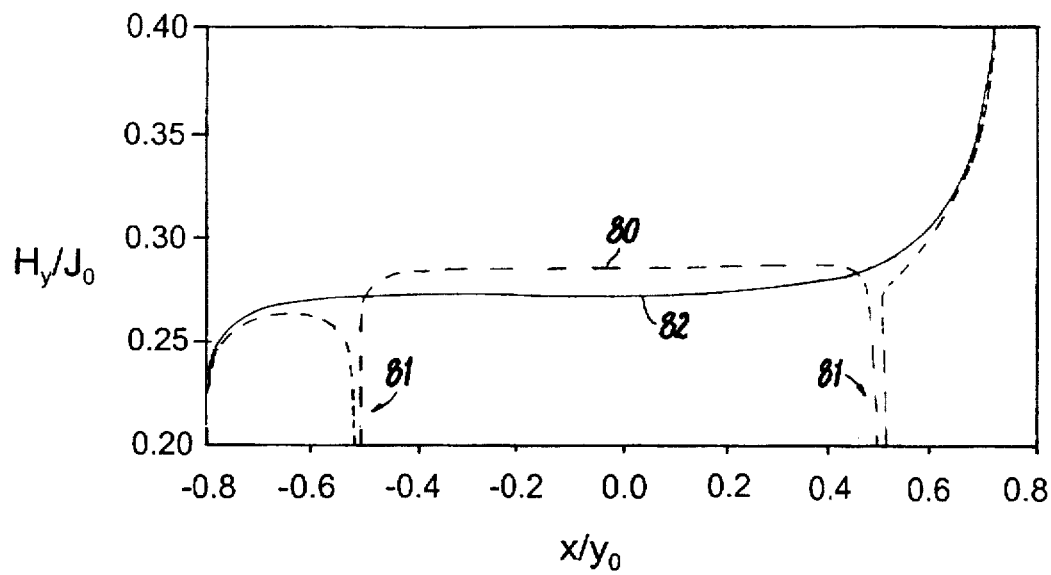

FIG. 40B illustrates the field distortion and in particular the singularities generated by the field mismatch between the central and lateral cavity in the unstrapped magnet. In order to minimize this mismatch, a preferred form of the compensation of the field distortion proceeds in three steps. The first step assumes the presence of a hypothetical $\mu=\infty$ membrane 206 between the central 208 and lateral 210 cavity (FIG. 31). The compensation of the field distortion in the central cavity 208 is achieved by means of a filter structure 212 located on the surface of the ferromagnetic pole pieces 202 in the region $$x_0<|x|<x_1 \tag{4.1}$$

This filter structure, which can be designed to generate a highly uniform field in the central cavity 208 and is shown in an enlarged scale in FIG. 30, provides the major portion of the field compensation.

Because the compensation of the field distortion in the central cavity 208 is not intended to restore the value of the field in the closed magnet, the second step is a modification of the lateral cavity 210 so as to minimize the effect of the field mismatch following the removal of the $\mu=\infty$ membrane 206. The modification can either be a lowering of the remanences of the magnetic components in the lateral cavity or of the lateral cavity's value of K. To further reduce the perturbation caused by the removal of the $\mu=\infty$ membrane, part of the ferromagnetic components 202 can be replaced with insertions of magnetic material 215 (see FIG. 35) that are designed to help maintain the field uniformity. The third step is a final tuning of the filter structure and minor adjustments of the remanences of selected magnetic components in order to obtain the largest possible imaging region.

The first step of the compensation begins by expanding the potential in the central cavity as $$\Phi(x,y) = \Phi_1 \frac{y}{y_1} + \sum_{n=1}^{\infty} \sin(n\pi y/y_1)[a_n \cosh(n\pi x/y_1) + b_n \sinh(n\pi x/y_1)], \tag{4.2}$$

where $\Phi_1$ is the potential of the $\mu=\infty$ membrane that closes the lateral cavity at $y=y_1$. To improve the uniformity of the field, the filter structure is designed to cancel a specified number of the harmonics in the expansion (4.2). Since the coefficients $a_n$ and $b_n$ decrease rapidly with increasing n, only the first few harmonics need to be canceled in order to obtain a highly uniform field.

FIG. 31 shows the magnet with a filter structure 212 designed to cancel the terms having $n \leq 3$. The filter's magnetic sandwiches are labeled with an index $l=\pm 1, \pm 2, \ldots$, with positive l's corresponding to sandwiches having positive x coordinates and negative l's to those having negative x coordinates. The pair of sandwiches farthest from the center of the magnet are labeled $l=\pm 1$, the next farthest pair $l=\pm 2$, and so forth. The magnitudes of the potential shifts that must be generated by the sandwiches in order to cancel the specified harmonics may be minimized by choosing the horizontal width $\Delta x_l$ for the filter's lth sandwich according to the rule:

$$\Delta x_l = \frac{y_1}{11\pi} \tag{4.3}$$

Figure 33:
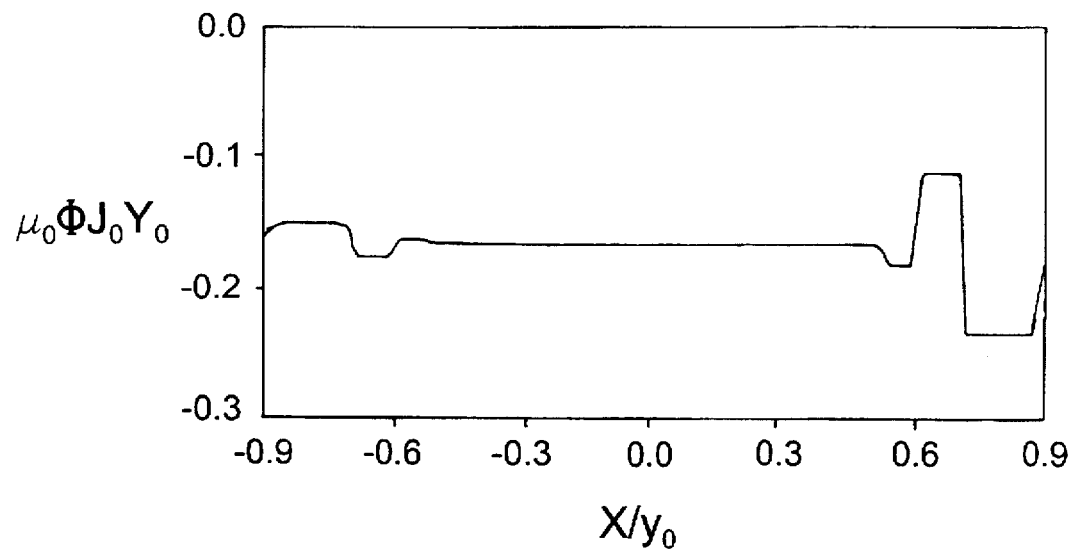
FIG. 33 is a graph showing shifts needed to cancel leading harmonics.
Figure 34:
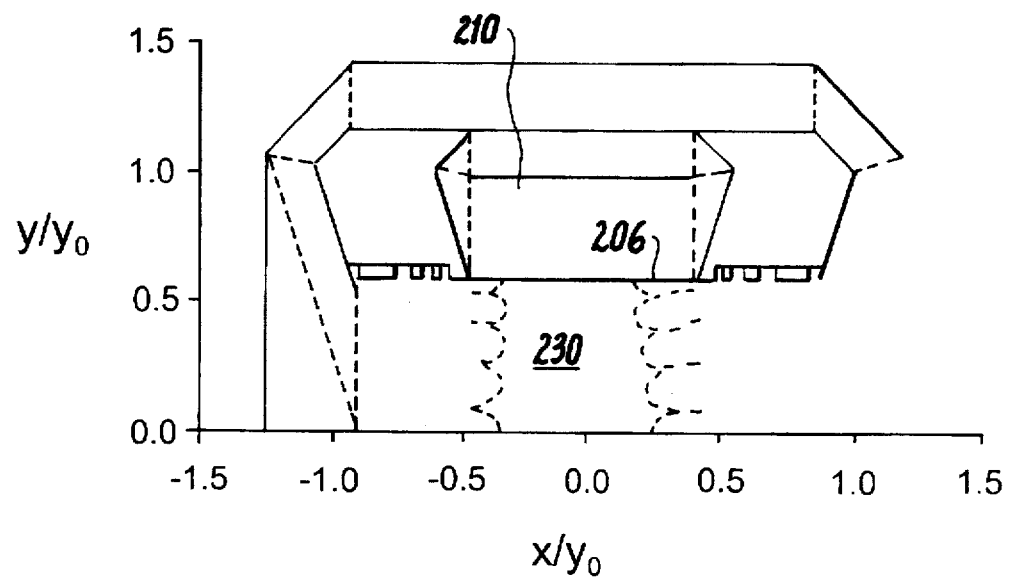
FIG. 34 shows the imaging region of the magnet shown in FIG. 31 obtained after the first compensating step in accordance with the present invention.

The coefficients $a_n$ and $b_n$ depend linearly on the sandwich potentials, and therefore the potentials required to cancel the selected harmonics can be determined by solving a system of linear equations. The table in FIG. 32 lists the harmonics coefficients before and after the cancellation of the harmonics with $n \leq 3$ obtained for the geometry given by FIG. 31, and FIG. 33 plots the potential at $y=y_1$, showing the shifts that must be produced by the sandwiches, represented as 6 steps in order to cancel the leading harmonics. The outline of the imaging region 230 having a uniformity of better than 50 ppm is shown in FIG. 34. The approximate periodicity of the outline reflects the n=4 harmonics, which are the dominant remaining terms in the expansion (4.2).

Figure 35:
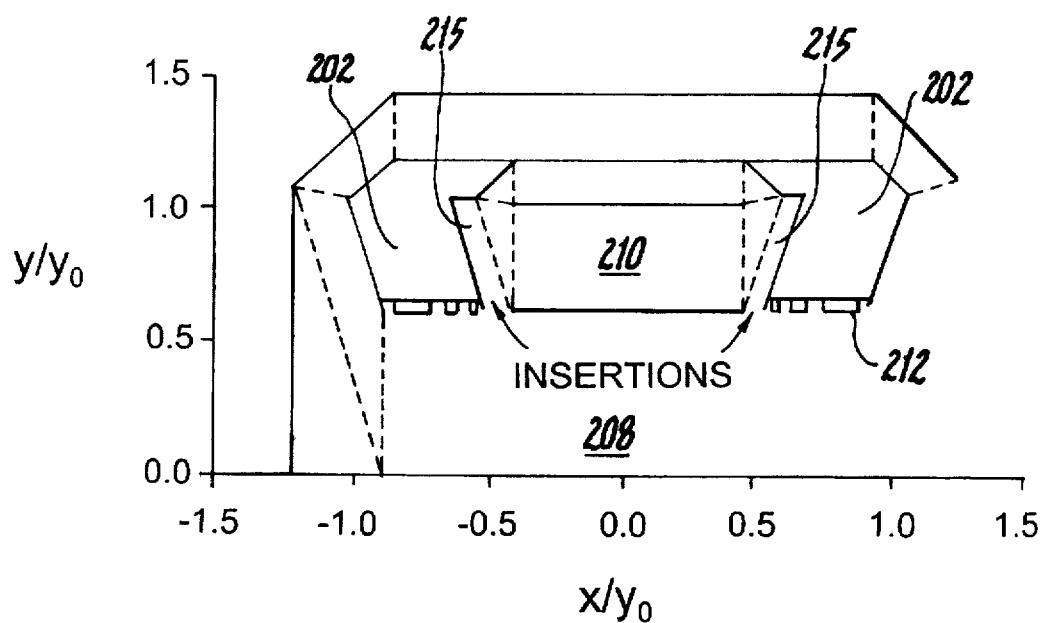
FIG. 35 shows the provision of magnetic insertions to reduce field distortion.

If the $\mu=\infty$ membrane 206 were removed at this point, strong singularities would be produced at the corners by the opening to the lateral cavity 210, as described above, spoiling the uniformity of the central field. To prevent this, either the $\vec{J}$ or the K of the lateral cavity is lowered so that the field it produces matches that in the central cavity just below the center of the $\mu=\infty$ membrane. Additionally, insertions 215 of permanent magnetic material replace part of the ferromagnetic components 202 near the lateral cavity 208 as illustrated in FIG. 35. The remanences of the insertions are chosen so that the magnetic field vanishes inside them. This condition guarantees that the field in the central cavity 208, with the $\mu=\infty$ membrane still in place, is unaltered. The required remanences are nonuniform and can be determined from the equation $$\vec{J}(x,y) = H_y \left[ x \mp (y-y_1) \frac{K}{\sqrt{1-K^2}} \right] \left( \vec{x} \pm \vec{y} \frac{K}{\sqrt{1-K^2}} \right) \tag{4.4}$$

where $H_y(x)$ is the magnetic field just below the plane $y=y_1$ prior to the introduction of the insertions. The upper sign applies to the insertion with x>0 and the lower sign to the one with x<0 the orientation $\vec{J}$ in the insertions is perpendicular to that in the adjacent triangles 64, 66 of magnetic material (FIG. 15A and 15B).

Figure 36:
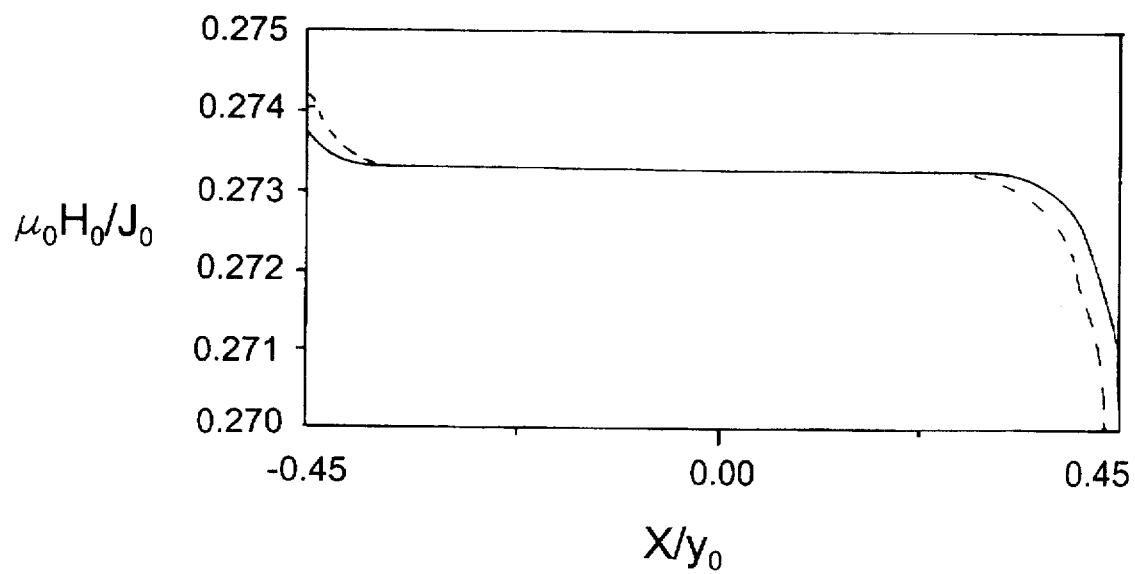
FIG. 36 is a graph comparing field uniformity under two conditions.

The purpose of the insertions 215 is to fix the magnetic charge near the opening to the lateral cavity 210 so that the charge is consistent with the highly uniform field obtained in the first step of the compensation. FIG. 36 compares the magnetic field across the opening to the lateral cavity 210 before (dotted) and after (solid) the removal of the $\mu=\infty$ membrane 206. Remarkably, the field uniformity is actually improved by the removal of the membrane, suggesting that the lateral cavity 210 acts as a field stabilizer for the central cavity 208. The reason for this is that the removal of the membrane forces the field, and not just the potential, to be continuous across the opening.

Figure 37:
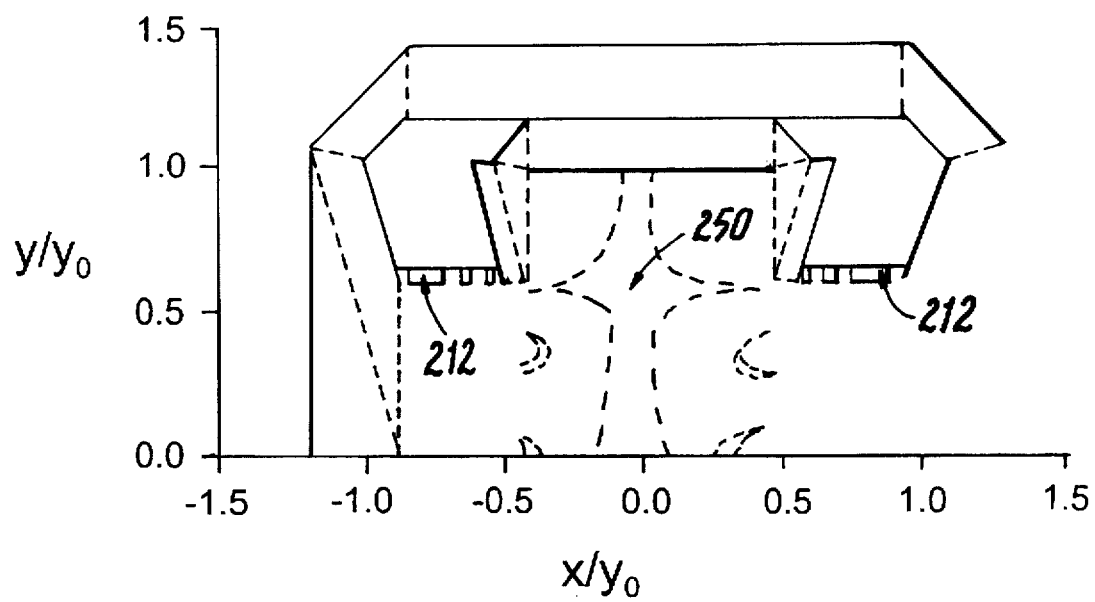
FIGS. 37 and 38 illustrate the effect on the imaging region of the magnet shown in FIG. 31 after the second and third compensation steps, respectively, in accordance with the present invention.

After removal of the $\mu=\infty$ membrane, there remains a residual distortion of the central field, as indicated at 250 by the extent of the 50 ppm imaging regions shown in FIG. 37. This may be corrected by small adjustments of the magnetic sandwiches of the filter structure 212 together with slight modifications of the remanences of selected components of magnetic material. Since the needed corrections are small, there is considerable flexibility in choosing which magnetic components to alter.

To calculate the corrections, the potential is expanded as in Eq. (4.2), but with $y_1$ replaced with $y_2$, the distance from the origin to the top of the lateral cavity, and with $\Phi_1$ replaced with $\Phi_2$, the potential at the top of the lateral cavity. Again a number of harmonics can be canceled equal to the number of degrees of freedom available. Since $Y_2>y_1$, a greater number of harmonics must be canceled in order to achieve an imaging region comparable to that obtained before removal of the $\mu=\infty$ membrane. As in the first step of the compensation, the computation exploits the linear dependence of the expansion coefficients on the degrees of freedom.

Figure 38:
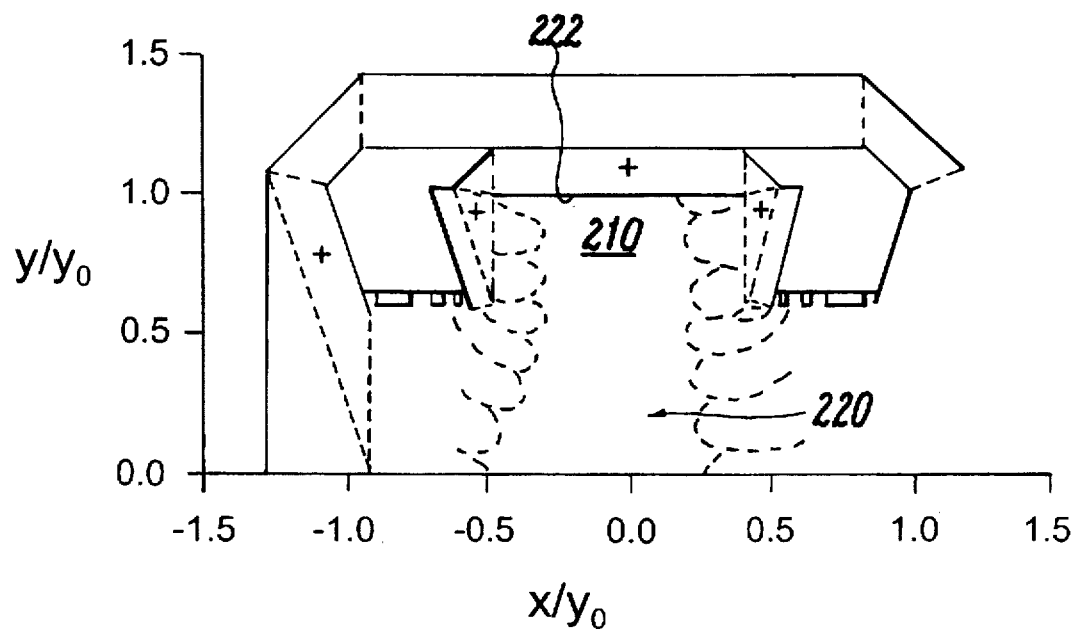

For the example depicted in FIG. 37, the ten harmonics with $n\leq 5$ can be canceled by adjusting the six magnetic sandwiches of the filter structure 212 and the remanences of four components of magnetic material, with the proper adjustments being found by solving a system of ten linear equations. The 50 ppm imaging region 220 obtained from such a calculation is indicated by FIG. 38. The four components of magnetic material that were altered are each marked with a +. Note that the imaging region extends to the top 222 of the lateral cavity 210 and that there is no discernible effect of the corner singularities. Indeed, the final imaging region compares favorably to that with the $\mu=\infty$ membrane still in place (FIG. 34).

The following discusses the origin of the field distortions and singularities and describe an alternate solution which uses filter structures both on the pole piece faces as well as on the upper face of the magnet bounding the lateral cavity which avoids the provision of the magnetic insertions.

Figure 40C:
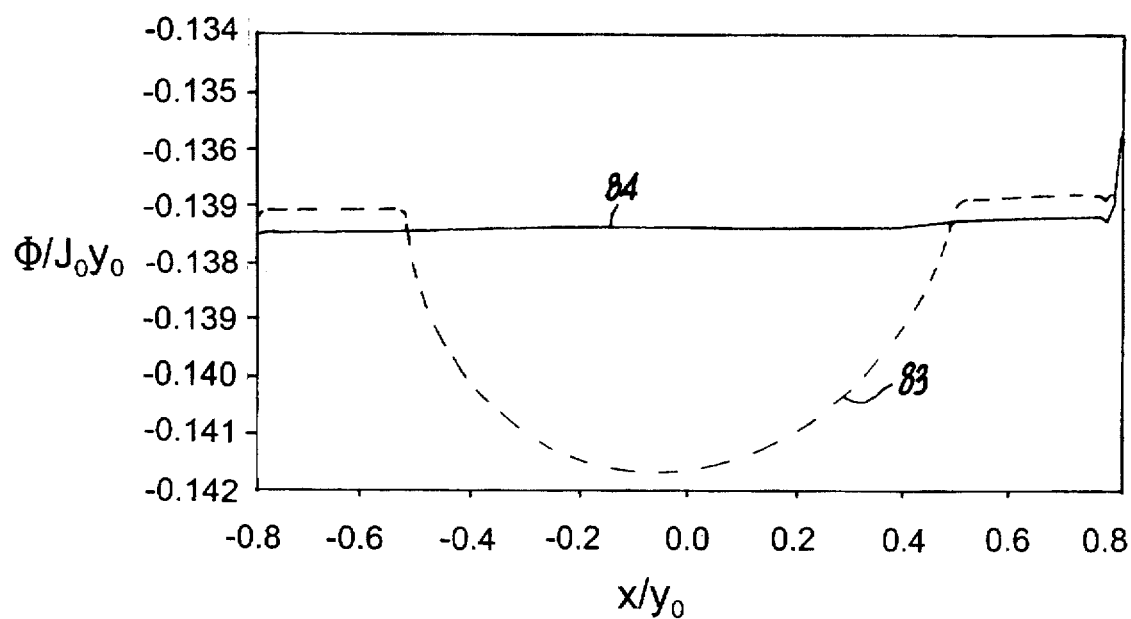

As explained above, when a magnetic structure is opened, singularities are generated at the corners of the inner magnets that lie nearest to the imaging region. At these singularities, $A_1$, $A_2$ (see FIG. 19A), the magnetic field diverges. The singularities can be canceled by changing the remanence of the material in the inner magnet. FIG. 40B is a graph depicting the field that results along the line $A_1$–$A_2$ and FIG. 40C shows the corresponding magnetostatic potential. The dashed line 80 shows the y-component of the magnetic field in the plane of the corners, in this case $y=y_o/2$, before changing the remanence. The singularities 81 occur at $x=\pm y_o/2$. The solid line 82 shows the field obtained after the singularities are canceled (K=0.3). The dashed line 83 in FIG. 40C shows the potential at $y=y_o/2$ for the magnet prior to the cancellation of the singularities. The dip corresponds to the opening to the inner magnet. As indicated by the solid line 84, the potential is nearly constant after the singularities are canceled (K=0.3).

Even after the cancellation of the singularities, a residual non-uniformity remains at the opening to the inner magnet. As shown in FIG. 40A, the dashed line 85 shows the potential for $y=y_o2$ on an expanded scale. The uniformity can be improved by adding a filter structure to the inner permanent magnet. The solid line 86 shows the potential obtained when the first three harmonics are canceled by the added filter structure.

Figure 39A:
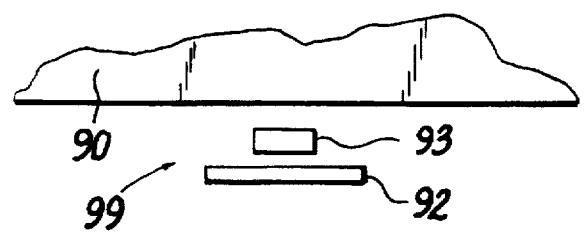
FIGS. 39A and 39B illustrate embodiments of filter structures used to reduce field non-uniformities accordance with the present invention.
Figure 39B:
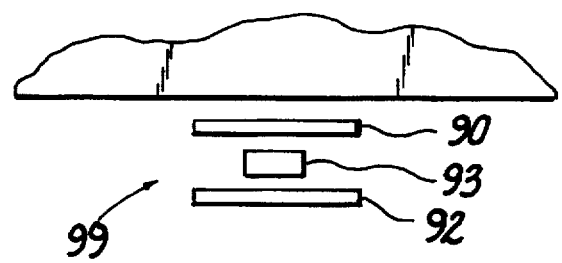

The filter structure can take several forms as described in U.S. Pat. No. 5,475,355. The preferred structure is magnetic filters 99 consisting of permanent magnet blocks between high permeability plates, as illustrated in FIGS. 39A and 39B, wherein the two high permeability plates 90, 92, for example, of soft iron, sandwich a magnetic disk 93, for example, of hard ferrite. In the alternate embodiment, the filter structures 99 are preferably located as an inner lining of the soft ferromagnetic blocks 60 and 60a and the magnetic plate 62, respectively, as shown in FIG. 41 as primary 95 and secondary 97 filter structures.

Figure 41:
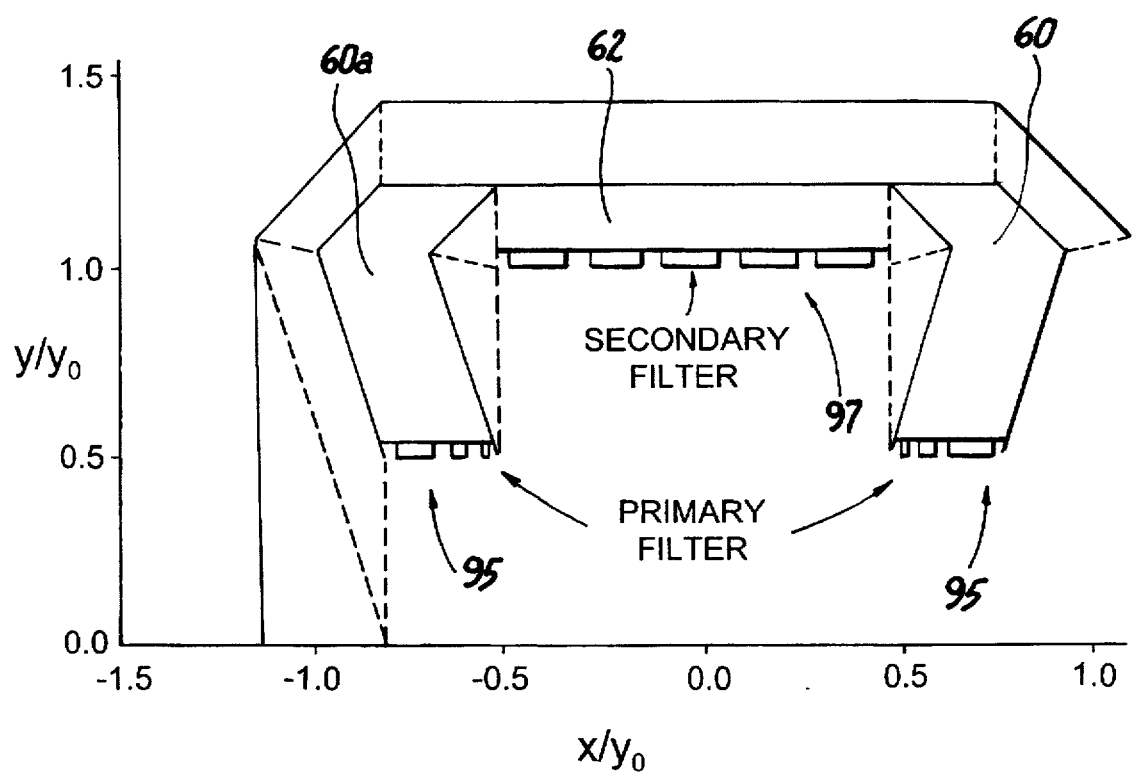
FIG. 41 illustrates an embodiment of filter structures in an unstrapped open magnetic structure to reduce field non-uniformities.

FIG. 41 shows six primary elements 95 and five secondary elements 97. The potential of the outer plate of each element can be continuously varied by altering the amount of magnetized material contained inside. As will be noted, the elements of the secondary filter 97 are of the same size, but those of the primary filter increase in lateral size in proportion to their distance from the cavity center.

Figure 42:
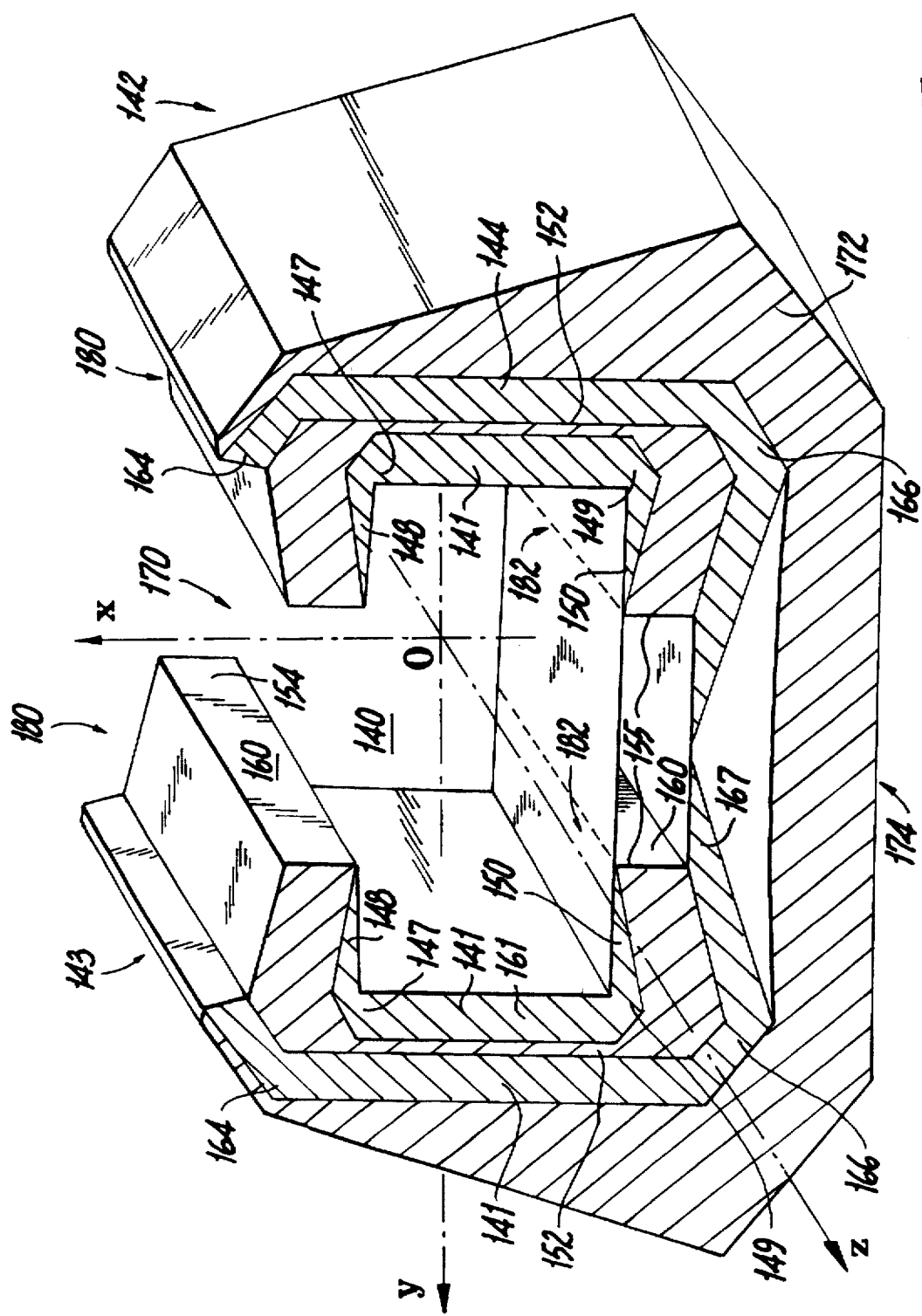
FIG. 42 is an enlarged view of one form of unstrapped open magnetic structure of FIGS. 15A and 15B according to one preferred embodiment the invention.

FIG. 42 is a view of the unstrapped open magnetic structure of the preferred embodiments similar to FIGS. 15A and 15B, in which the individual permanent magnetic blocks 141, 147, 148, 144, 164, 166, 167 and inner 152 and outer 172 soft iron components are also shown. The outer soft iron component 172 or yoke is thick where the flux density is greatest and thin where the flux density decreases. The thin line 142 represents the floor of the cavity 140 and would typically be the top surface of a supporting platform 150 (FIG. 44). A patient 151, shown in phantom in FIG. 44, would occupy the cavity 140 lying, usually, on his or her back. The imaging region would be centered very close to the origin of the xyz coordinate system shown. In the cavity 140, the field is oriented in the y direction, as shown by the equipotential lines in the internal region of the magnet as shown in FIG. 19A. The structure of FIG. 42 has been developed at two field strength levels, 3,500 Gauss and 5,000 Gauss. A field uniformity better than 50 ppm is achieved in an imaging region of minimum dimension $2r_0=24$ cm. The magnet material is a neodymium-iron-boron alloy with nominal remanence $B_r=12,900$ Gauss and intrinsic coercivity $H_{ci}=14,000$ Oersteds. The weight of magnetic material is 2.5 tons at 3,500 Gauss and 3.5 tons at 5,000 Gauss. The total weight, including the yoke, is 7.5 tons for the 3,500 Gauss field and 11 tons for the 5,000 Gauss field. The stray field is low in spite of the large opening.

Figure 43:
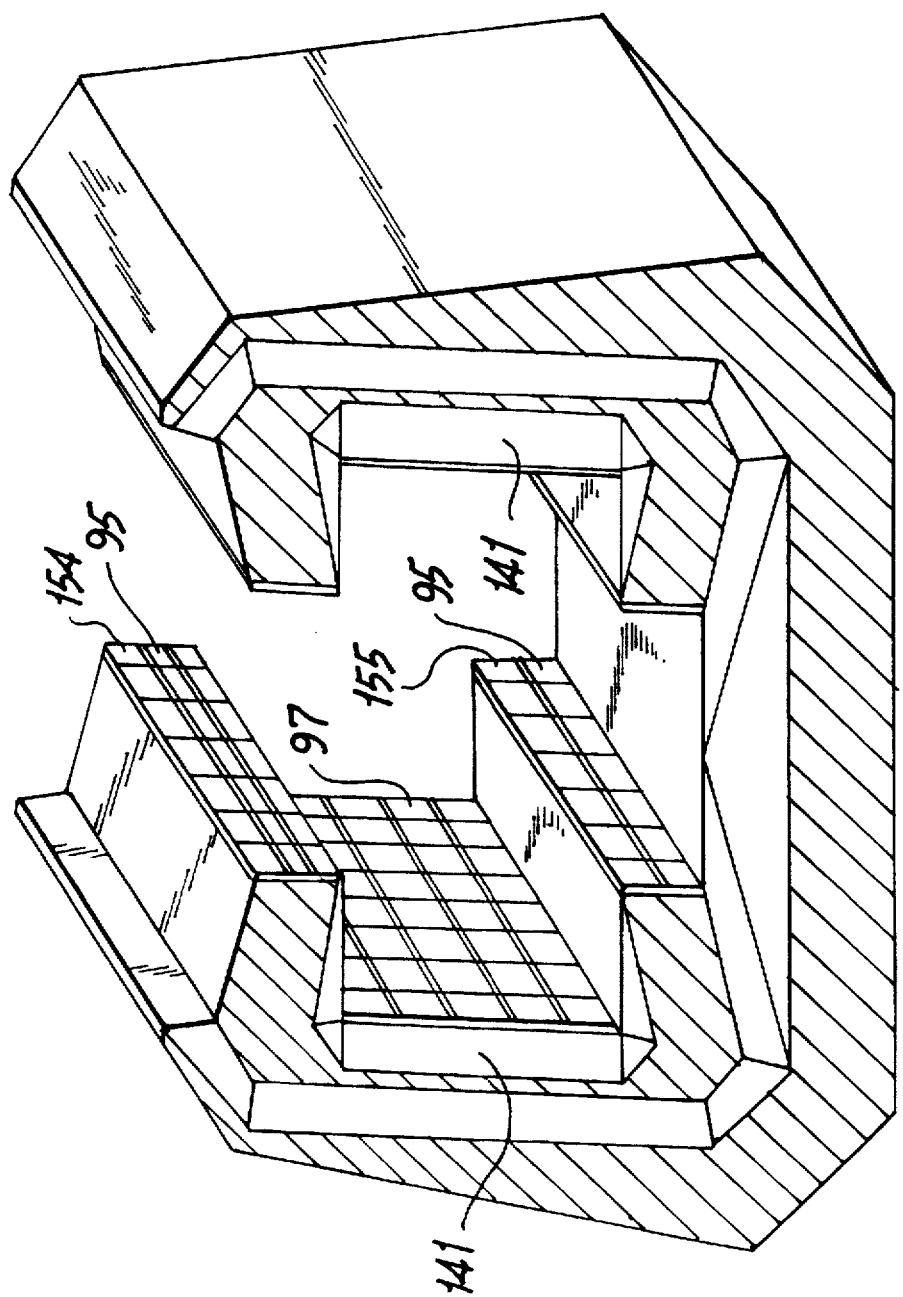
FIG. 43 illustrates the location of the filter structures in an alternate embodiment for the structure of FIG. 42.

In the described embodiment, to achieve the field uniformity described, filter structures 95, 97 were added as shown in FIG. 43 both at the inner sides 154, 155 of the inner ferromagnetic component 160, and at the inner side of the inner permanent magnetic block 141.

While the filter structures described herein are preferred, it will be understood that the invention is not limited to using such structures to compensate for the field distortions described, and other compensating structures can be used in their place.

Figure 45:
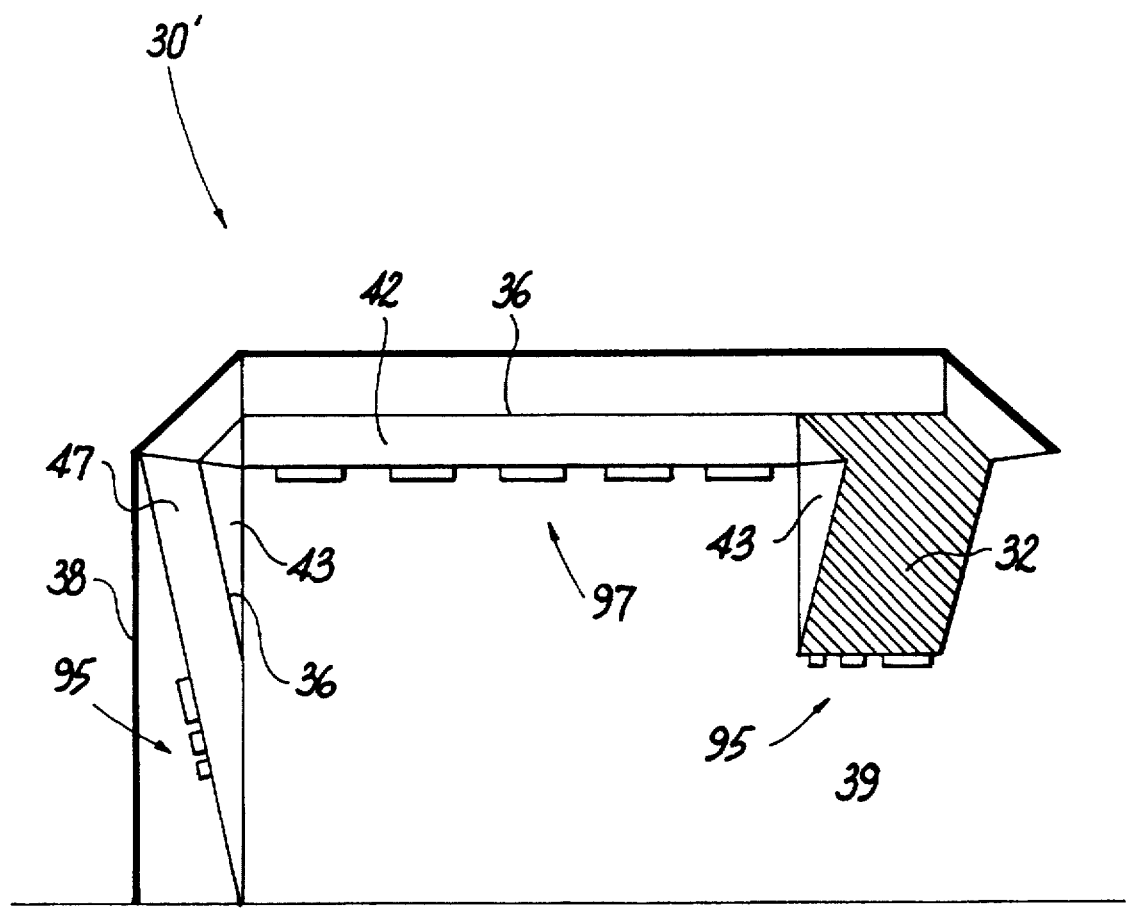
FIG. 45 a schematic drawing of a cross-section of a strapped open magnetic structure of FIG. 1 including filter structures in accordance with a preferred embodiment of the present invention.

Filter structures such as those described above can also be used in the strapped open magnetic structure of the invention. One embodiment of a strapped magnet with filter structures is shown in FIG. 45, which shows the y>0 cross section of a strapped open magnet 30' similar to the magnet 30 shown in FIG. 7. As with the unstrapped magnet discussed in detail above, three primary filter structures 95 are placed on the surface of the pole piece 32 facing the cavity 34, and five secondary filter structures 97 are placed on the surface of the permanent magnetic block 42 at the interface with the cavity 34.

However, because ferromagnetic blocks 60a and 61a (FIG. 15A) have been replaced by straps 36, there is no surface of a pole piece interfacing with the cavity 34 on which to place the three additional primary filter structures 95 as shown in FIG. 43. Because the distortions due to the opening of the magnet are much less pronounced near the closed end of the magnet (for example, see the graph in FIG. 33), the three additional primary filter structures may be omitted without a substantially affecting the magnetic field. Alternatively, the three structures may be placed in a location within the magnet 30 which does not adversely effect field uniformity, such as might occur if they were placed on the surface of permanent blocks 43 or 47 near the closed end of the magnet 30. As shown in FIG. 45, the three additional filter structures 95 may be placed on the opposite face of permanent magnetic block 47, facing the external yoke 38.

The magnets presented in this application are particularly suitable for medical application particularly because of the remarkable proximity of the region of high field uniformity to the opening of the magnet. The large opening of such a compact magnet makes it possible to integrate the gantry of the scanner in a surgical suite with minimum interference with the surgical instrumentation.

Figure 46:
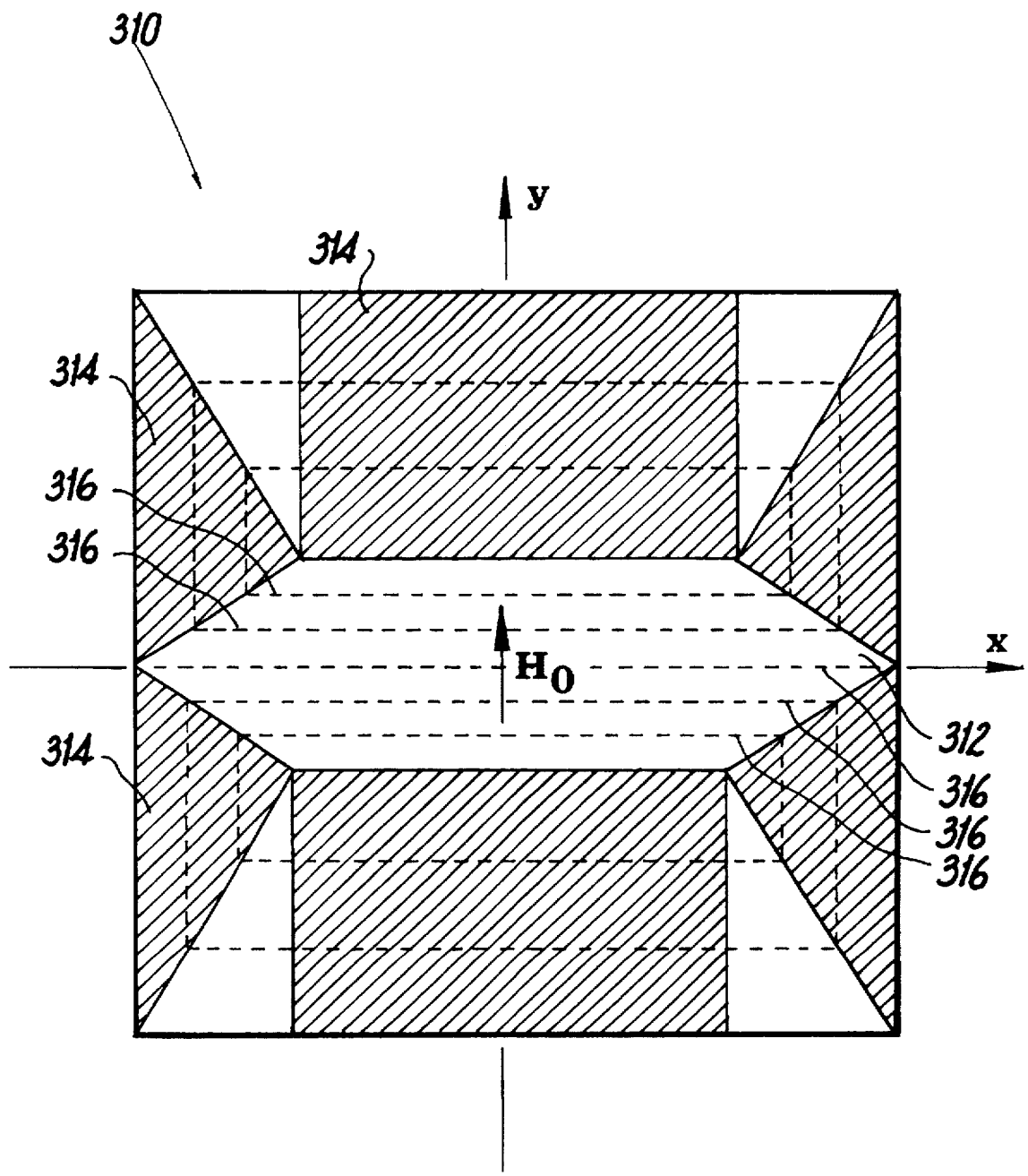
FIG. 46 is a schematic drawing of a cross section of a closed yoked magnet with a hexagonal cavity and air gaps in the magnetic structure showing several equipotential lines of the magnetic field generated by the magnet.

In accordance with additional aspects of the present invention, straps may be embedded within an open or closed magnetic structure having air gaps in the structure. For example, FIG. 46 shows the cross section of a yoked closed magnet 310 designed around a hexagonal cavity 312. The magnet 310 is designed to generate a uniform field $H_0$ oriented along the y axis. The shaded regions indicate sections of magnetic material 314, in-between which are triangular gaps 315 of air which do not contain any magnetic material. These gaps are often used in yoked magnetic structures of this type, as shown, among other places, in reference [1]. The dashed lines 16 are the equipotential lines for the ideal two-dimensional magnet. In this example, seven equipotential surfaces are considered of potential $$\Phi_i = \frac{i}{3} \Phi_{max}, \quad i = 0, \pm 1, \pm 2, \pm 3,$$

where $\Phi_{max}$ is the maximum magnetostatic potential generated by the ideal magnet.

Figure 47:
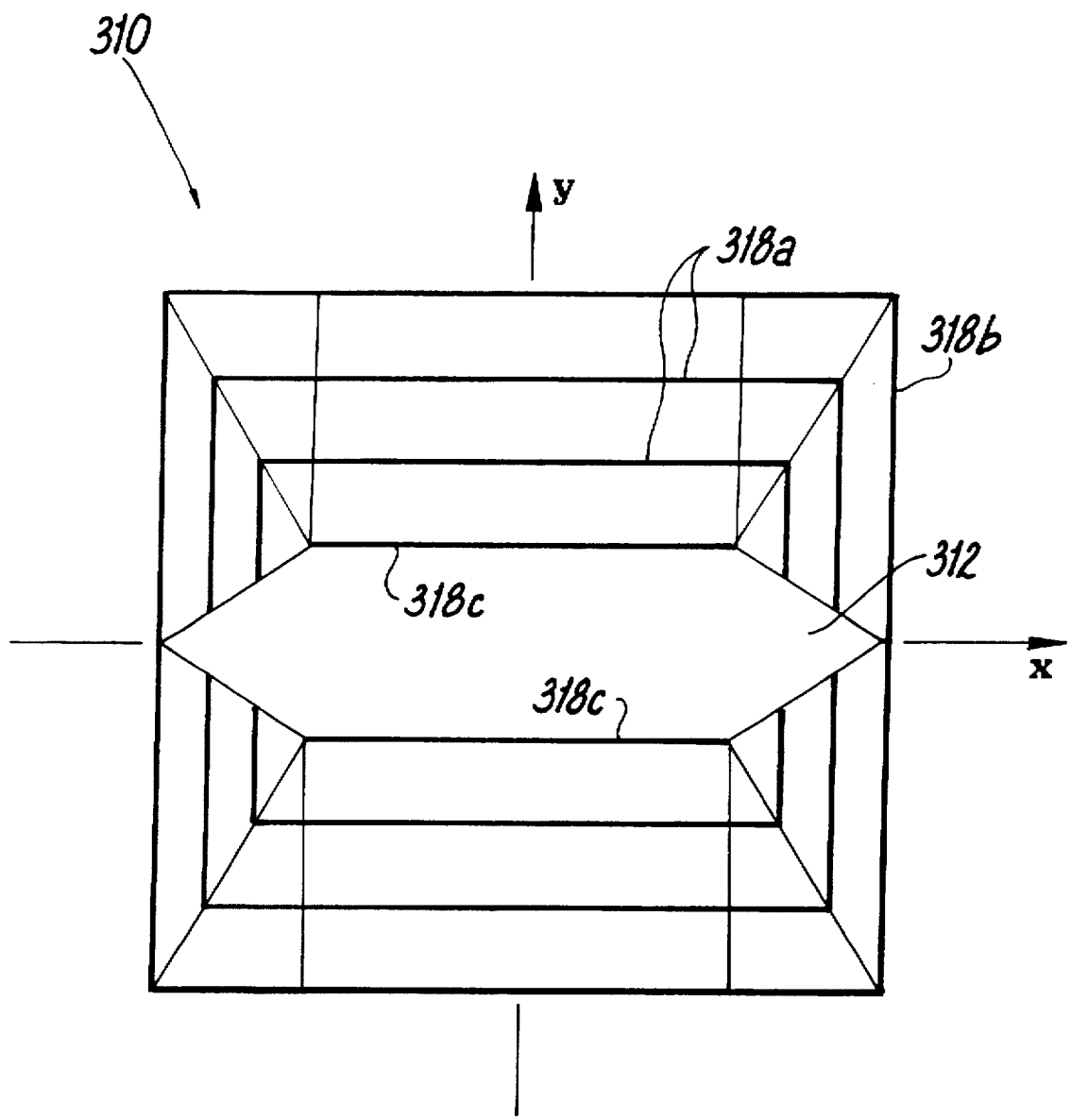
FIG. 47 is a schematic drawing of straps placed to coincide with equipotential lines shown in the magnet of FIG. 46.
Figure 48:
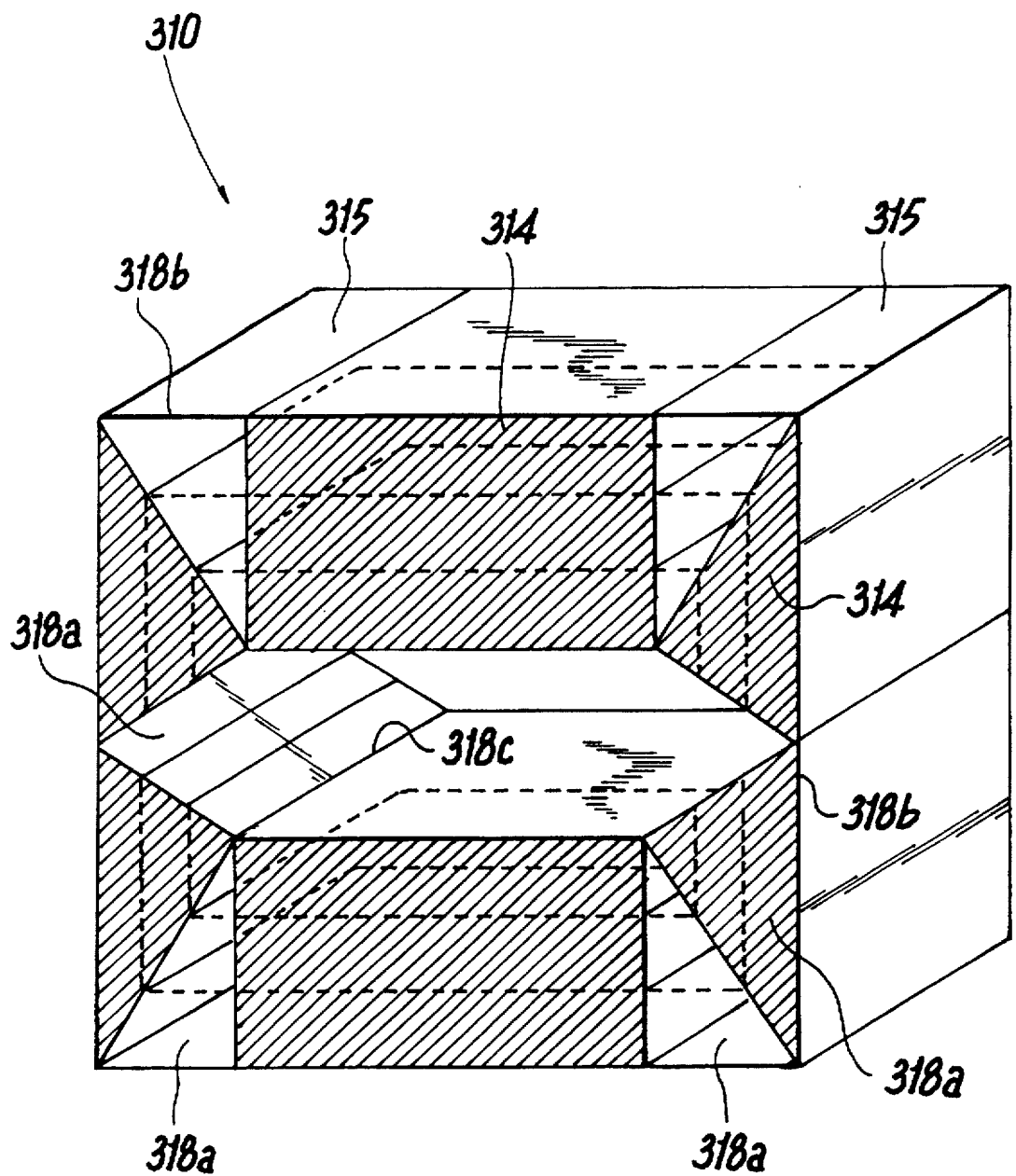
FIG. 48 is a perspective view of the magnet of FIG. 46 incorporating the straps shown in FIG. 47.

The heavy lines in FIG. 47 indicate seven high permeability straps 318a–318c placed to coincide with the seven equipotential surfaces 316 within the magnetic structure 310 of FIG. 46. Note that the two internal straps 318a at $\Phi_1$ and $\Phi_2$ terminate at the interface of the internal cavity 312, but continue through the air gaps 315. The strap 318b at the surface $\Phi_0=0$ corresponds to the external yoke. The straps 31 8c at the surfaces $\Phi_3=\Phi_{max}$ and $\Phi_{-3}=\Phi_{max}$ correspond to the pole pieces. FIG. 48 shows a three-dimensional view of the magnet 310 of FIG. 46 with the straps 318a–318c as shown in FIG. 47.

While the invention has been described in conjunction with specific embodiments, it will be evident to those skilled in the art that many alternatives, modifications and variations will be apparent in light of the foregoing description. Accordingly, the claimed invention is intended to embrace all such alternatives, modifications and variations as fall within the spirit and scope of the appended claims.

What is claimed is:

1. An open magnetic structure comprising:

a generally C-shaped primary magnetic system defining a main cavity having a side access opening and generating a substantially uniform magnetic field within a first region of interest in the main cavity, the first region of interest being accessible via at least the side opening, said primary magnetic system comprising first permanent magnets and spaced opposed first and second large ferromagnetic pole pieces coupled to the first permanent magnets and flanking the side opening, a secondary magnetic system comprising second permanent magnets inset into the primary magnetic system, said first and second permanent magnets intending to have equipotential surfaces along their facing surfaces, magnetic straps embedded in the structure between the first and second permanent magnets and each comprising a thin non-saturated plate or layer of high permeability magnetic material having opposed major surfaces to reduce or eliminate distortions in the uniform magnetic field in the region of interest, the magnetic straps being embedded such that each of the major surfaces of the strap contact adjoining surfaces of the first and second permanent magnets that are intended to be equipotential surfaces, the straps being configured so as to follow and force the surfaces of the first and second permanent magnets that are intended to be equipotential surfaces such that they actually become equipotential surfaces, a first magnetic strap terminating at one end at a side of the cavity and at its opposite end at the first pole piece and extending continuously from its one end to its opposite end, a second magnetic strap terminating at one end at a side of the cavity and at its opposite end at the second pole piece and extending continuously from its one end to its opposite end, the side of the cavity where the first and second straps terminate being free of large pole pieces as a result of the presence of the first and second straps thereby increasing the cavity size and reducing the structure's weight in comparison with a similar magnetic structure but without the magnetic straps.

2. The open magnetic structure of claim 1, wherein the magnetic structure is surrounded by a magnetic yoke for closing field lines.

3. The open magnetic structure of claim 2, further comprising additional means for compensating for field distortions within the main cavity arising from the side access opening, said additional means for compensating comprising a filter structure mounted along a surface of the primary magnetic structure between it and the yoke.

4. The open magnetic structure of claim 1, further comprising additional means for compensating for field distortions within the main cavity arising from the side access opening, said additional means for compensating comprising a filter structure mounted along a surface of the cavity or a surface of a pole piece.

5. The open magnetic structure of claim 1, wherein the magnetic strap has a minimum thickness sufficient to prevent magnetic saturation but is not substantially thicker than said minimum thickness.

6. The open magnetic structure of claim 1, wherein the magnetic strap has a uniform thickness.

7. The open magnetic structure of claim 1, wherein the magnetic strap has a minimum thickness sufficient to prevent magnetic saturation but is no thicker than is needed to eliminate components of the magnetic field parallel to the strap major surfaces.

8. In a closed magnetic structure comprising a yoked magnet made up of permanently magnetized blocks surrounding a polygonal cavity for producing a uniform magnetic field within a region of interest of the cavity, the magnetic structure comprising permanent magnetic blocks and non-magnetic regions separating adjoining blocks, said blocks intending to define spaced parallel equipotential surfaces extending through the blocks and through the separating non-magnetic regions, the improvement comprising:

at least one magnetic strap embedded in or between permanently magnetized blocks of the structure, each strap comprising a thin non-saturated plate or layer of high permeability magnetic material having opposed major surfaces to reduce or eliminate distortions in the uniform magnetic field in the region of interest, each magnetic strap being embedded such that each of the major surfaces of the strap contact adjoining surfaces of the permanent magnets that are intended to be equipotential surfaces, each strap being configured so as to follow and force the surfaces of the permanent magnets that are intended to be equipotential surfaces such that they actually become equipotential surfaces, each magnetic strap terminating at one end at a side of the cavity and at its opposite end at an opposite side of the cavity and extending continuously from its one end to its opposite end and through the adjoining non-magnetic regions.

9. The closed magnetic structure of claim 8, wherein at least two spaced generally parallel magnetic straps embedded in or between permanently magnetized blocks of the structure are provided.

10. The closed magnetic structure of claim 8, wherein the non-magnetic regions are triangular shaped.

11. The closed magnetic structure of claim 8, wherein adjoining permanently magnetized blocks have surfaces interfacing with the cavity, the surfaces interfacing with the cavity forming an angle no greater than 180°.

12. The closed magnetic structure of claim 8, wherein the strap has a minimum thickness sufficient to prevent magnetic saturation but is not substantially thicker than said minimum thickness.

13. The closed magnetic structure of claim 8, wherein the magnetic structure is surrounded by a magnetic yoke for closing field lines.

14. The closed magnetic structure of claim 8, wherein the magnetic strap has a uniform thickness.

15. The closed magnetic structure of claim 8, wherein the magnetic strap has a minimum thickness sufficient to prevent magnetic saturation but no thicker than is needed to eliminate components of the magnetic field parallel to the strap major surfaces.

* * * * *